United States Patent
Jung et al.

(10) Patent No.: US 12,289,996 B2
(45) Date of Patent: Apr. 29, 2025

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: So-Young Jung, Gyeonggi-do (KR); Su-Hyun Lee, Gyeonggi-do (KR); Mi-Ja Lee, Gyeonggi-do (KR); Doo-Hyeon Moon, Gyeonggi-do (KR); Sang-Hee Cho, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

(21) Appl. No.: 18/321,074

(22) Filed: May 22, 2023

(65) Prior Publication Data

US 2023/0329107 A1   Oct. 12, 2023

Related U.S. Application Data

(63) Continuation of application No. 17/075,581, filed on Oct. 20, 2020, now Pat. No. 11,706,984.

(30) Foreign Application Priority Data

Oct. 24, 2019   (KR) ........................ 10-2019-0132762

(51) Int. Cl.
*H10K 85/60*   (2023.01)
*H10K 50/11*   (2023.01)
*H10K 85/30*   (2023.01)
*H10K 101/00*   (2023.01)
*H10K 101/10*   (2023.01)

(52) U.S. Cl.
CPC ....... *H10K 85/6572* (2023.02); *H10K 85/615* (2023.02); *H10K 85/626* (2023.02); *H10K 85/654* (2023.02); *H10K 85/6574* (2023.02); *H10K 85/6576* (2023.02); *H10K 50/11* (2023.02); *H10K 85/342* (2023.02); *H10K 2101/10* (2023.02); *H10K 2101/90* (2023.02)

(58) Field of Classification Search
None
See application file for complete search history.

(56) References Cited

U.S. PATENT DOCUMENTS

| 11,706,984 B2 * | 7/2023 | Jung ................. H10K 85/6574 |
| 2014/0299865 A1 | 10/2014 | Nishimura et al. |
| 2016/0225992 A1 * | 8/2016 | Ito ........................ C09B 57/02 |
| 2020/0212310 A1 | 7/2020 | Kim et al. |

FOREIGN PATENT DOCUMENTS

| WO | 2016052819 A1 | 4/2016 |
| WO | WO-2020032428 A1 * | 2/2020 ........ H01L 51/0071 |

OTHER PUBLICATIONS

Machine translation of WO-2020032428-A1, translation generated Jun. 2024, 44 pages. (Year: 2024).*
Search Report from CNIPA for Chinese patent application No. 202011106330.0; Application Date: Oct. 15, 2020.
Cited Reference from Japan Patent Office for Japan patent application No. 2020-174118; Application Date: Oct. 15, 2020.
Request for the Submission of an Opinion from Korea Intellectual Property Office for Korea patent application No. 10-2019-0132762; Application Date: Oct. 24, 2019.

* cited by examiner

*Primary Examiner* — Robert S Loewe
(74) *Attorney, Agent, or Firm* — G. Creston Campbell

(57) ABSTRACT

The present disclosure relates to a plurality of host materials comprising a first host material comprising a compound represented by formula 1, and a second host material comprising a compound represented by formula 2, and an organic electroluminescent device comprising the same. By comprising a specific combination of compounds of the present disclosure as host materials, it is possible to provide an organic electroluminescent device having higher luminous efficiency and/or longer lifetime properties as compared with a conventional organic electroluminescent device.

3 Claims, No Drawings

PLURALITY OF HOST MATERIALS AND ORGANIC ELECTROLUMINESCENT DEVICE COMPRISING THE SAME

CROSS-REFERENCE TO RELATED APPLICATIONS

This application is a continuation of U.S. patent application Ser. No. 17/075,581, filed Oct. 20, 2020, which claims the benefit of KR 10-2019-0132762, filed Oct. 24, 2019, each of which is incorporated by reference herein in its entirety.

TECHNICAL FIELD

The present disclosure relates to a plurality of host materials and an organic electroluminescent device comprising the same.

BACKGROUND ART

In 1987, Tang et al. of Eastman Kodak first developed a small molecule green organic electroluminescent device (OLED) of TPD/Alq3 bilayer consisting of a light-emitting layer and a charge transport layer. Since then, the research on an OLED has been rapidly carried out, and it has been commercialized. At present, phosphorescent materials, which provide excellent luminous efficiency in realizing panels, are mainly used in organic electroluminescent devices. Thus, an OLED which has high luminous efficiency and/or long lifetime is required for long time uses and high resolution of displays.

Korean Patent Appl. Laid-Open Nos. 2015-0086721, 2014-0096203, and 2015-0116776 disclose a plurality of host materials using carbazole derivative compounds. However, the aforementioned references do not specifically disclose a plurality of host materials described in the present disclosure. Further, there is a need for the development of a light-emitting material having improved performances, for example, improved luminous efficiency and/or lifetime properties as compared with the host materials disclosed in the aforementioned references.

DISCLOSURE OF INVENTION

Technical Problem

The objective of the present disclosure is to provide an organic electroluminescent device having higher luminous efficiency and/or longer lifetime properties, by comprising a specific combination of compounds as host materials.

Solution to Problem

The present inventors found that the above objective can be achieved by a plurality of host materials comprising a first host material comprising a compound represented by the following formula 1, and a second host material comprising a compound represented by the following formula 2:

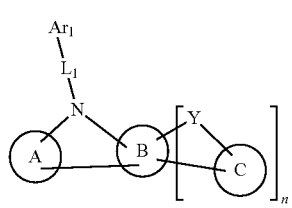

(1)

wherein, ring A, ring B, and ring C, each independently, represent a substituted or unsubstituted benzene ring, or a substituted or unsubstituted naphthalene ring;

Y represents O, S, or NRa;

Ra represents -$L_2$-$Ar_2$;

$Ar_1$ and $Ar_2$, each independently, represent a substituted or unsubstituted (C6-C30) aryl; a substituted or unsubstituted (3- to 30-membered) heteroaryl containing at least one of nitrogen(s), oxygen(s), and sulfur(s); or a substituted or unsubstituted di(C6-C30) arylamino;

$L_1$ and $L_2$, each independently, represent a single bond, a substituted or unsubstituted (C6-C30) arylene, or a substituted or unsubstituted (3- to 30-membered) heteroarylene; and n represents an integer of 0 or 1, with the proviso that if n is 0, both ring A and ring B are a substituted or unsubstituted naphthalene ring;

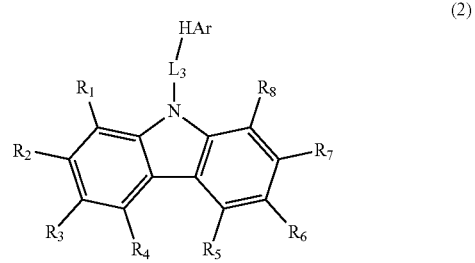

(2)

wherein,

HAr represents a substituted or unsubstituted nitrogen-containing (3- to 30-membered) heteroaryl;

$L_3$ represents a naphthylene unsubstituted or substituted with deuterium(s), a biphenylene unsubstituted or substituted with deuterium(s), a terphenylene unsubstituted or substituted with deuterium(s), or a-phenylene-naphthylene-unsubstituted or substituted with deuterium(s); and $R_1$ to $R_8$, each independently, represent hydrogen, deuterium, or a (C6-C30) aryl unsubstituted or substituted with at least one of deuterium(s) and a (C6-C30) aryl(s).

Advantageous Effects of Invention

By comprising a specific combination of compounds of the present disclosure as host materials, it is possible to provide an organic electroluminescent device having higher luminous efficiency and/or longer lifetime properties as compared with the conventional organic electroluminescent device, and manufacture a display system or a light system using the same.

MODE FOR THE INVENTION

Hereinafter, the present disclosure will be described in detail. However, the following description is intended to explain the disclosure, and is not meant in any way to restrict the scope of the disclosure.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc.

The term "a plurality of organic electroluminescent materials" in the present disclosure means an organic electroluminescent material(s) comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds which may be comprised in at least one of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. At least two compounds may be comprised in the same layer or different layers, and may be mixture-evaporated or co-evaporated, or may be individually evaporated.

The term "a plurality of host materials" in the present disclosure means an organic electroluminescent material comprising a combination of at least two host materials. It may mean both a material before being comprised in an organic electroluminescent device (for example, before vapor deposition) and a material after being comprised in an organic electroluminescent device (for example, after vapor deposition). The plurality of host materials of the present disclosure may be comprised in any light-emitting layer constituting an organic electroluminescent device. The two or more compounds comprised in the plurality of host materials of the present disclosure may be included in one light-emitting layer or may be respectively included in different light-emitting layers. For example, the two or more host materials may be mixture-evaporated to form a layer, or separately co-evaporated at the same time to form a layer.

Herein, the term "(C6-C30) aryl" or "(C6-C30) arylene" is meant to be a monocyclic or fused ring radical derived from an aromatic hydrocarbon having 6 to 30 ring backbone carbon atoms. The number of ring backbone carbon atoms is preferably 6 to 20, and more preferably 6 to 15. The above aryl or arylene may be partially saturated, and may comprise a spiro structure. The above aryl may include phenyl, biphenyl, terphenyl, naphthyl, binaphthyl, phenylnaphthyl, naphthylphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluorenelyl, azulenyl, etc. More specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzofluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, etc.

The term "(3- to 50-membered) heteroaryl" or "(3- to 30-membered) heteroarylene" is an aryl or an arylene having 3 to 50 or 3 to 30 ring backbone atoms, in which the number of ring backbone atoms is preferably 3 to 30, more preferably 5 to 20, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, benzonaphthofuranyl, dibenzothiophenyl, benzonaphthothiophenyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, naphthyridinyl, carbazolyl, benzocarbazolyl, phenoxazinyl, phenanthridinyl, phenanthrooxazolyl, benzodioxolyl, etc. More specifically, the heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl) pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. "Halogen" includes F, Cl, Br, and I.

In addition, "ortho (o-)," "meta (m-)," and "para (p-)" are prefixes, which represent the relative positions of substituents, respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

Herein, "substituted" in the expression "substituted or unsubstituted" means that a hydrogen atom in a certain functional group is replaced with another atom or another functional group, i.e., a substituent. In the present disclosure, the substituents of the substituted benzene, the substituted naphthalene, the substituted aryl, the substituted arylene, the substituted heteroaryl, the substituted heteroarylene, the substituted alkyl, the substituted cycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30) cycloalkyl; a (C3-C30)cycloalkenyl; a (3- to 7-membered) heterocycloalkyl; a (C6-C30) aryloxy; a (C6-C30) arylthio; a (3- to 50-membered) heteroaryl unsubstituted or substituted with at least one of a (C1-C30)alkyl(s), a (C6-C30) aryl(s), and a di(C6-C30) arylamino(s); a (C6-C30) aryl unsubstituted or substituted with at least one of deuterium(s), a cyano(s), a (C1-C30)alkyl(s), a (3- to 50-membered) heteroaryl(s), a di(C6-C30) arylamino(s), and a tri (C6-C30) arylsilyl(s); a tri (C1-C30)alkylsilyl; a tri (C6-C30) arylsilyl; a di(C1-C30) alkyl(C6-C30) arylsilyl; a (C1-C30)alkyldi (C6-C30) arylsilyl; an amino; a mono- or di-(C1-C30)alkylamino; a mono- or di-(C6-C30) arylamino; a (C1-C30)alkyl(C6-C30) arylamino; a (C1-C30)alkylcarbonyl; a (C1-C30)alkoxycarbonyl; a (C6-C30) arylcarbonyl; a di(C6-C30) arylboronyl; a di(C1-C30)alkylboronyl; a (C1-C30)alkyl(C6-C30) arylboronyl; a (C6-C30) aryl(C1-C30)alkyl; and a (C1-C30)alkyl (C6-C30) aryl. Preferably, the substituents may be at least one selected from the group consisting of deuterium; a (C1-C20)alkyl; a (C6-C25) aryl unsubstituted or substituted with at least one of deuterium(s), a (C1-C20)alkyl(s), a (3- to 30-membered) heteroaryl(s), and a di(C6-C25) arylamino(s); a (3- to 30-membered) heteroaryl unsubstituted or substituted with at least one of a (C1-C20)alkyl(s) and a (C6-C25) aryl(s); and a di(C6-C20) arylamino(s). More preferably, the substituents may be at least one selected from the group consisting of deuterium; a (C1-C10)alkyl; and a (C6-C20) aryl unsubstituted or substituted with deuterium(s). For example, the substituents may be at least one selected from the group consisting of deuterium; a methyl; a phenyl unsubstituted or substituted with deuterium(s); a naphthyl; a biphenyl; and a terphenyl.

In the formulas of the present disclosure, the heteroaryl, the heteroarylene, and the heterocycloalkyl, each independently, may contain at least one heteroatom selected from B, N, O, S, Si, and P. Also, the heteroatom may be bonded to at least one selected from the group consisting of hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri (C1-C30)alkylsilyl, a substituted or unsubstituted di(C1-C30)alkyl(C6-C30) arylsilyl, a substituted or unsubstituted (C1-C30)alkyldi (C6-C30) arylsilyl, a substituted or unsubstituted tri (C6-C30) arylsilyl, a substituted or unsubstituted mono- or di-(C1-C30)alkylamino, a substituted or unsubstituted mono- or di-(C6-C30) arylamino, and a substituted or unsubstituted (C1-C30)alkyl (C6-C30) arylamino.

In formula 1, ring A, ring B, and ring C, each independently, represent a substituted or unsubstituted benzene ring, or a substituted or unsubstituted naphthalene ring. According to one embodiment of the present disclosure, ring A, ring B, and ring C, each independently, may be an unsubstituted benzene ring or an unsubstituted naphthalene ring.

In formula 1, n represents an integer of 0 or 1; Y represents O, S, or NRa; and Ra represents -$L_2$-$Ar_2$. If n is 0, both ring A and ring B represent a substituted or unsubstituted naphthalene ring, preferably an unsubstituted naphthalene ring.

$Ar_1$ and $Ar_2$, each independently, represent a substituted or unsubstituted (C6-C30) aryl; a substituted or unsubstituted (3- to 30-membered) heteroaryl containing at least one of nitrogen(s), oxygen(s), and sulfur(s); or a substituted or unsubstituted di(C6-C30) arylamino. According to one embodiment of the present disclosure, $Ar_1$ and $Ar_2$, each independently, represent a substituted or unsubstituted (C6-C25) aryl; a substituted or unsubstituted (5- to 25-membered) heteroaryl containing at least one of nitrogen(s), oxygen(s), and sulfur(s); or a substituted or unsubstituted di(C6-C25) arylamino. According to another embodiment of the present disclosure, $Ar_1$ and $Ar_2$, each independently, represent a (C6-C25) aryl unsubstituted or substituted with a (C1-C10)alkyl(s); a (5- to 20-membered) heteroaryl unsubstituted or substituted with a (C6-C18) aryl(s) and containing at least one of nitrogen(s), oxygen(s), and sulfur(s); or a di(C6-C18) arylamino unsubstituted or substituted with a (C6-C18) aryl(s). Specifically, $Ar_1$ may be a substituted or unsubstituted phenyl, a substituted or unsubstituted naphthyl, a substituted or unsubstituted biphenyl, a substituted or unsubstituted terphenyl, a substituted or unsubstituted pyridyl, a substituted or unsubstituted pyrimidinyl, a substituted or unsubstituted benzofuropyrimidinyl, a substituted or unsubstituted triazinyl, a substituted or unsubstituted quinolyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted carbazolyl, a substituted or unsubstituted benzocarbazolyl, a substituted or unsubstituted dibenzothiophenyl, a substituted or unsubstituted benzothiophenyl, a substituted or unsubstituted dibenzofuranyl, a substituted or unsubstituted benzofuranyl, a substituted or unsubstituted naphthyridinyl, a substituted or unsubstituted fluorenyl, a substituted or unsubstituted benzofluorenyl, a substituted or unsubstituted spirobifluorenyl, a substituted or unsubstituted triphenylenyl, a substituted or unsubstituted benzonaphthofuranyl, a substituted s or unsubstituted benzonaphthothiophenyl, a substituted or unsubstituted diphenylamino, a substituted or unsubstituted naphthylphenylamino, or a substituted or unsubstituted biphenylphenylamino. For example, $Ar_1$ and $Ar_2$, each independently, may represent a phenyl; a naphthyl; a biphenyl; a terphenyl; a dimethylfluorenyl; a dimethylbenzofluorenyl; a spirobifluorenyl; a pyridyl substituted with a phenyl(s); a pyrimidinyl substituted with a phenyl(s); a triazinyl substituted with a phenyl(s); a quinolyl substituted with a phenyl(s); a quinazolinyl substituted with at least one of a phenyl(s) and a naphthyl(s); a quinoxalinyl substituted with at least one of a phenyl(s) and a naphthyl(s); a naphthyridinyl substituted with a phenyl(s); a dibenzothiophenyl; a dibenzothiofuranyl; a carbazolyl substituted with a phenyl(s); a benzofuropyrimidinyl substituted with a phenyl(s); a benzoquinazolinyl substituted with a phenyl(s); a benzoquinoxalinyl substituted with a phenyl(s); a benzocarbazolyl substituted with a phenyl(s); a diphenylamino; a phenylnaphthylamino; a phenylbiphenylamino; a diphenylamino substituted with a naphthyl(s); a phenylbiphenylamino substituted with a naphthyl(s), etc.

$L_1$ and $L_2$, each independently, represent a single bond, a substituted or unsubstituted (C6-C30) arylene, or a substituted or unsubstituted (3- to 30-membered) heteroarylene. According to one embodiment of the present disclosure, $L_1$ and $L_2$, each independently, represent a single bond, a substituted or unsubstituted (C6-C25) arylene, or a substituted or unsubstituted (5- to 25-membered) heteroarylene. According to another embodiment of the present disclosure, $L_1$ and $L_2$, each independently, represent a single bond; an unsubstituted (C6-C18) arylene; or a (5- to 20-membered) heteroarylene unsubstituted or substituted with a (C6-C18) aryl(s). For example, $L_1$ and $L_2$, each independently, may represent a single bond; a phenylene; a naphthylene; a biphenylene; a triazinylene substituted with a phenyl(s); a pyrimidinylene substituted with a phenyl(s); a quinolylene; a quinazolinylene unsubstituted or substituted with a phenyl(s); a quinoxalinylene unsubstituted or substituted with a phenyl(s); a naphthyridinylene; a benzofuropyrimidinylene; a benzoquinazolinylene; a carbazolylene; a benzoquinoxalinylene; a benzocarbazolylene, etc.

The formula 1 may be represented by any one of the following formulas 1-1 to 1-7.

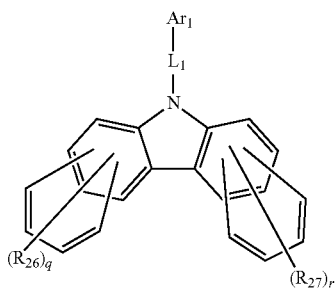

(1-7)

In formulas 1-1 to 1-7, $Ar_1$, $L_1$, and Y are as defined in formula 1.

In formulas 1-1 to 1-7, $R_{11}$ to $R_{27}$, each independently, represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri (C1-C30)alkylsilyl, a substituted or unsubstituted di(C1-C30)alkyl (C6-C30) arylsilyl, a substituted or unsubstituted (C1-C30) alkyldi (C6-C30) arylsilyl, a substituted or unsubstituted tri (C6-C30) arylsilyl; a substituted or unsubstituted mono- or di-(C1-C30)alkylamino; a substituted or unsubstituted mono- or di-(C6-C30) arylamino, or a substituted or unsubstituted (C1-C30)alkyl(C6-C30) arylamino. For example, $R_{11}$ to $R_{27}$ may represent hydrogen.

In formulas 1-1 to 1-7, a, d, h, m, q, and r, each independently, represent an integer of 1 to 6; and b, c, e, f, g, i, j, k, l, o, and p, each independently, represent an integer of 1 to 4, in which if a to m and o to r, each independently, are an integer of 2 or more, each of $R_{11}$, each of $R_{12}$, each of $R_{13}$, each of $R_{14}$, each of $R_{15}$, each of $R_{16}$, each of $R_{17}$, each of $R_{18}$, each of $R_{19}$, each of $R_{20}$, each of $R_{21}$, each of $R_{22}$, each of $R_{23}$, each of $R_{24}$, each of $R_{25}$, each of $R_{26}$, and each of $R_{27}$ may be the same or different.

In formula 2, HAr represents a substituted or unsubstituted nitrogen-containing (3- to 30-membered) heteroaryl. According to one embodiment of the present disclosure, HAr represents a substituted or unsubstituted (5- to 25-membered) heteroaryl containing at least one nitrogen. According to another embodiment of the present disclosure, HAr represents a (5- to 20-membered) heteroaryl substituted with a (C6-C30) aryl(s) and containing at least one nitrogen. Specifically, HAr may represent a substituted or unsubstituted triazinyl, a substituted or unsubstituted pyridyl, a substituted or unsubstituted pyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, or a substituted or unsubstituted benzothienopyrimidinyl. For example, HAr may represent a substituted triazinyl, in which the substituent of the substituted triazinyl may be at least one, preferably two selected from the group consisting of a phenyl(s); a phenyl(s) substituted with deuterium(s); a naphthyl(s); a biphenyl(s); and a terphenyl(s).

In formula 2, $L_3$ represents a naphthylene unsubstituted or substituted with deuterium(s), a biphenylene unsubstituted or substituted with deuterium(s), a terphenylene unsubstituted or substituted with deuterium(s), or a-phenylene-naphthylene-unsubstituted or substituted with deuterium(s). According to one embodiment of the present disclosure, $L_3$ represents a naphthylene unsubstituted or substituted with deuterium(s); an unsubstituted biphenylene; or an unsubstituted-phenylene-naphthylene-. The -phenylene-naphthylene-refers to that the phenylene therein may be bonded to HAr or the naphthylene therein may be bonded to HAr.

In formula 2, $R_1$ to $R_8$, each independently, represent hydrogen, deuterium, or a (C6-C30) aryl unsubstituted or substituted with at least one of deuterium(s) and a (C6-C30) aryl(s). According to one embodiment of the present disclosure, $R_1$ to $R_8$, each independently, represent hydrogen, deuterium, or a (C6-C25) aryl unsubstituted or substituted with a (C6-C30) aryl(s). According to another embodiment of the present disclosure, $R_1$ to $R_8$, each independently, represent hydrogen, deuterium, or an unsubstituted (C6-C18) aryl. $R_1$ to $R_8$, may be the same as or different from one another. For example, $R_1$ to $R_8$, each independently, may represent hydrogen, deuterium, a phenyl, a naphthyl, or a biphenyl.

According to one embodiment of the present disclosure, the formula 2 may be represented by the following formula 3.

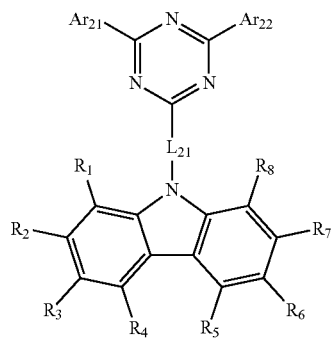

(3)

In formula 3, $Ar_{21}$ and $Ar_{22}$, each independently, represent a phenyl unsubstituted or substituted with deuterium(s), a biphenyl unsubstituted or substituted with deuterium(s), a terphenyl unsubstituted or substituted with deuterium(s), or a naphthyl unsubstituted or substituted with deuterium(s); $L_{21}$ represents a naphthylene unsubstituted or substituted with deuterium(s), or a biphenylene unsubstituted or substituted with deuterium(s); $R_1$, $R_4$, $R_5$, and $R_8$, each independently, represent hydrogen, deuterium, a phenyl unsubstituted or substituted with deuterium(s), a biphenyl unsubstituted or substituted with deuterium(s), a terphenyl unsubstituted or substituted with deuterium(s), or a naphthyl unsubstituted or substituted with deuterium(s); and $R_2$, $R_3$, $R_6$, and $R_7$, each independently, represent hydrogen or deuterium; with the proviso that if both $Ar_{21}$ and $Ar_{22}$ represent a phenyl, at least one of $R_1$, $R_4$, $R_5$, and R& is not hydrogen or deuterium.

The compound represented by formula 1 may be specifically exemplified by the following compounds, but is not limited thereto.

H1-1
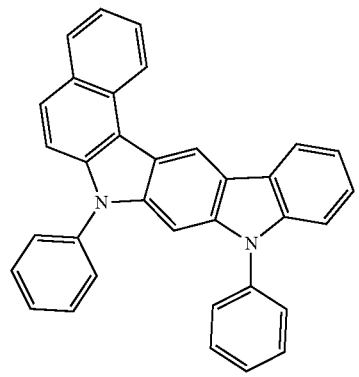
H1-2
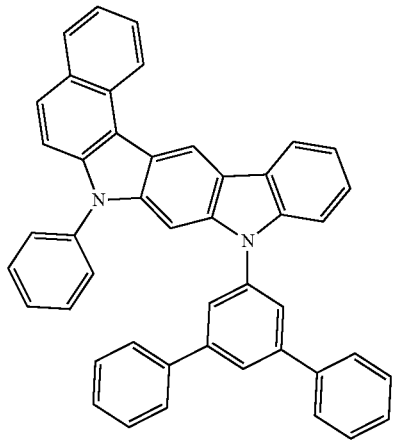
H1-3
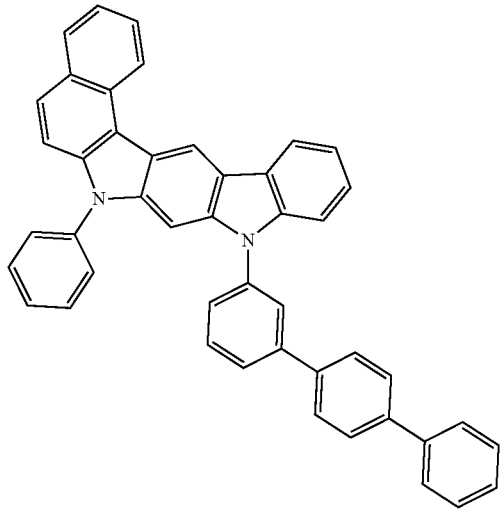
H1-4
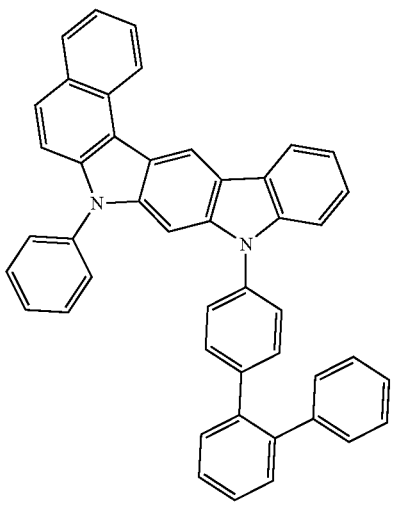
H1-5
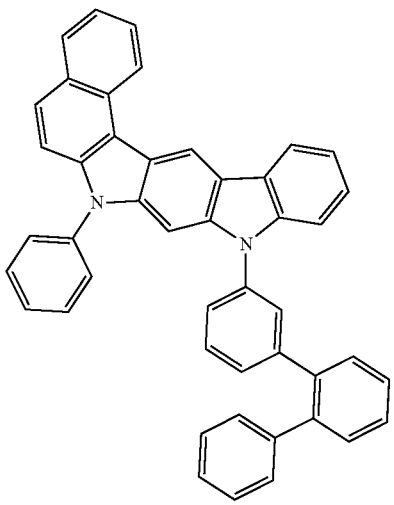
H1-6
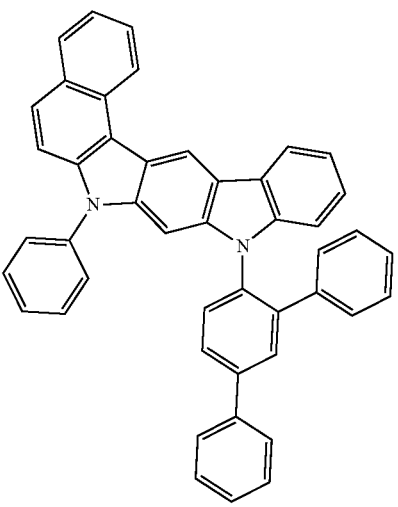

H1-7
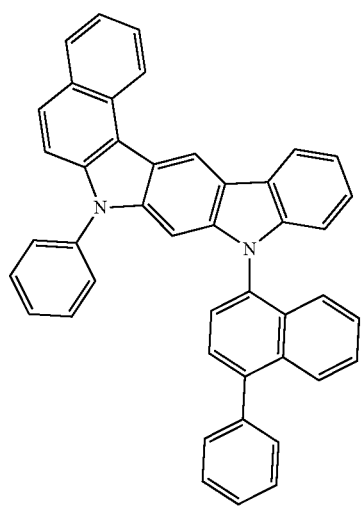
H1-8
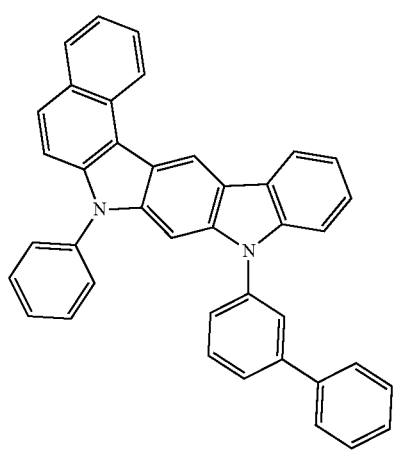
H1-9
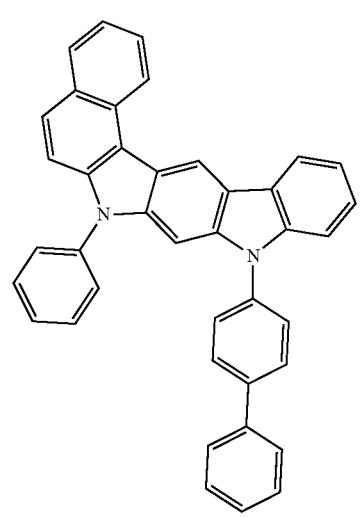
H1-10
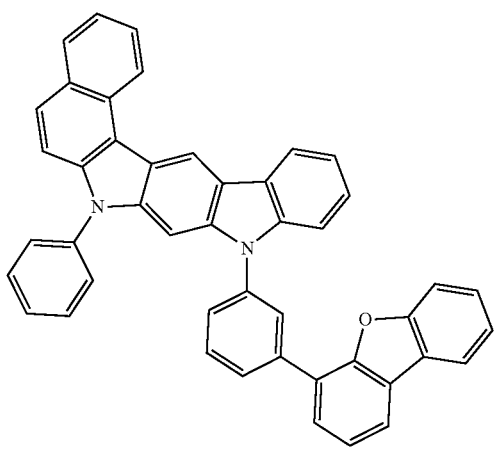
H1-11
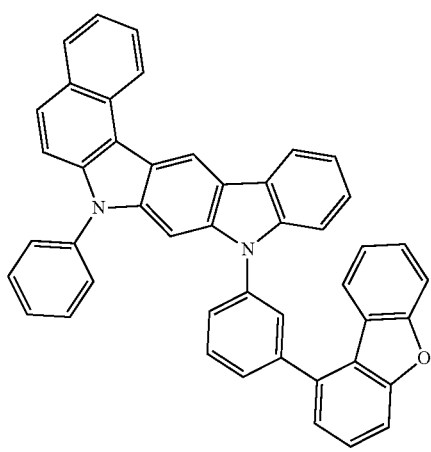
H1-12
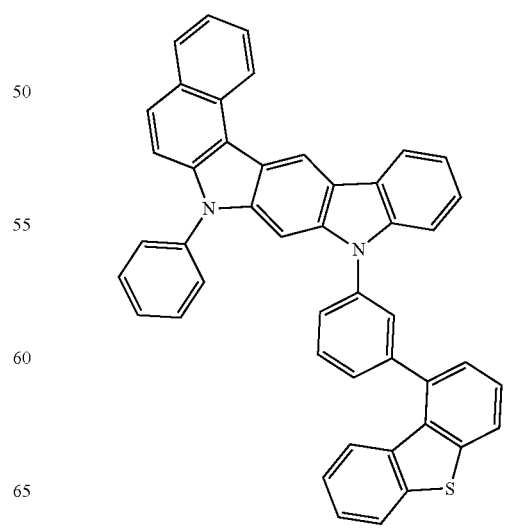

H1-13
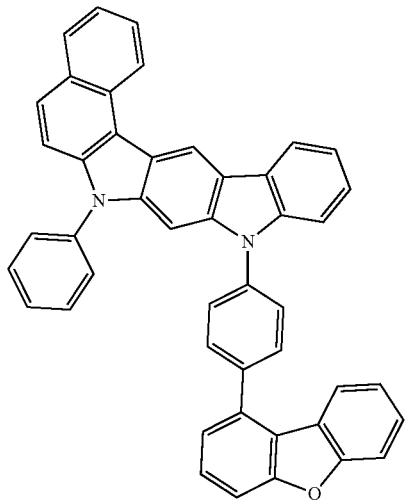
H1-14
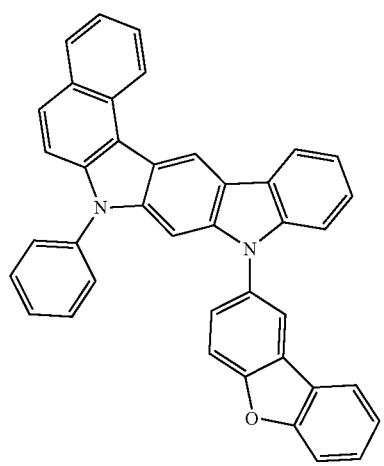
H1-15
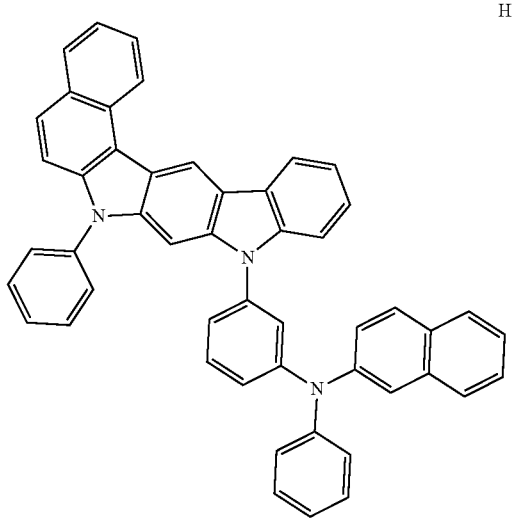
H1-16
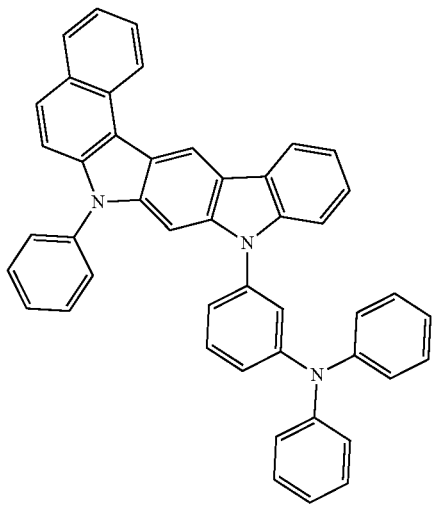
H1-17
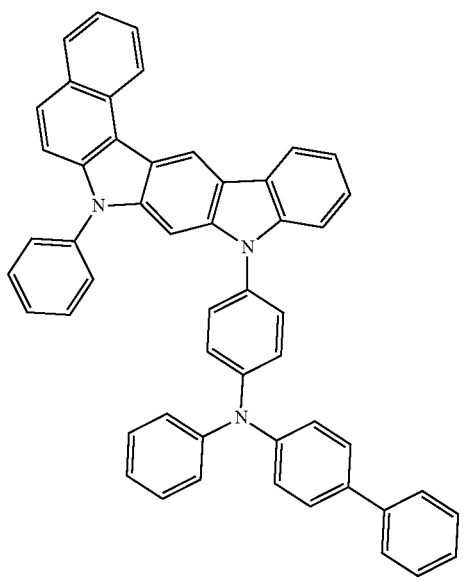

H1-18
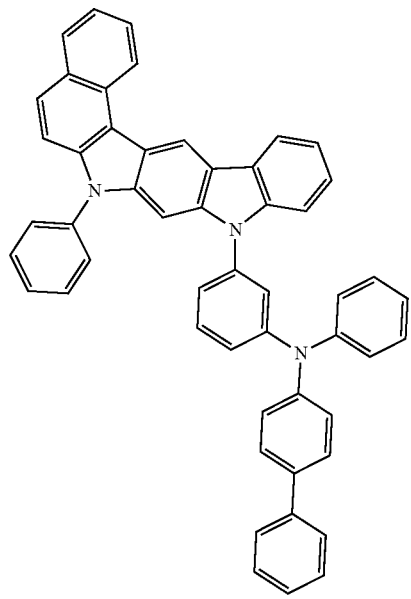
H1-19
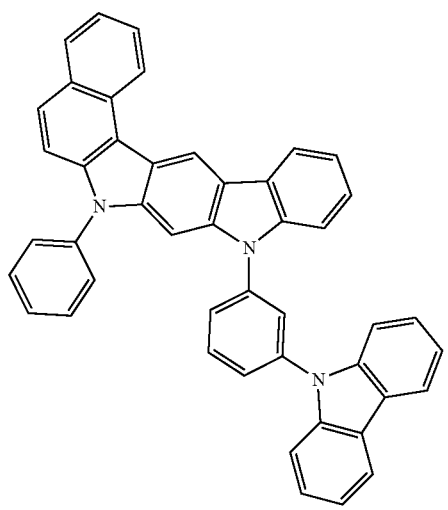
H1-20
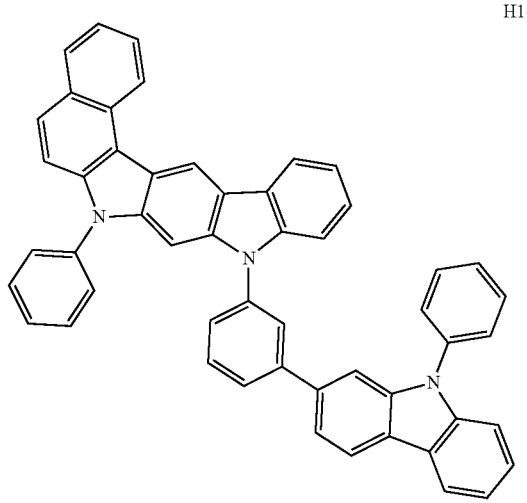
H1-21
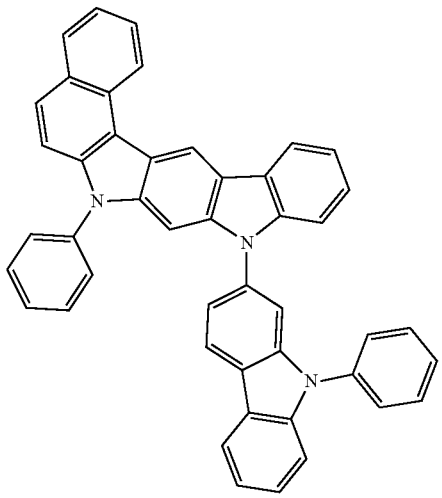
H1-22
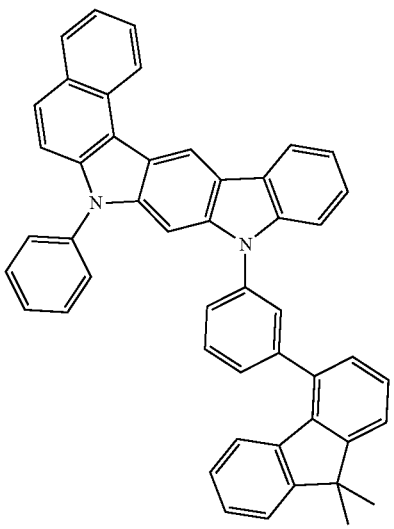
H1-23
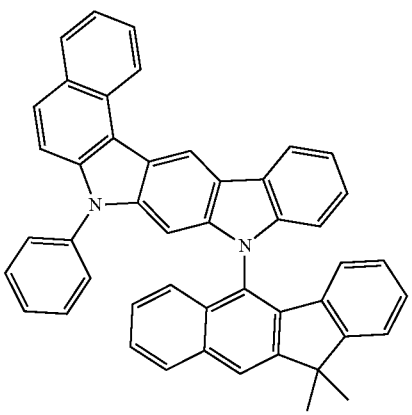

H1-24
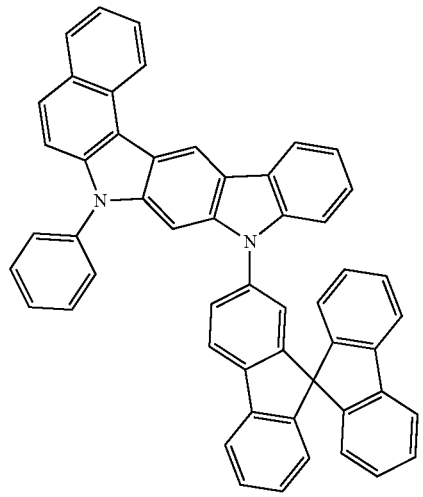
H1-25
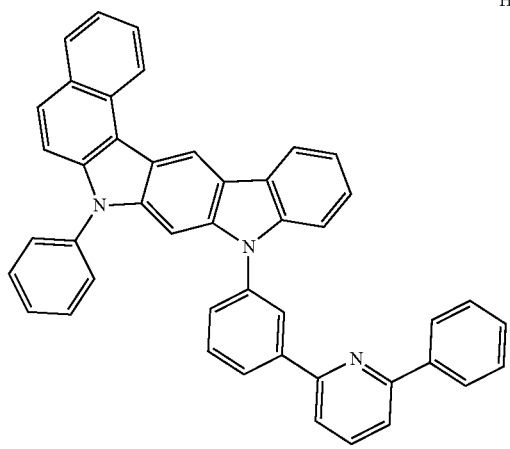
H1-26
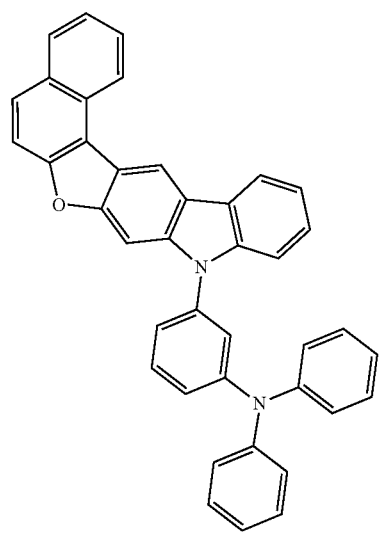
H1-27
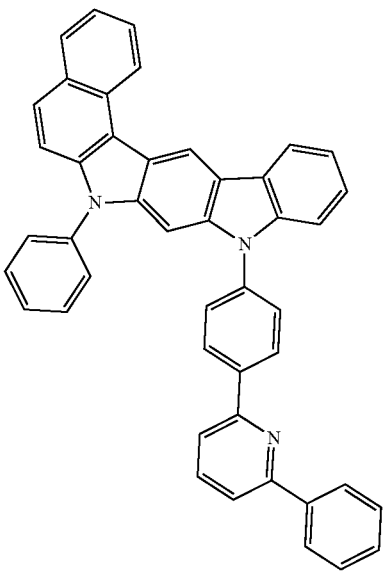
H1-28
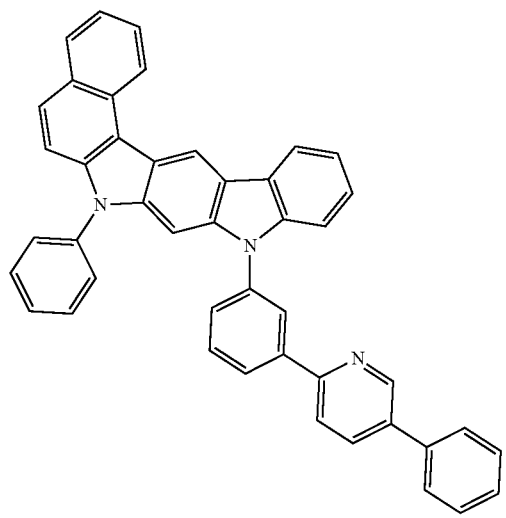
H1-29
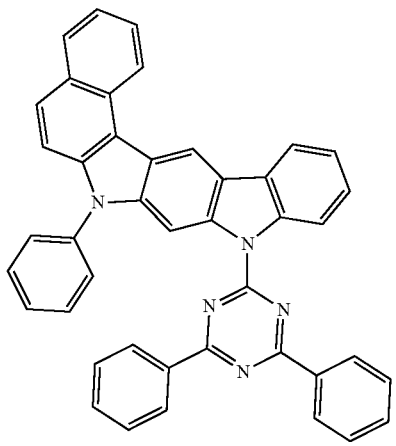

H1-30
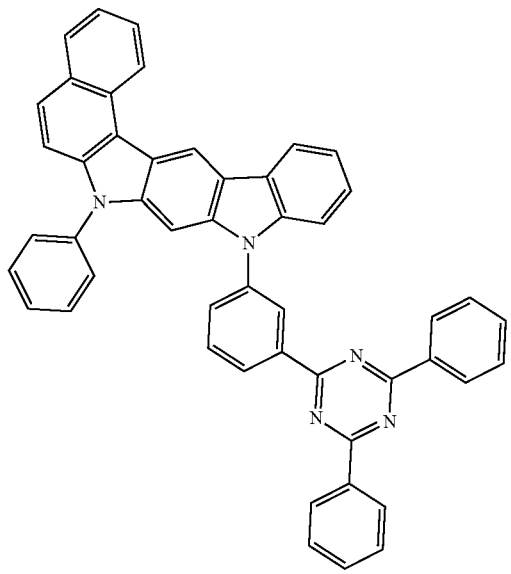
H1-31
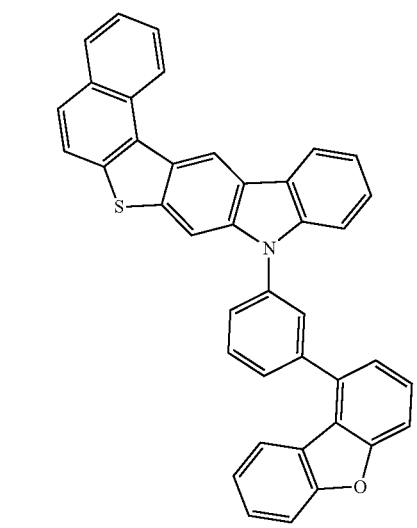
H1-32
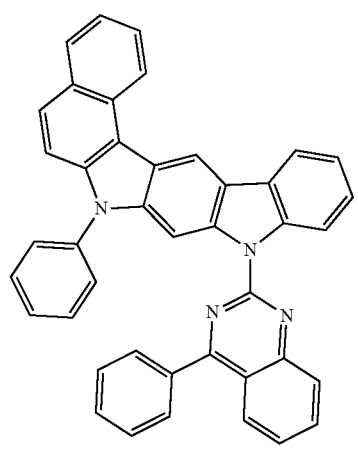
H1-33
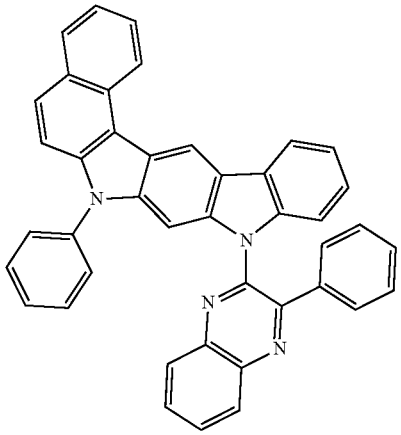
H1-34
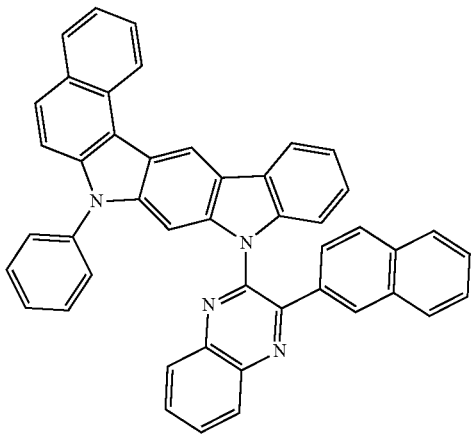
H1-35
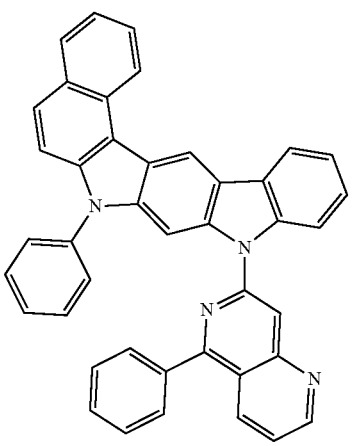

-continued
H1-36
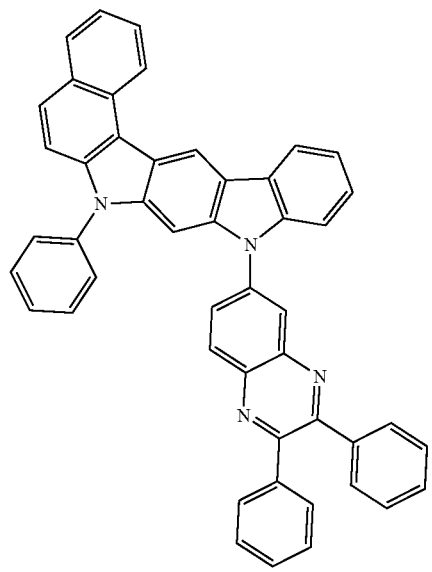
H1-37
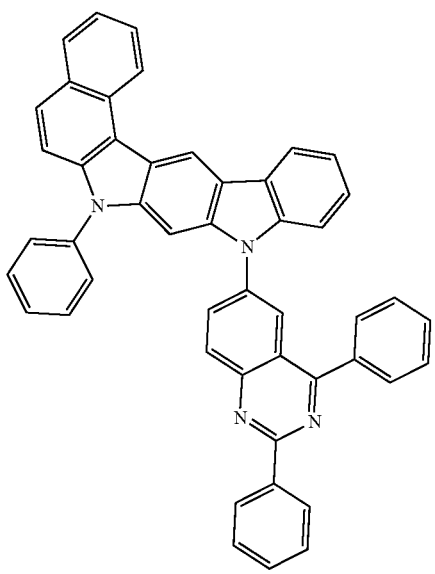
H1-38
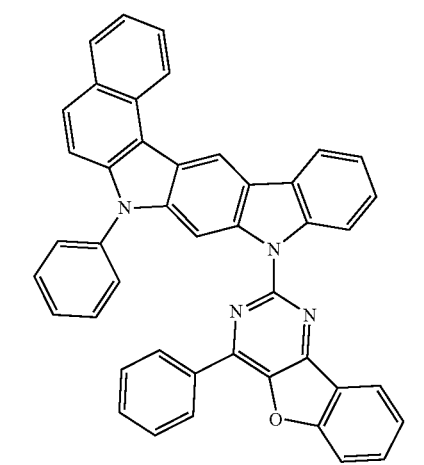
H1-39
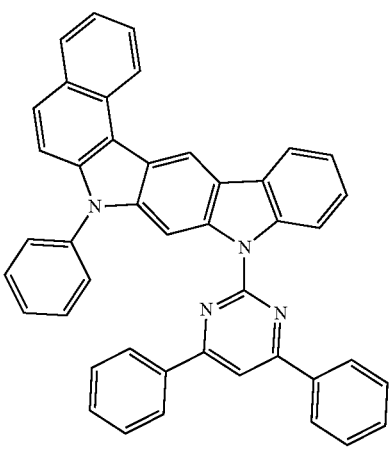
H1-40
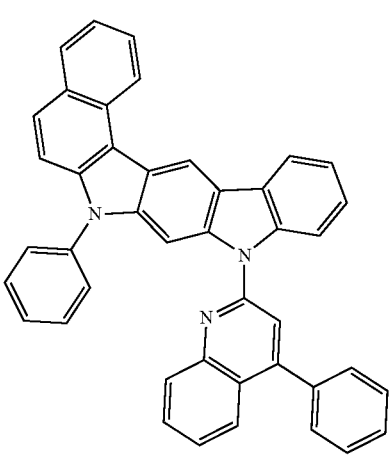
H1-41
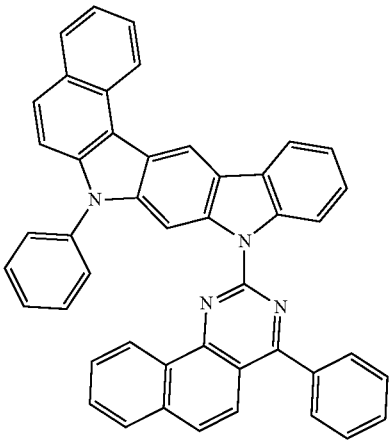

H1-42
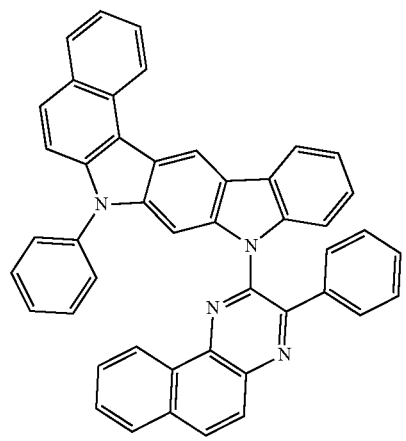
H1-43
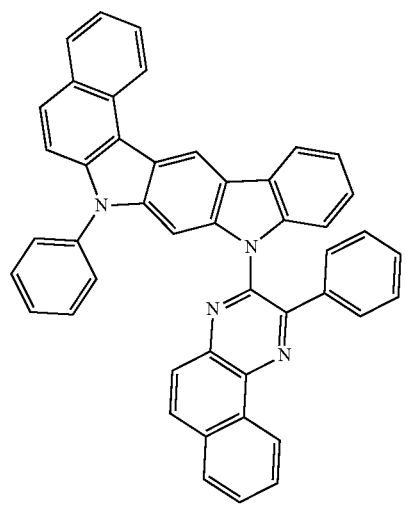
H1-44
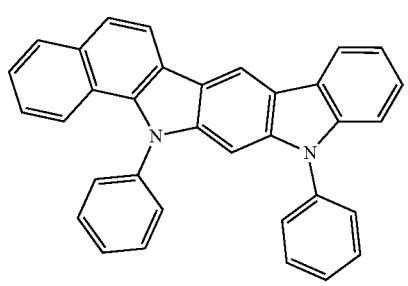
H1-45
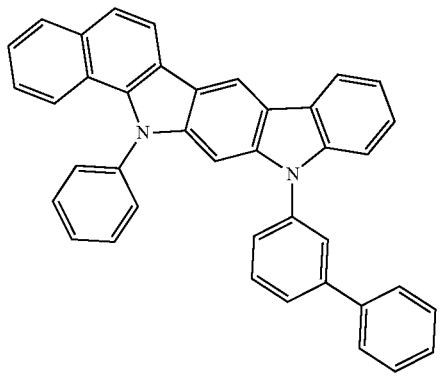
H1-46
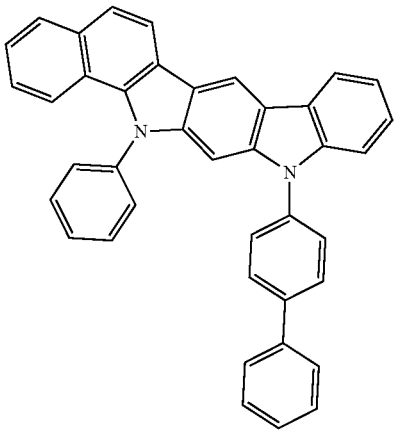
H1-47
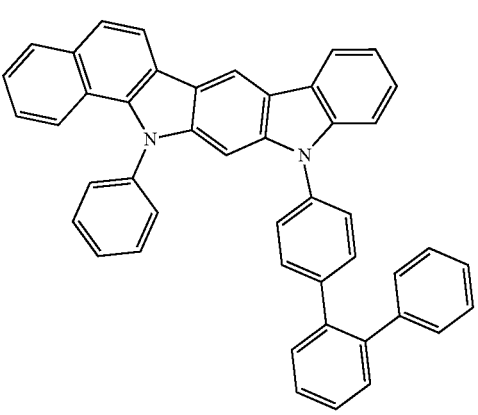
H1-48
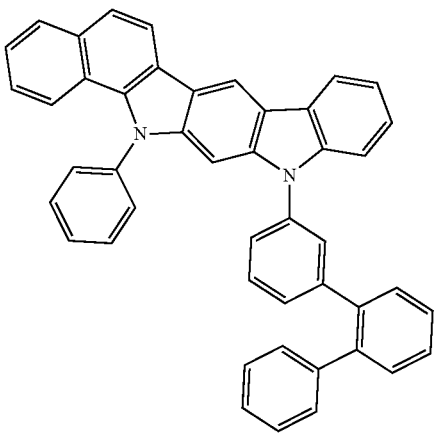
H1-49
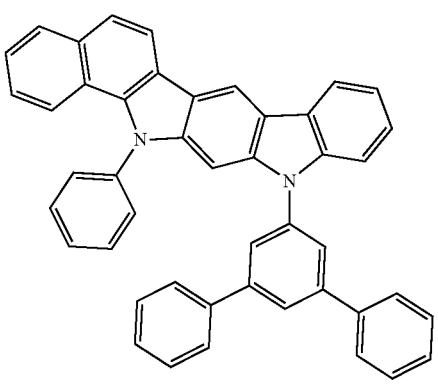

-continued
H1-50
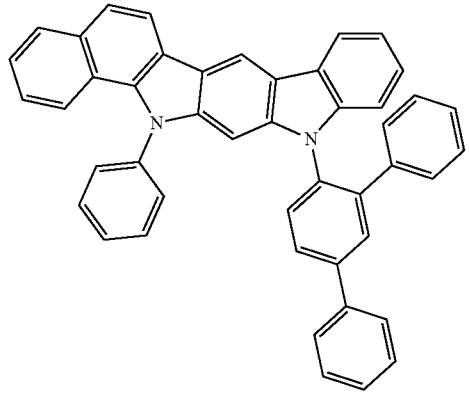
H1-51
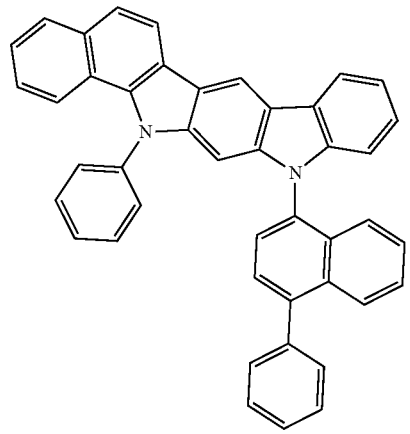
H1-52
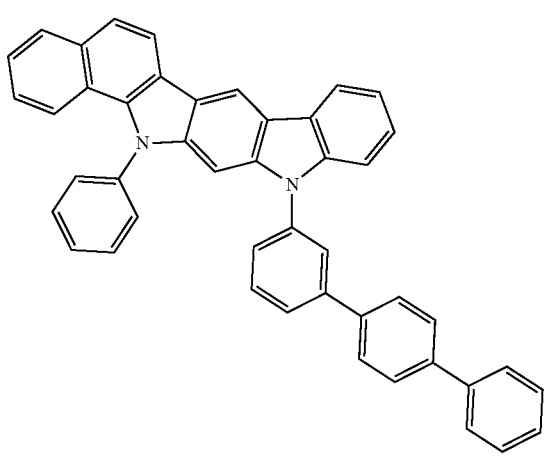
-continued
H1-53
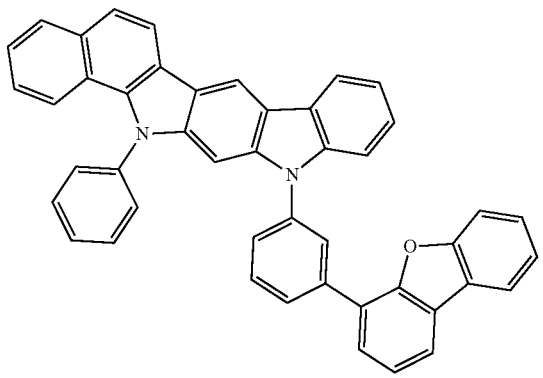
H1-54
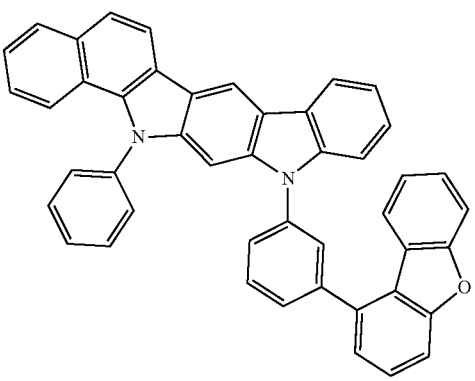
H1-55
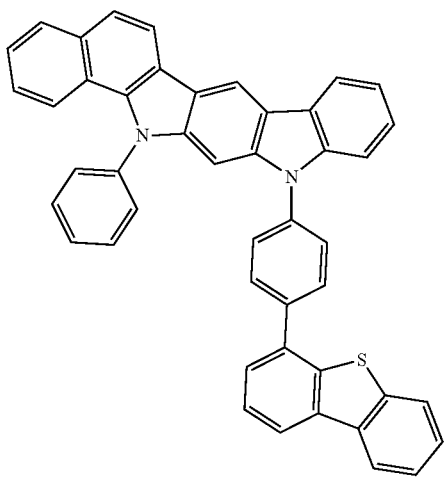
H1-56
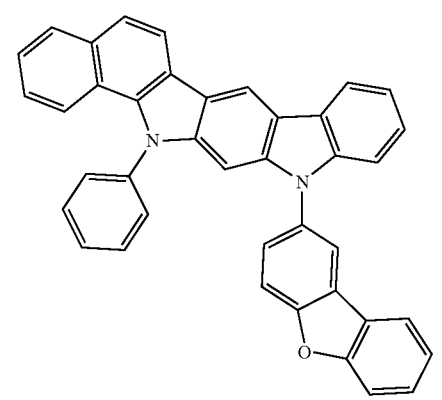

H1-57
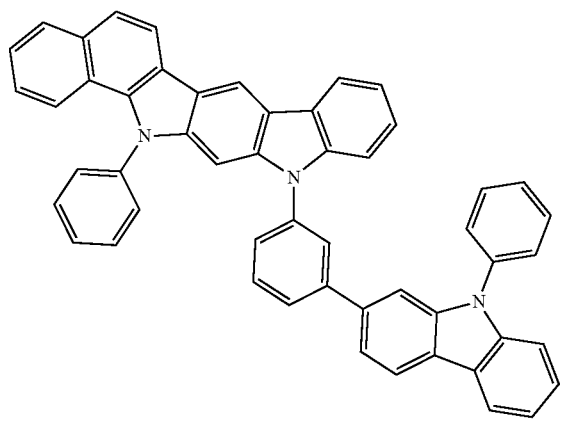
H1-58
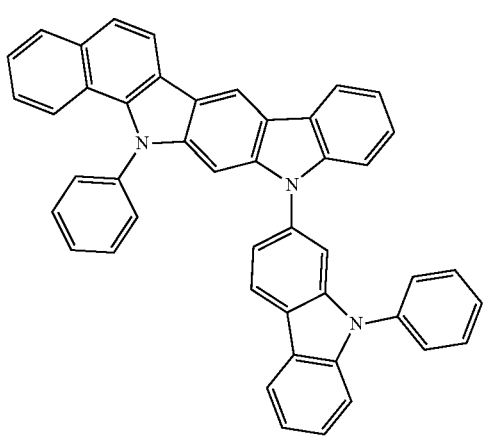
H1-59
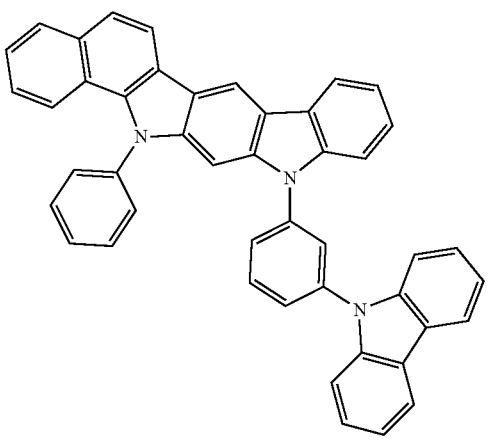
H1-60
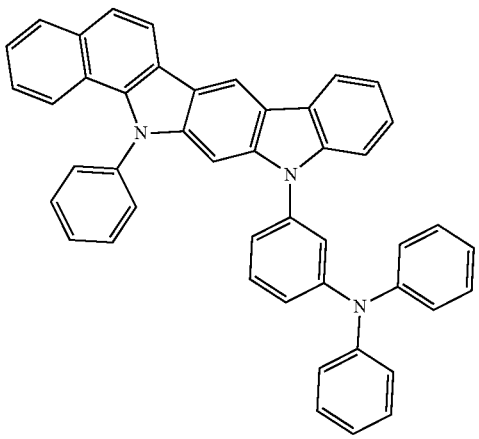
H1-61
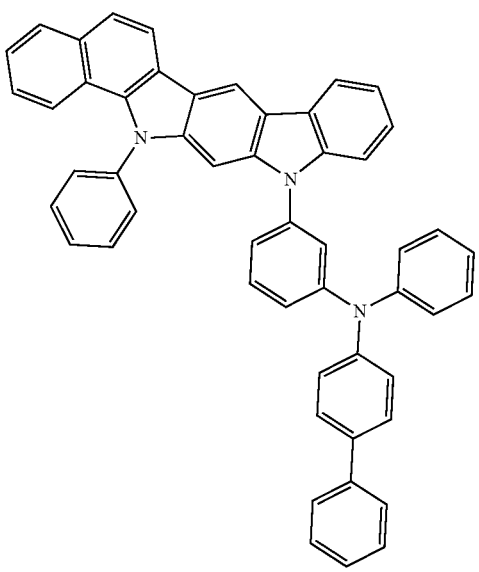
H1-62
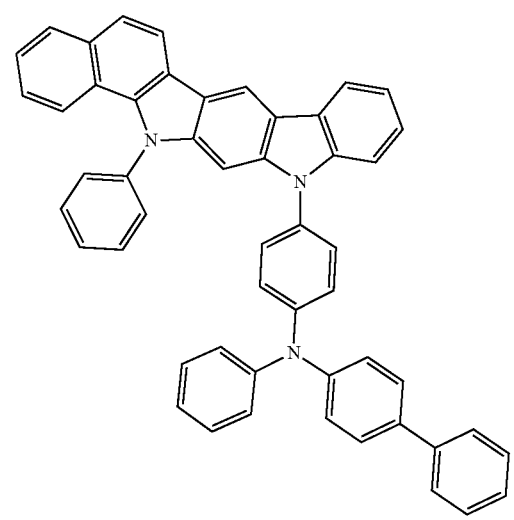

-continued
H1-63
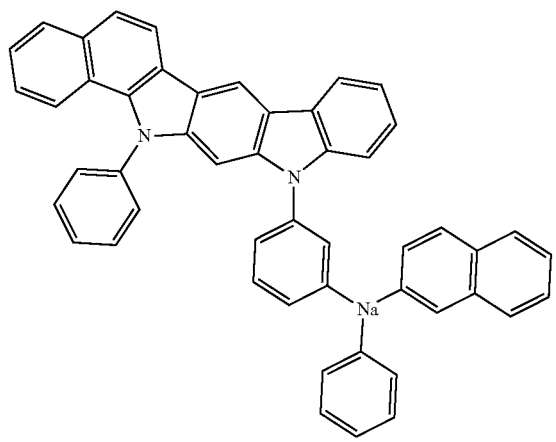
H1-64
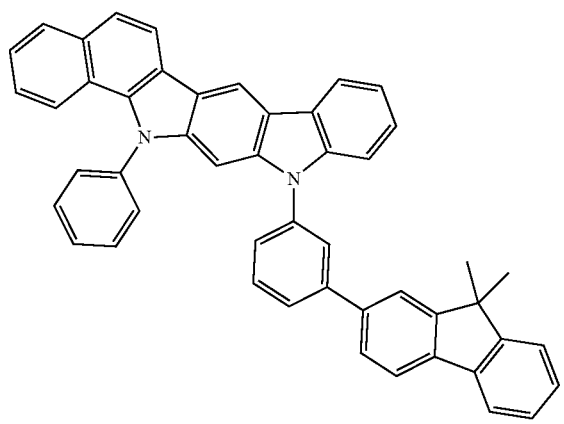
H1-65
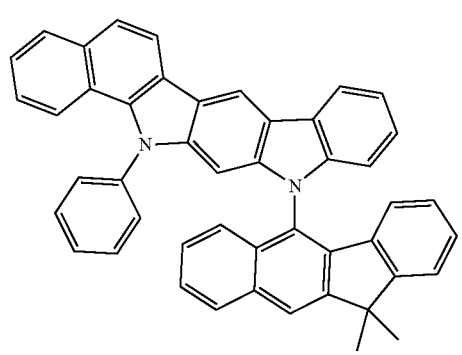
-continued
H1-66
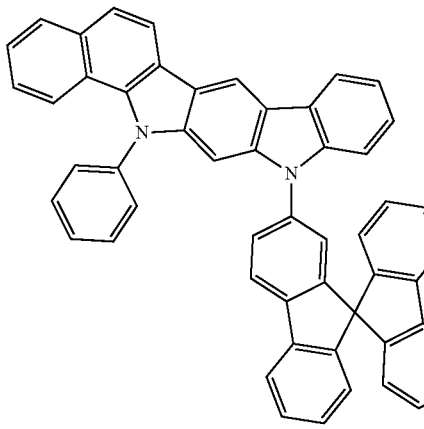
H1-67
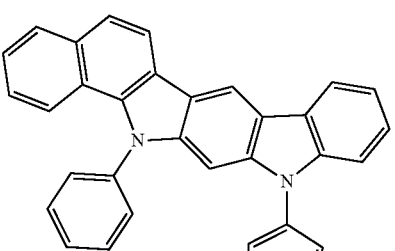
H1-68
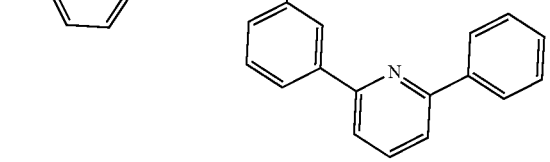
H1-69
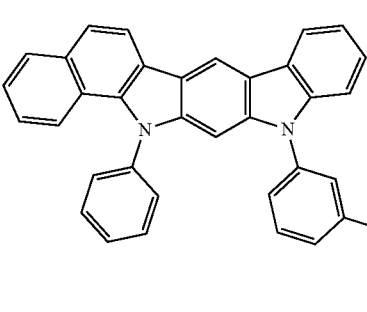

-continued
H1-70
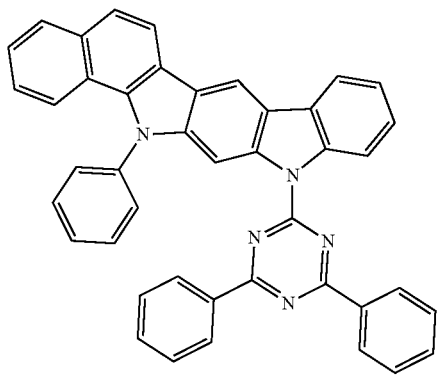
H1-71
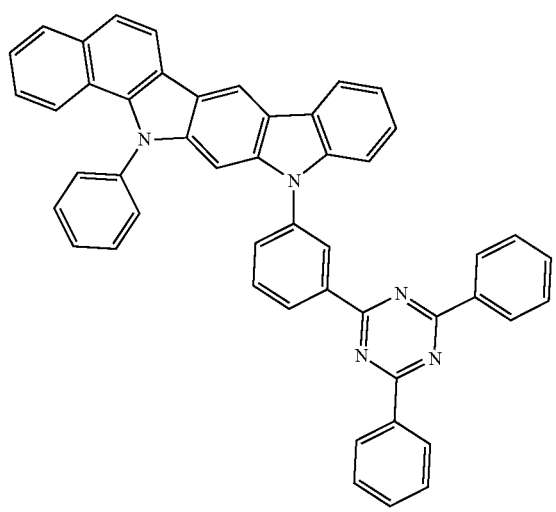
H1-72
-continued
H1-73
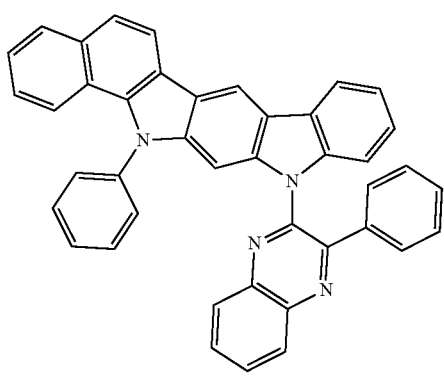
H1-74
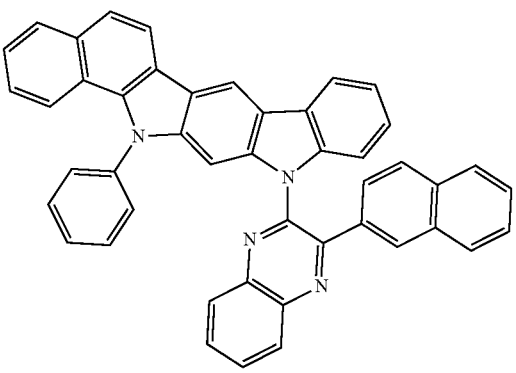
H1-75
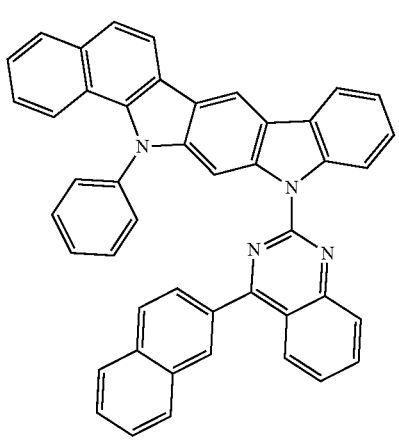
H1-76
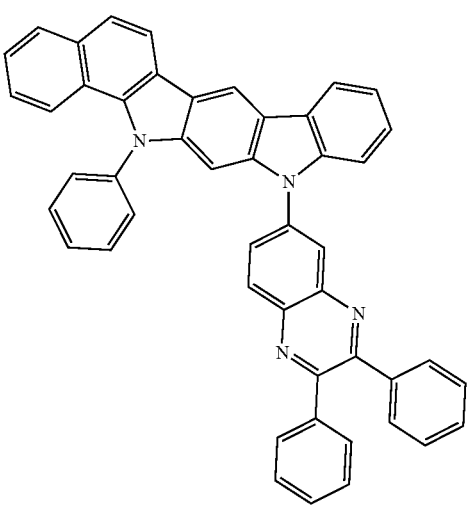

-continued
H1-77
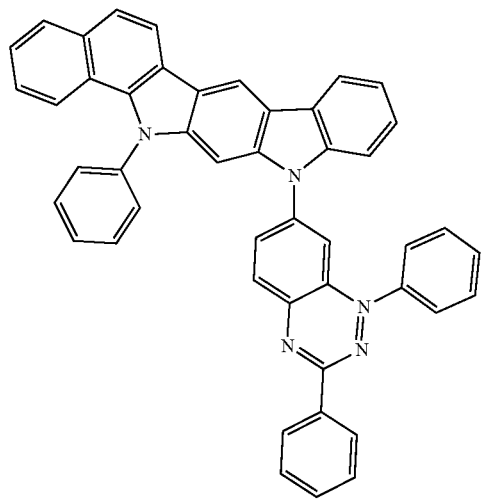
H1-78
H1-79
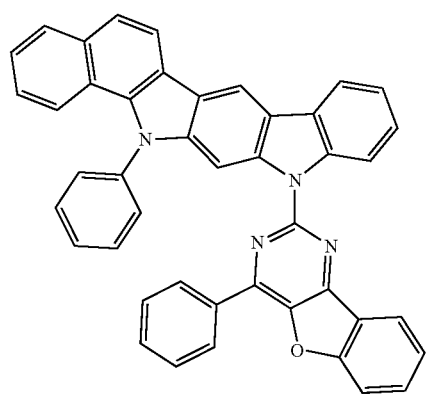
H1-80
-continued
H1-8'
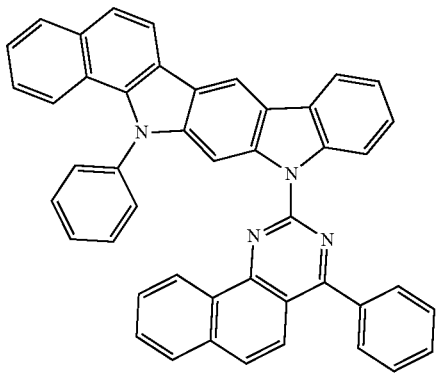
H1-82
H1-83
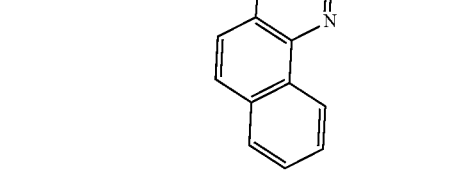

H1-84
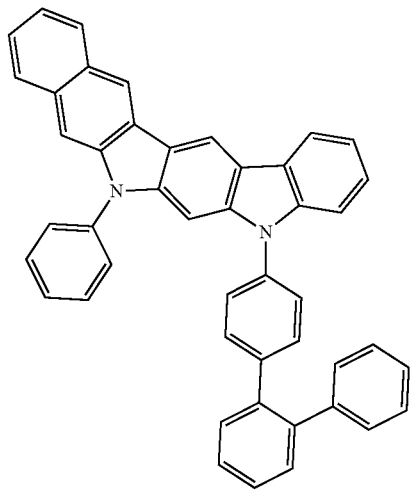
H1-85
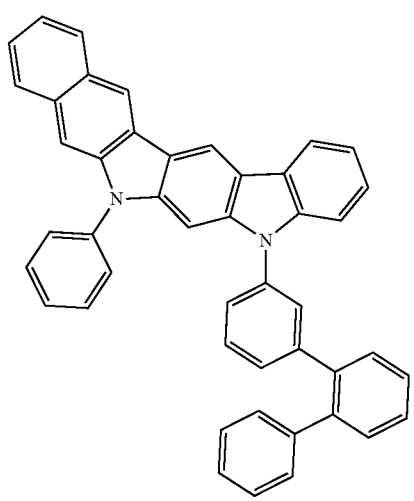
H1-86
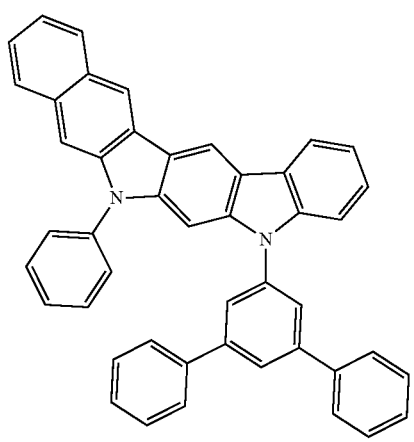
H1-87
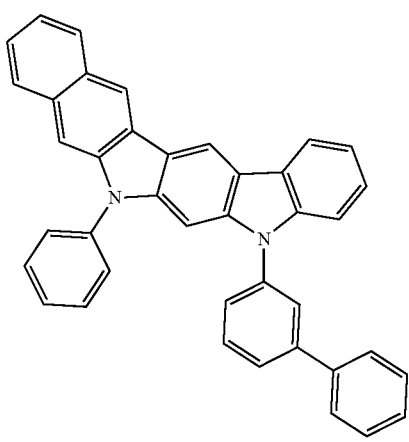
H1-88
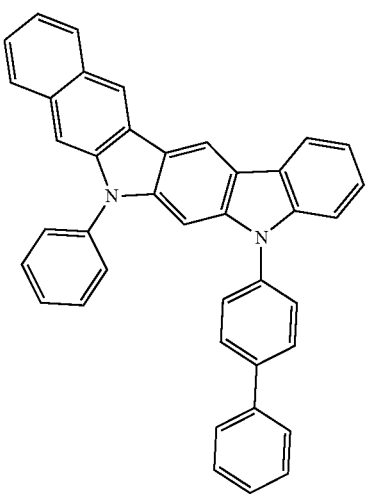
H1-89
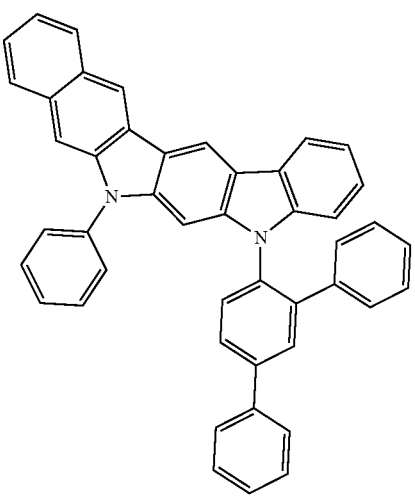

-continued
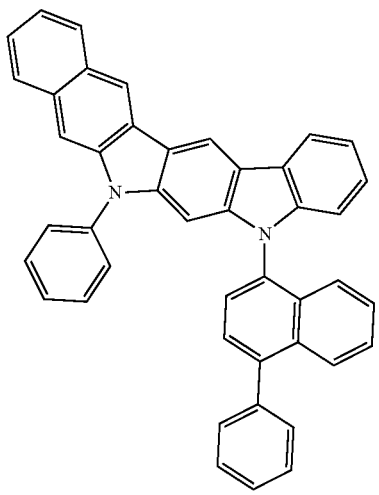
H1-90
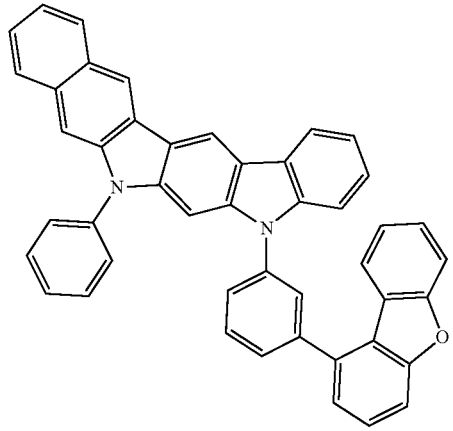
H1-93
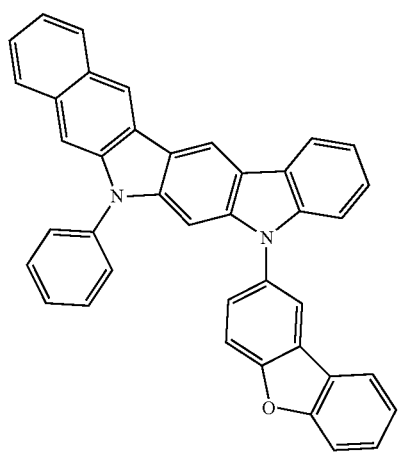
H1-91
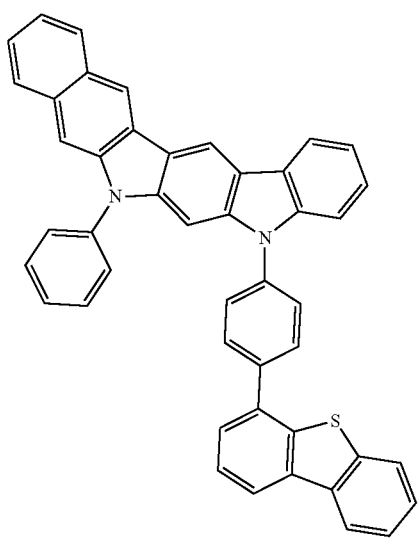
H1-94
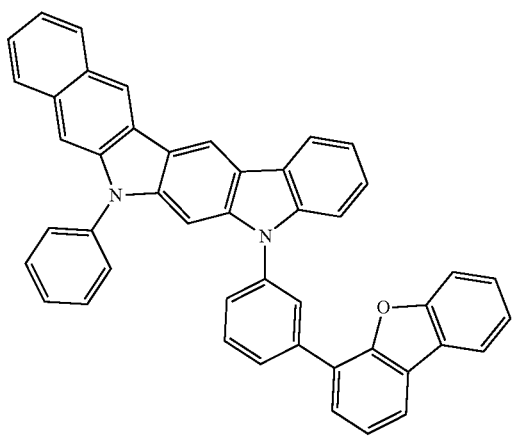
H1-92
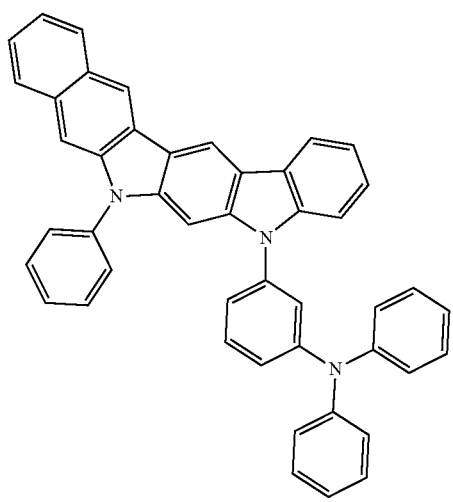
H1-95

H1-96
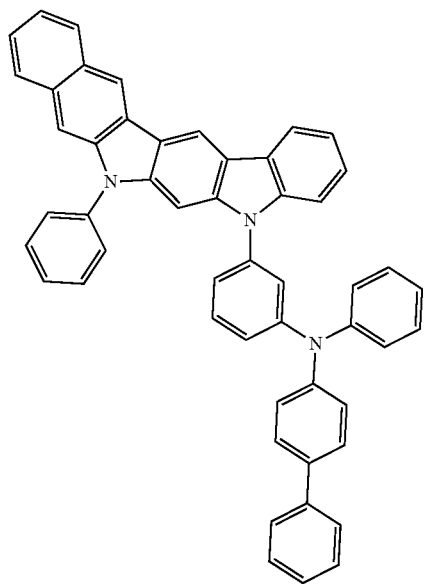
H1-97
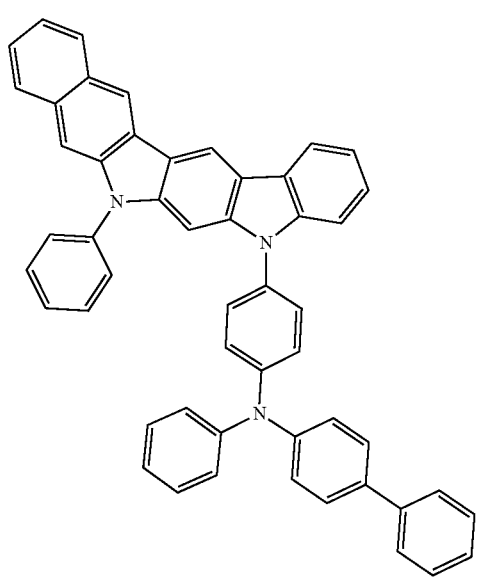
H1-98
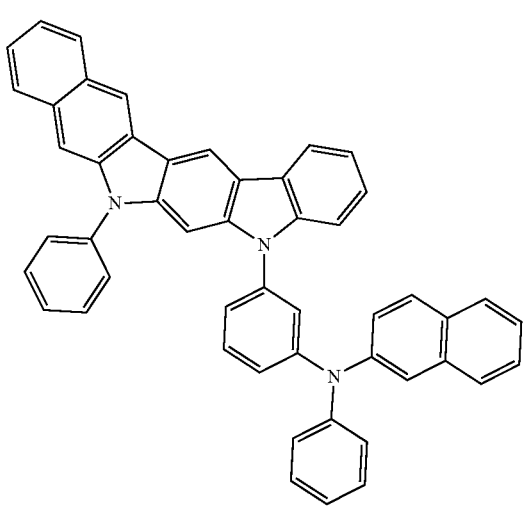
H1-99
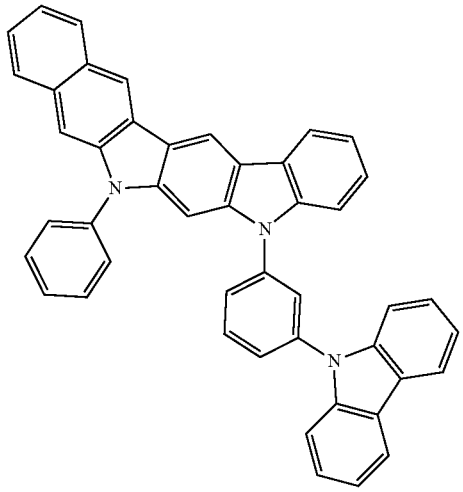
H1-100
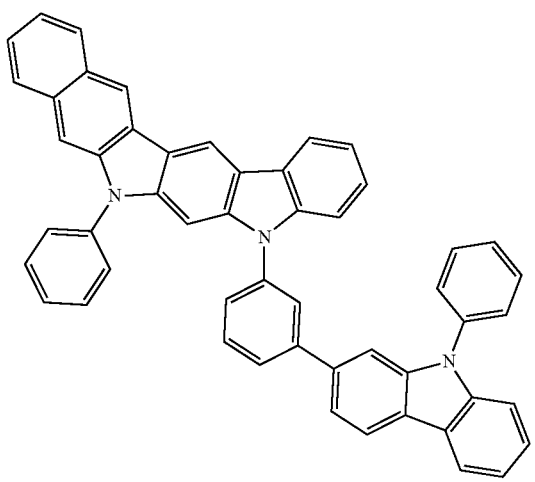
H1-101
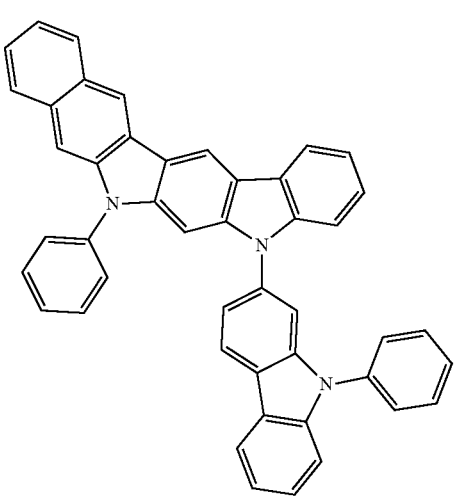

H1-102
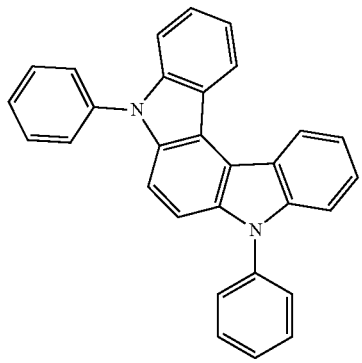
H1-103
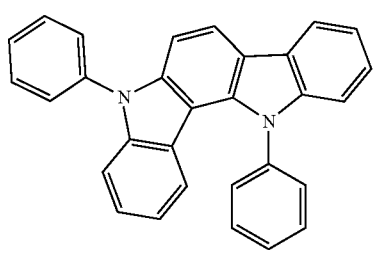
H1-104
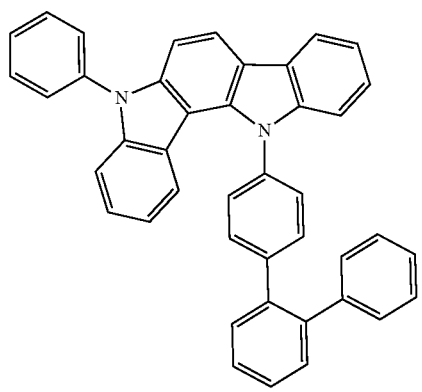
H1-105
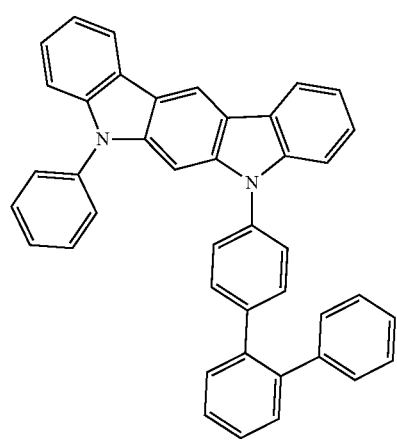
H1-106
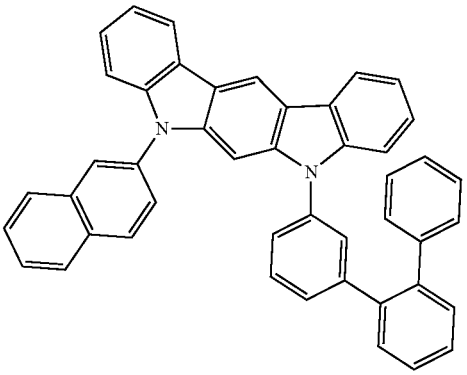
H1-107
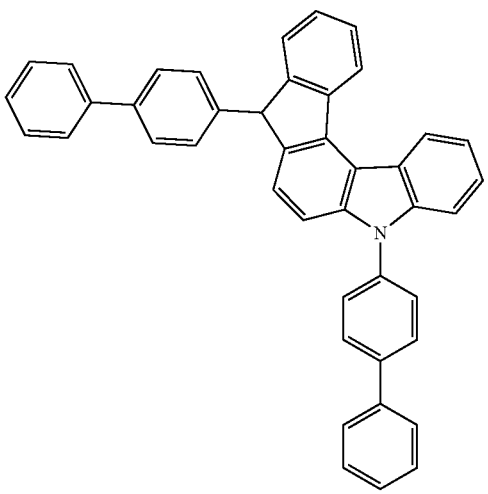
H1-108
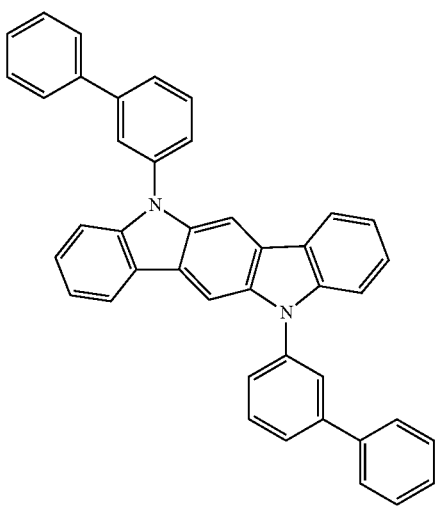

H1-109
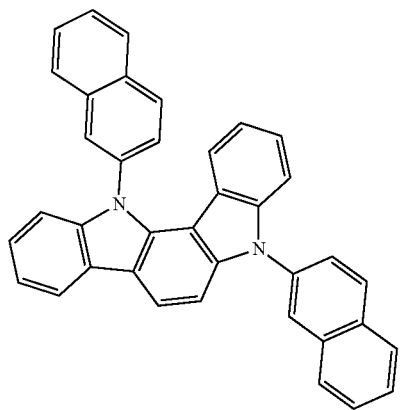
H1-110
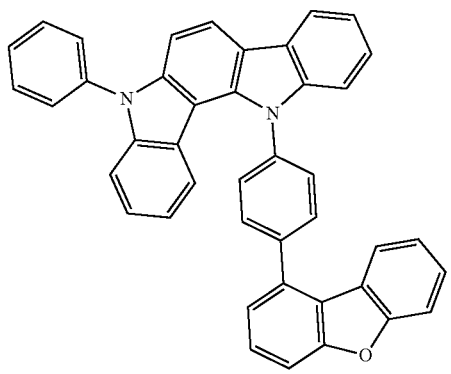
H1-111
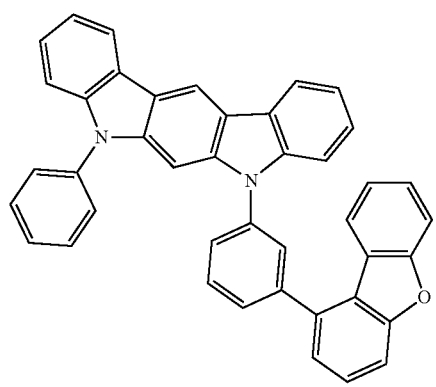
H1-112
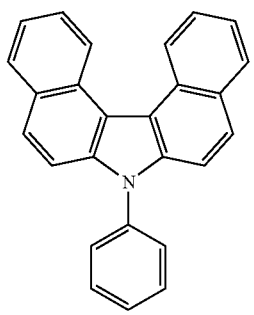
H1-113
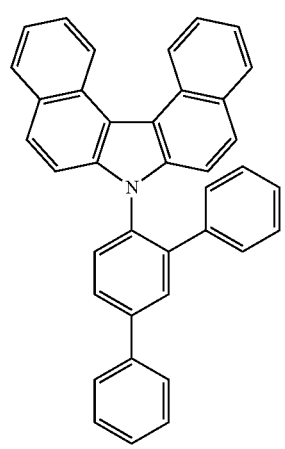
H1-114
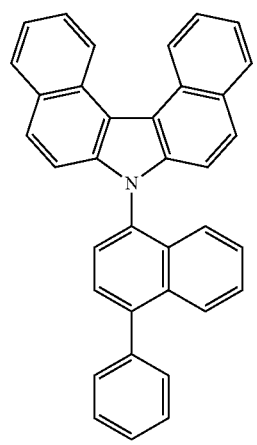
H1-115
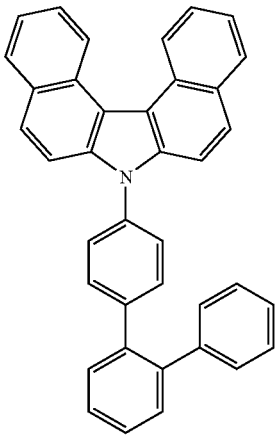

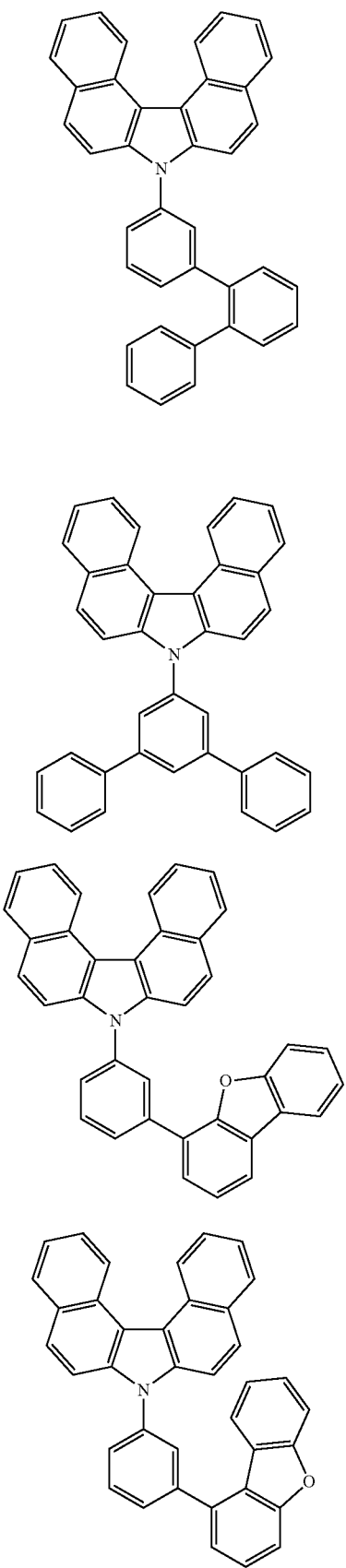
H1-116
H1-117
H1-118
H1-119
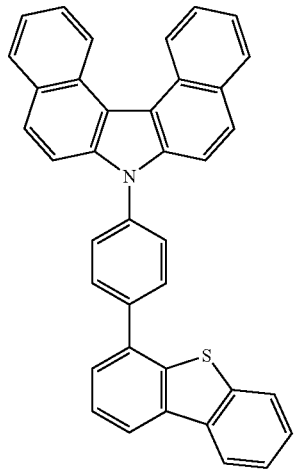
H1-120
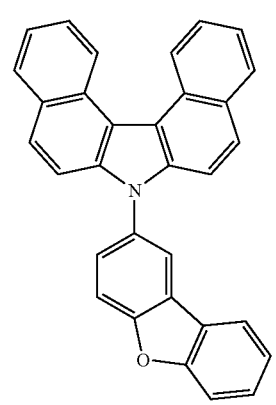
H1-121
H1-122

H1-123
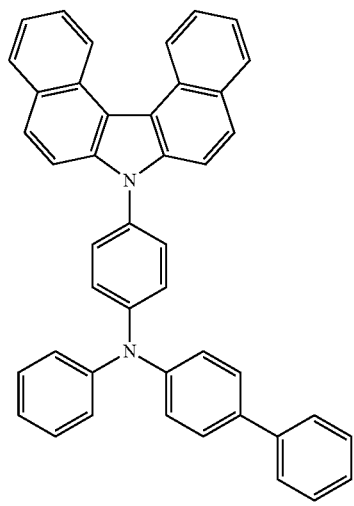
H1-124
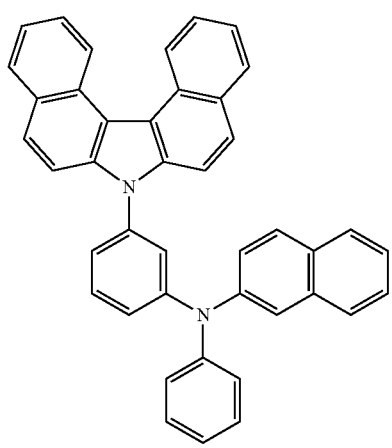
H1-125
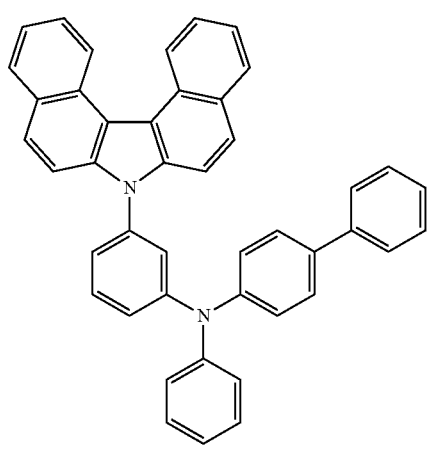
H1-126
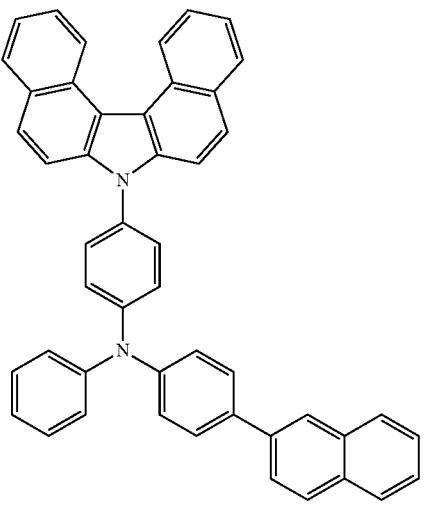
H1-127
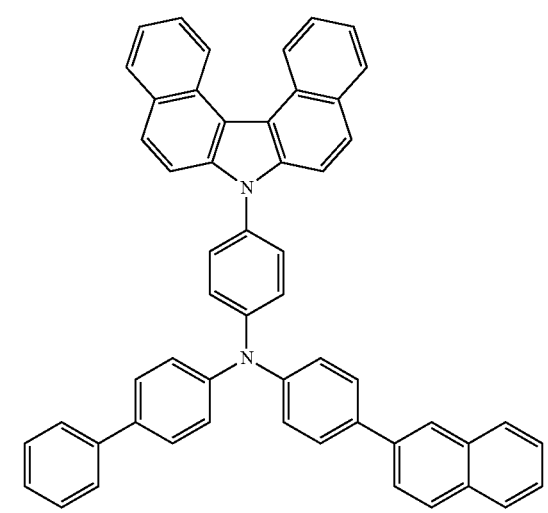
H1-128
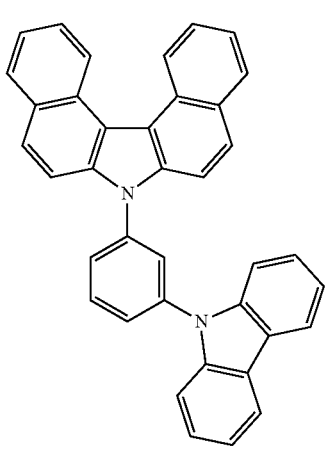

H1-129
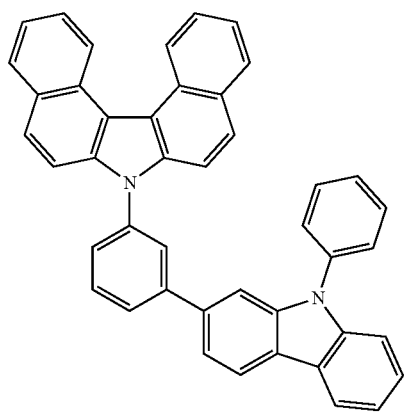
H1-130
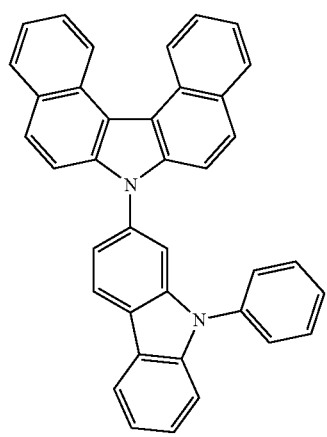
H1-131
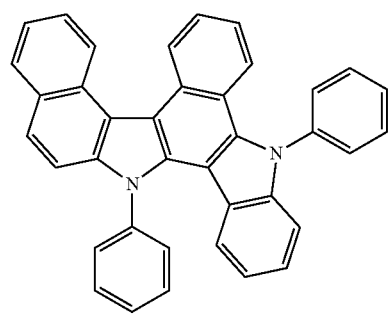
H1-132
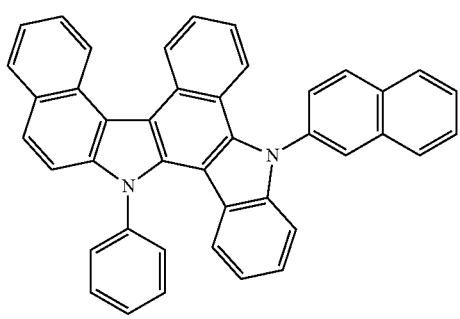
H1-133
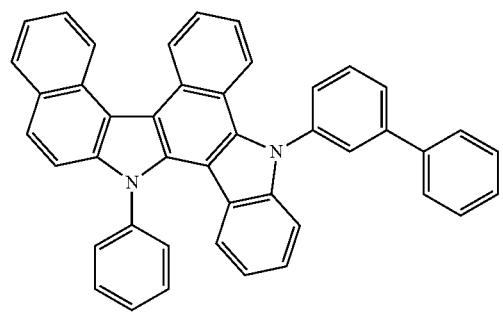
H1-134
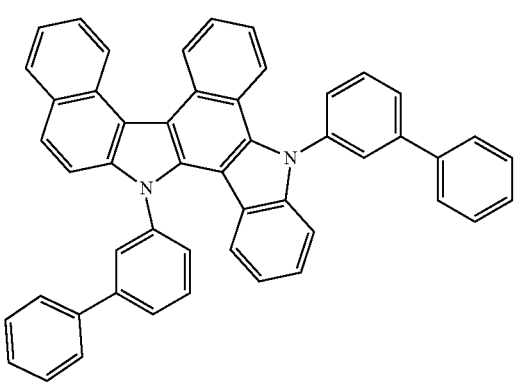
H1-135
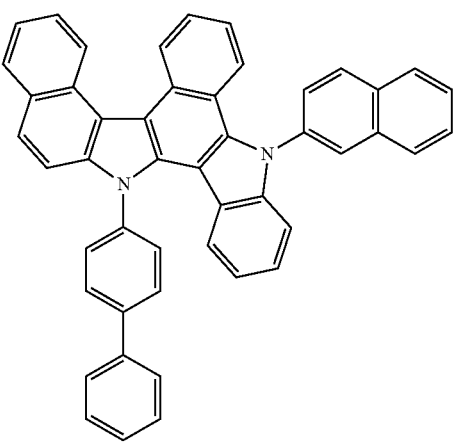
H1-136
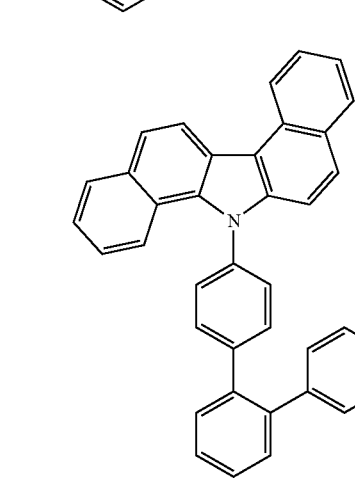

53
-continued
H1-137
H1-138
H1-139
H1-140
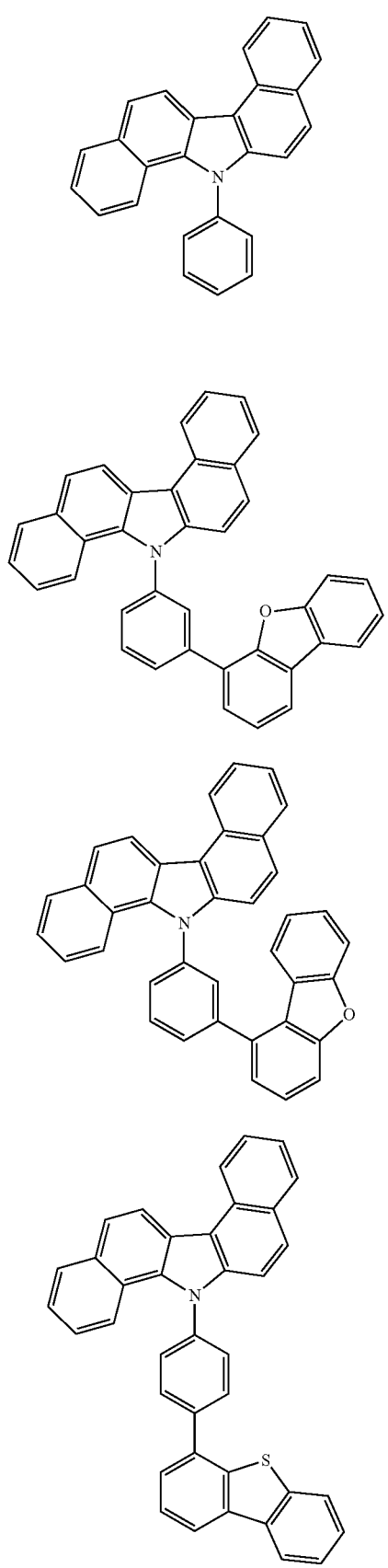
54
-continued
H1-141
H1-142
H1-143
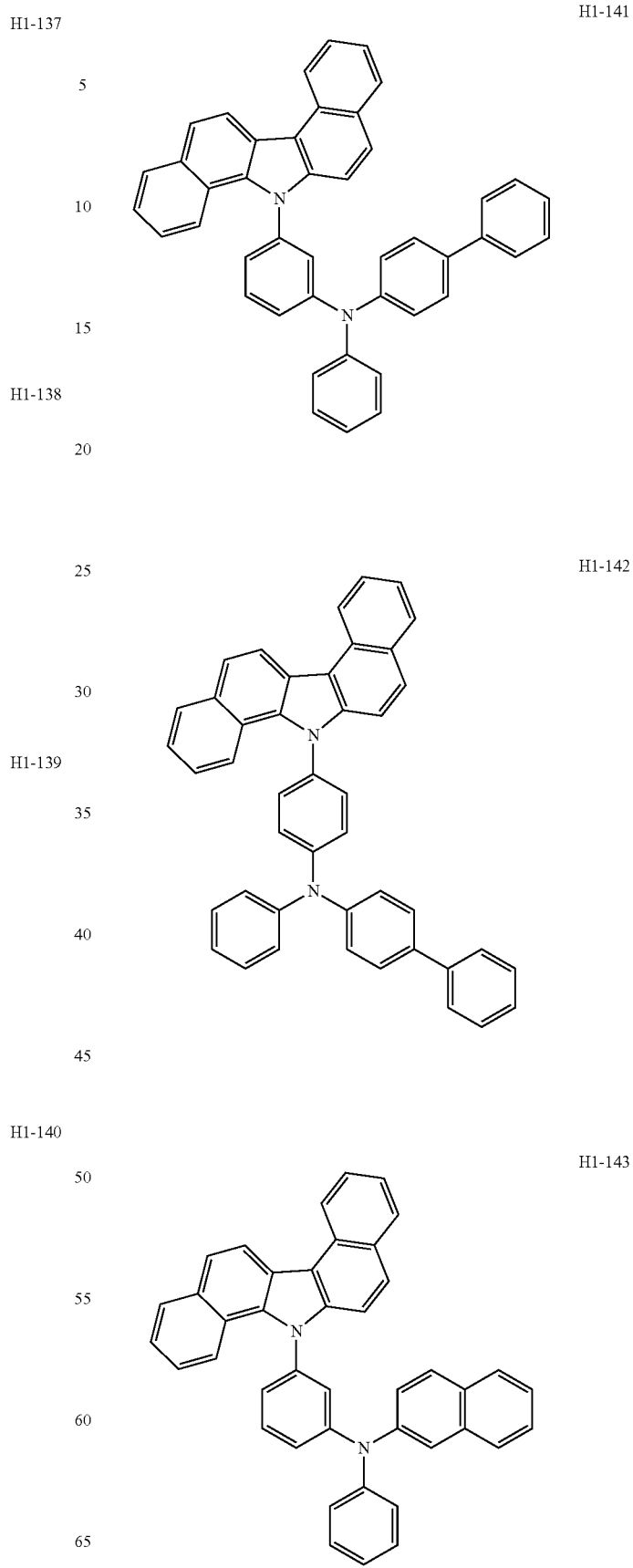

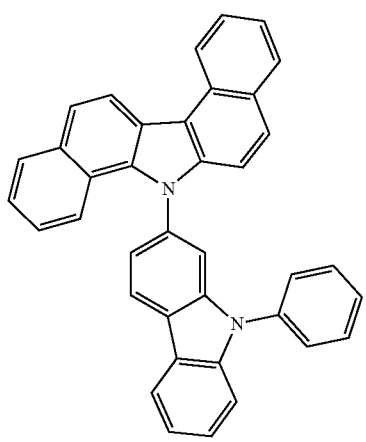
H1-144
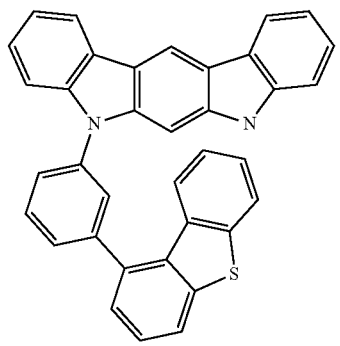
H1-147
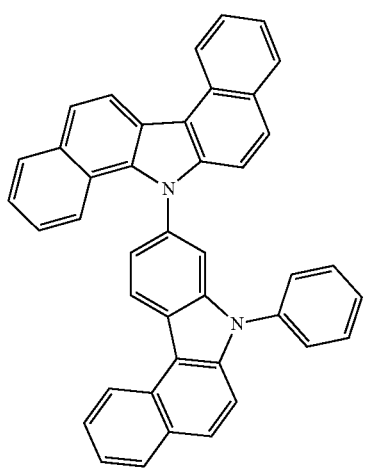
H1-145
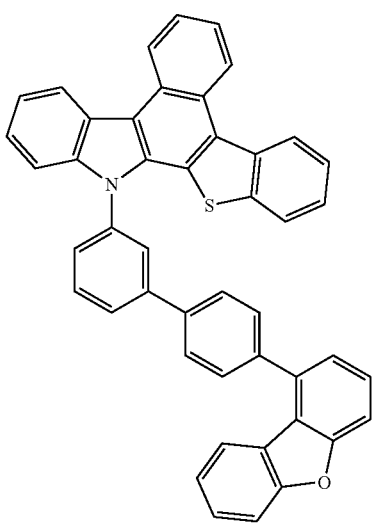
H1-148
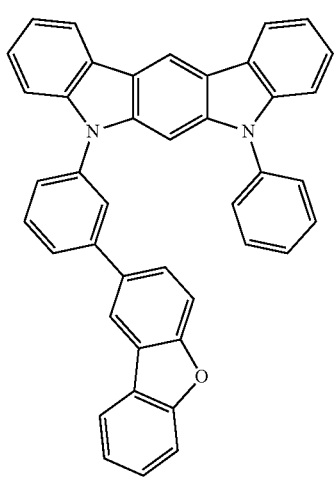
H1-146
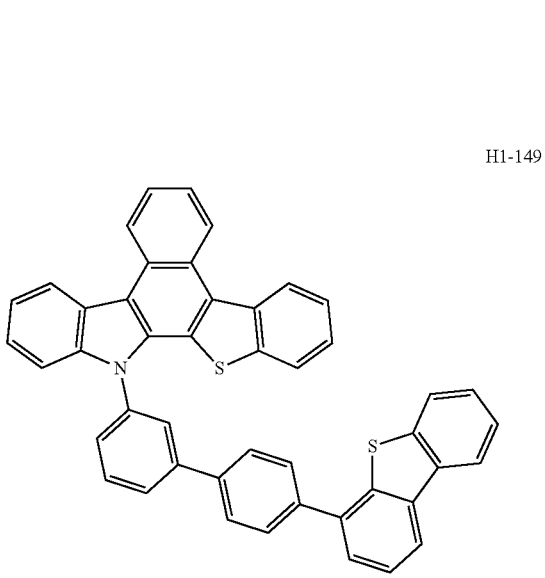
H1-149

H1-150
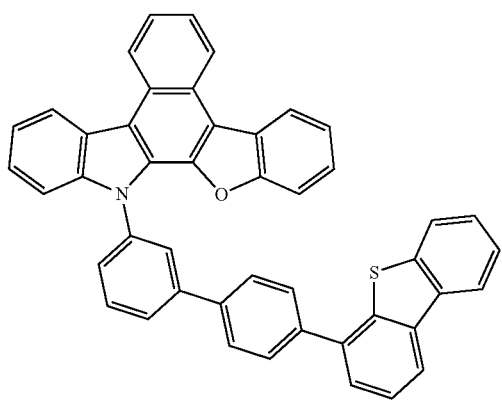
The compound represented by formula 2 may be specifically exemplified by any one of the following compounds, but is not limited thereto.
H2-3
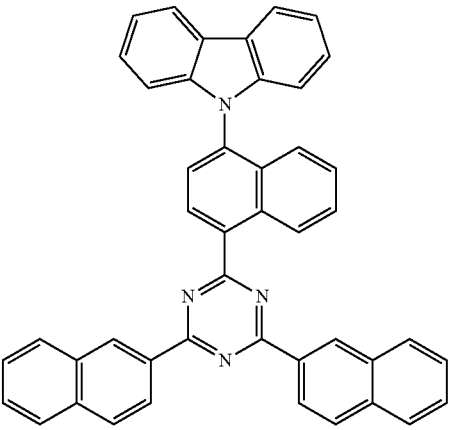
H2-1
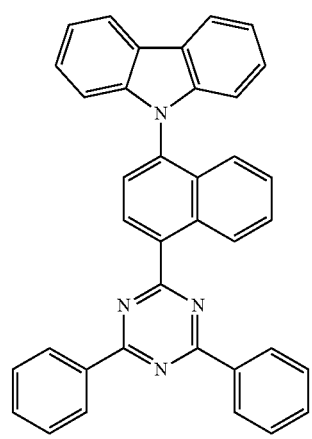
H2-4
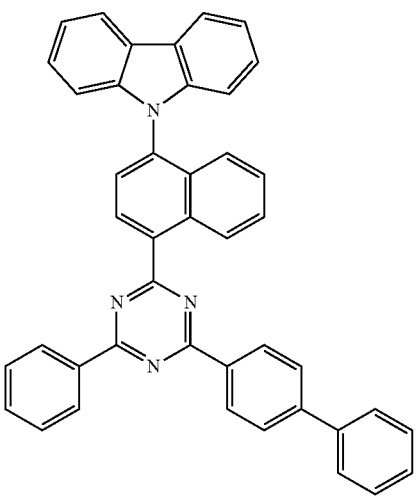
H2-2
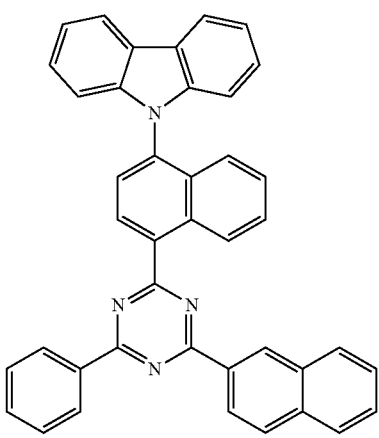
H2-5
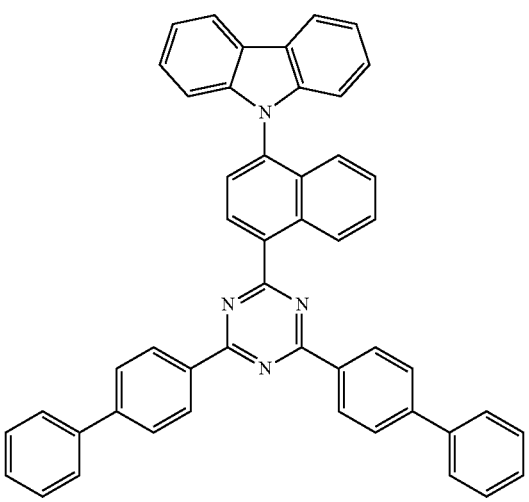

H2-6
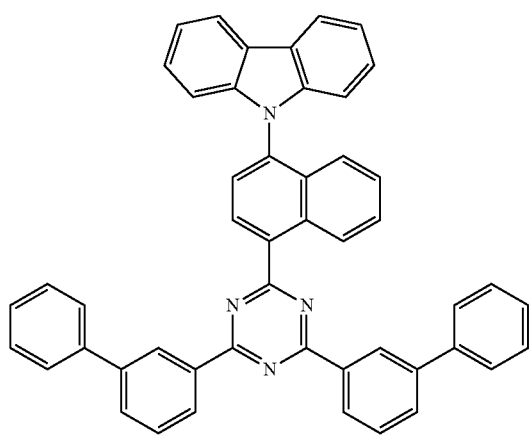
H2-7
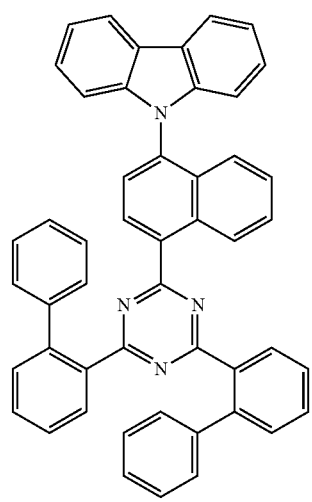
H2-8
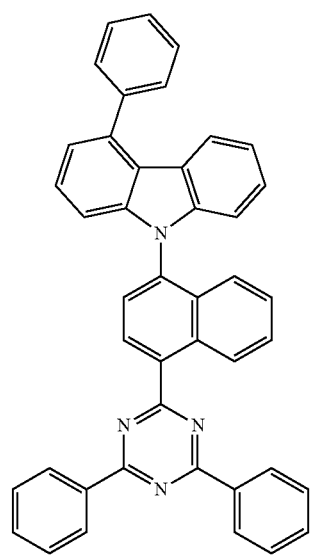
H2-9
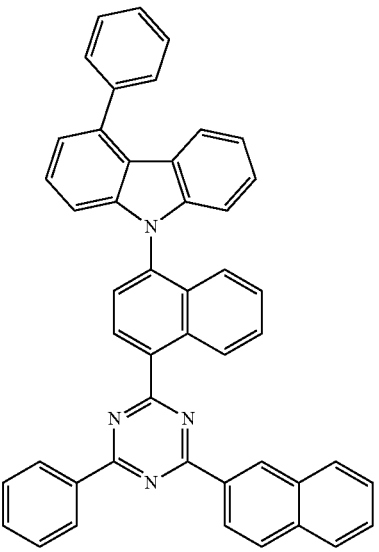
H2-10
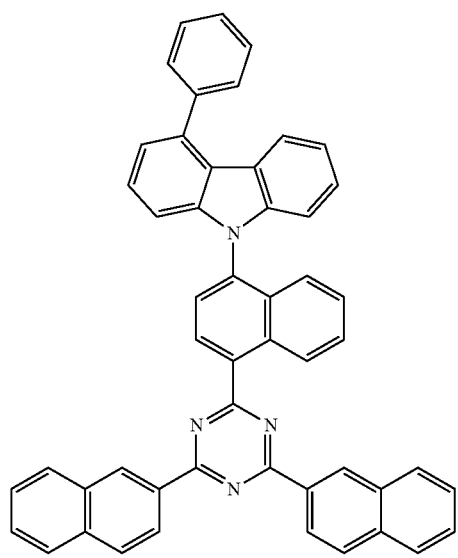
H2-11
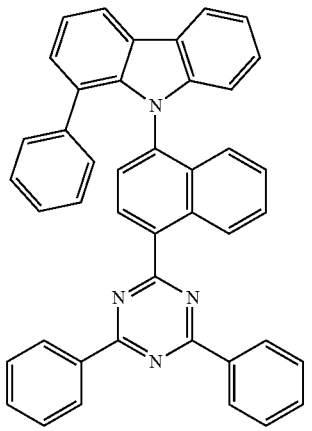

H2-12
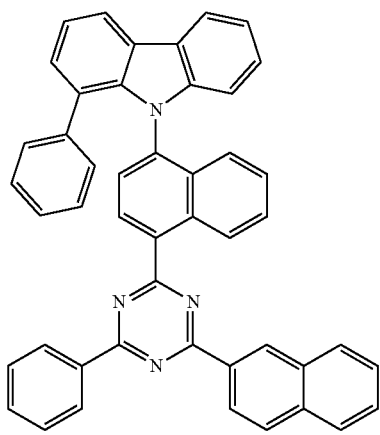
H2-13
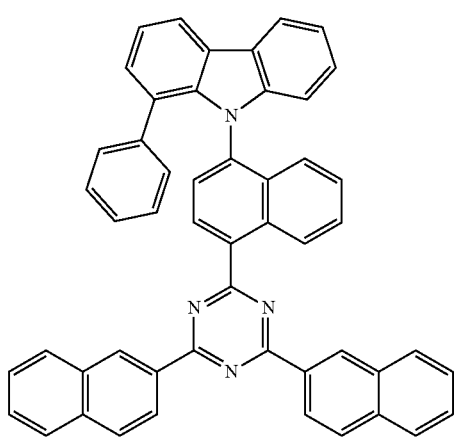
H2-14
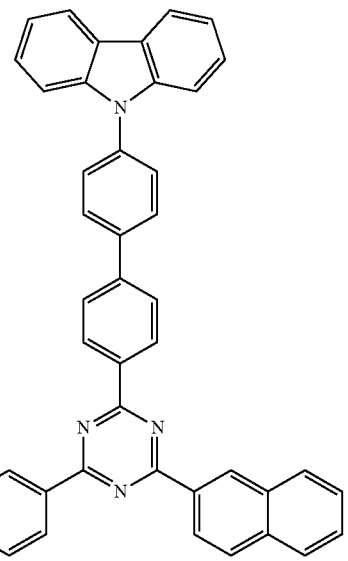
H2-15
H2-16
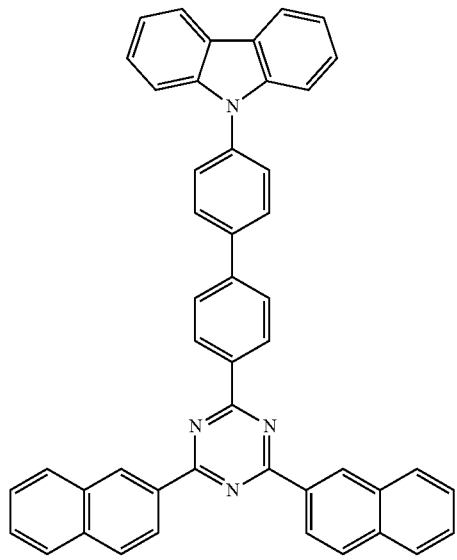

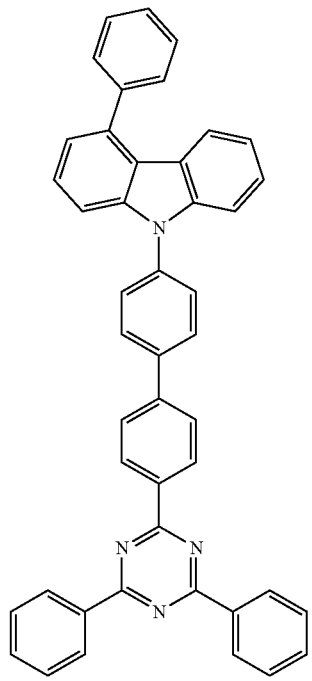 H2-17
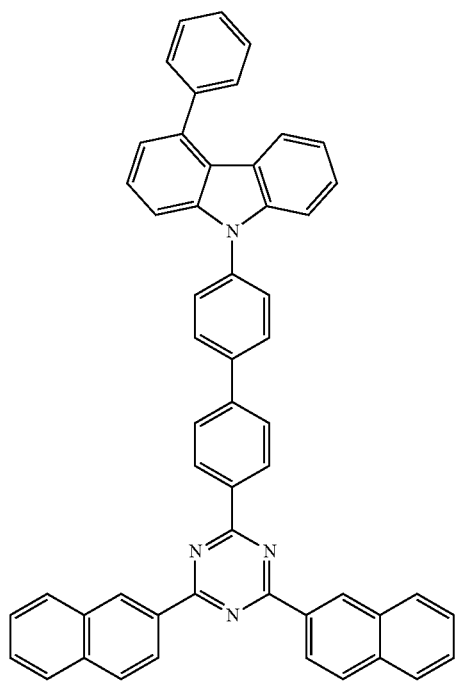 H2-19
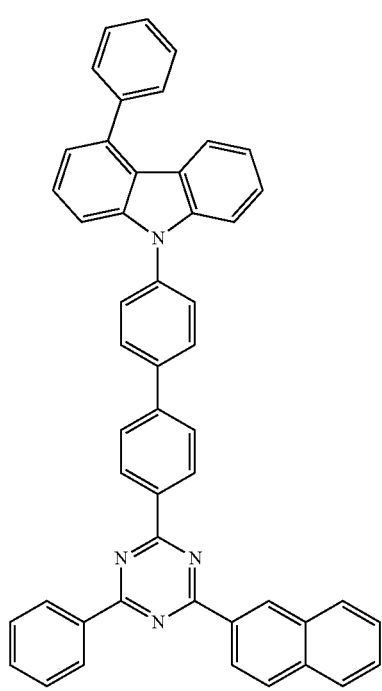 H2-18
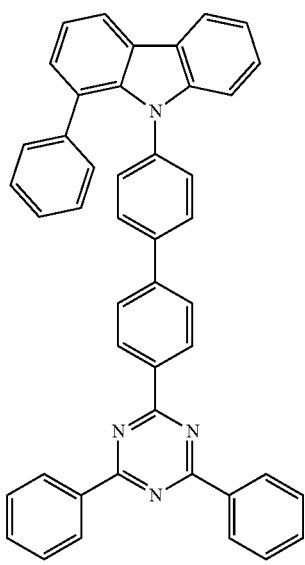 H2-20

H2-21
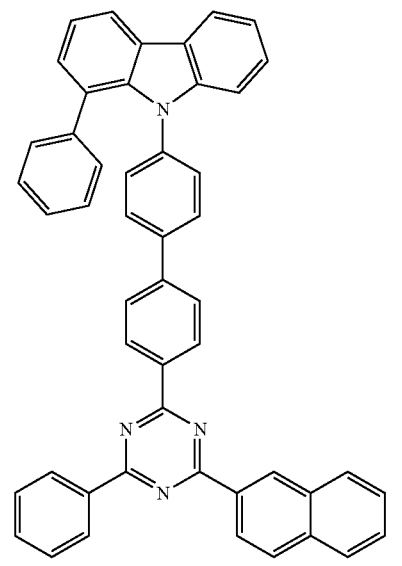
H2-22
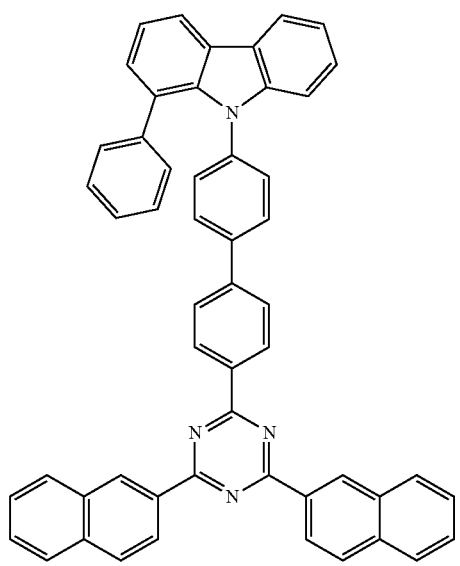
H2-23
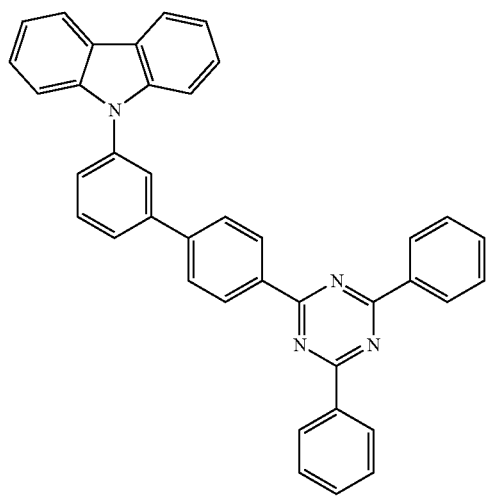
H2-24
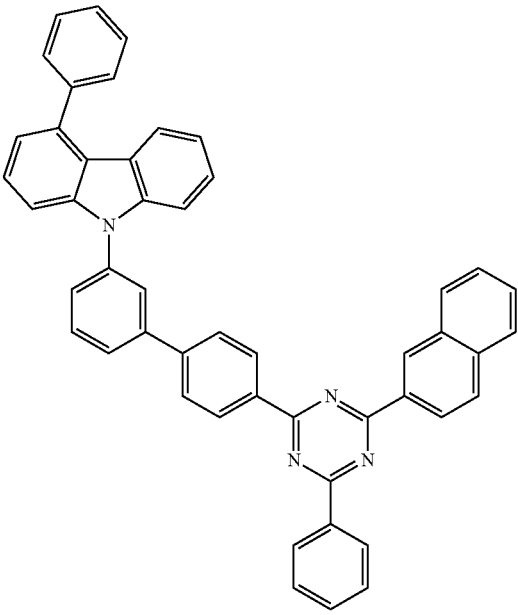
H2-25
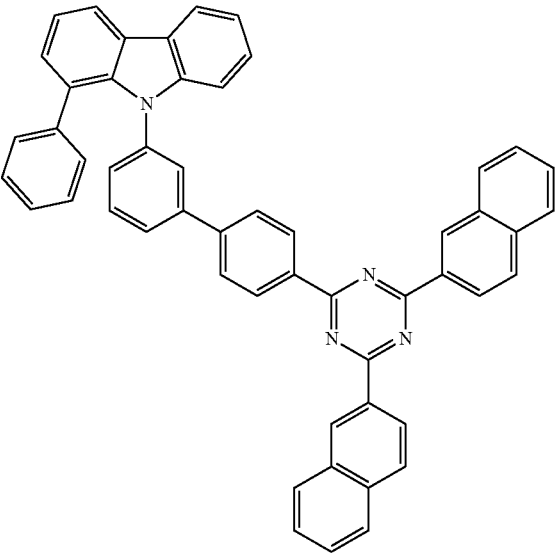

H2-26
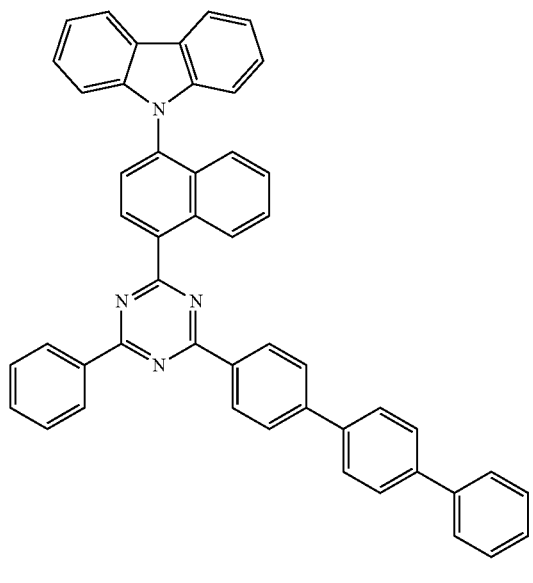
H2-28
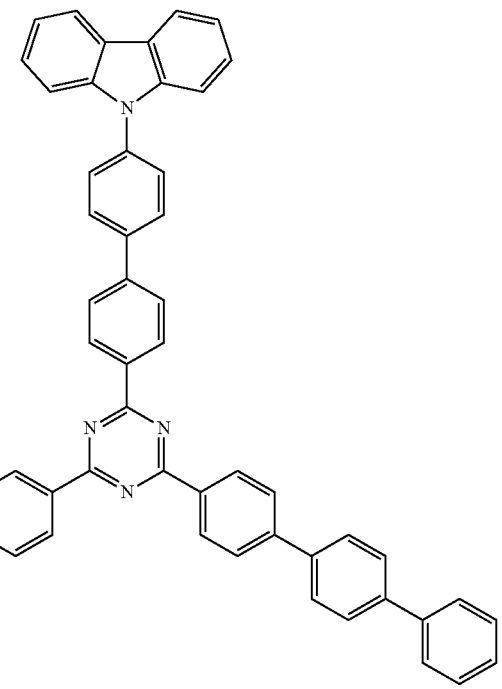
H2-27
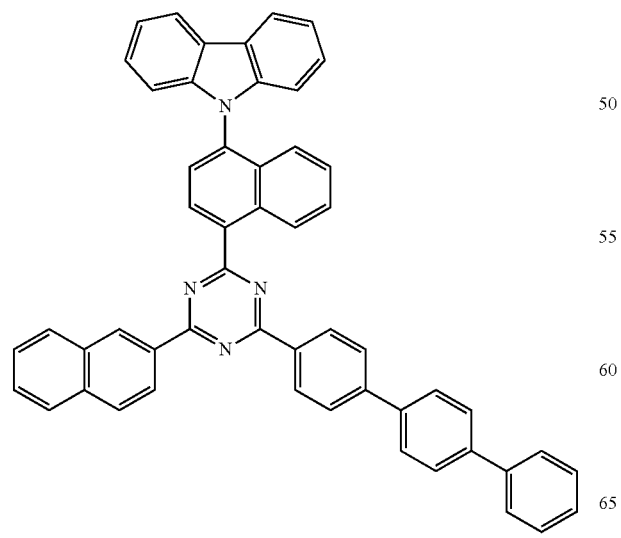
H2-29
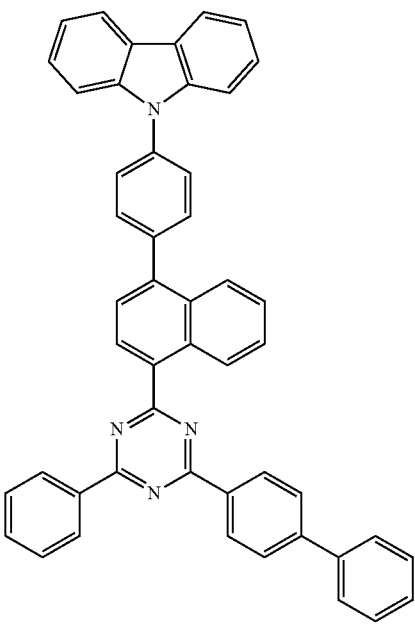

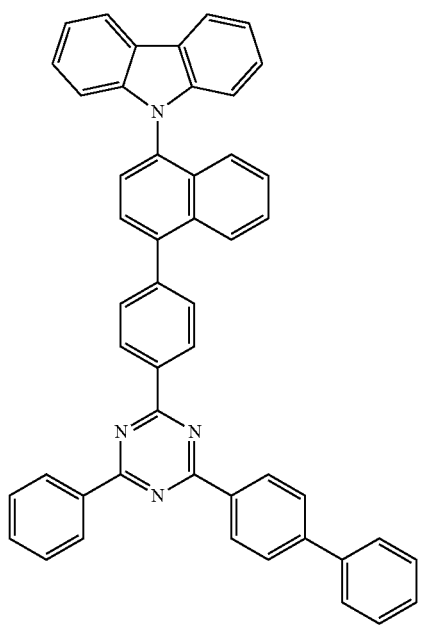
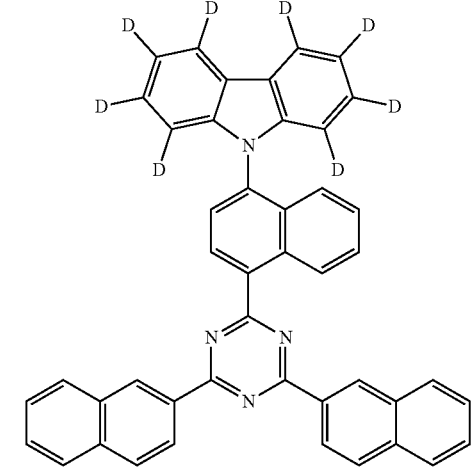
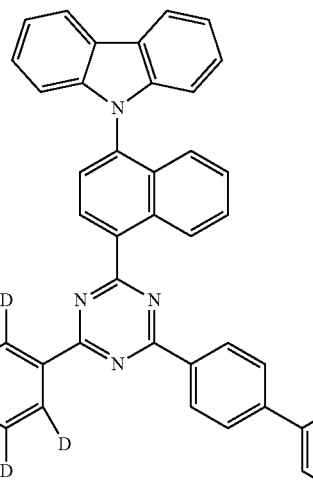
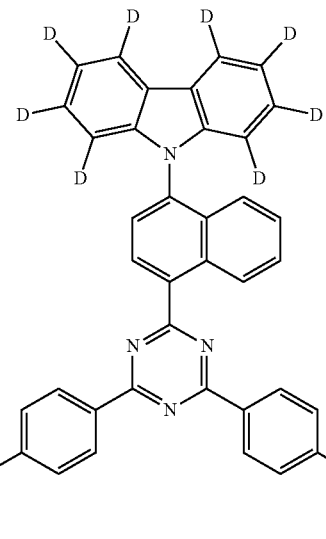

-continued
H2-36
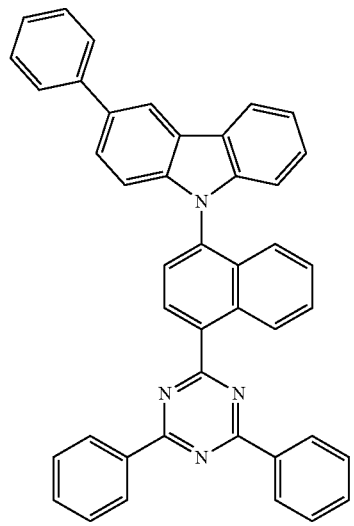
H2-37
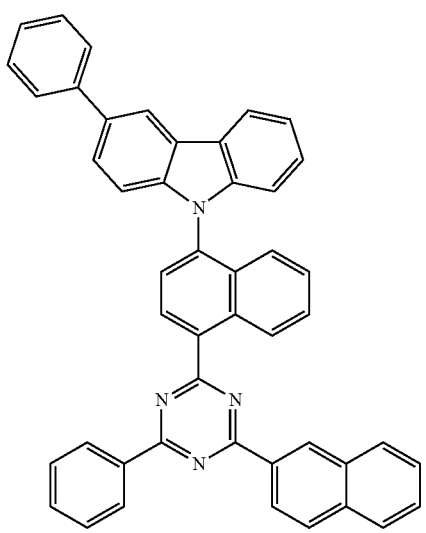
H2-38
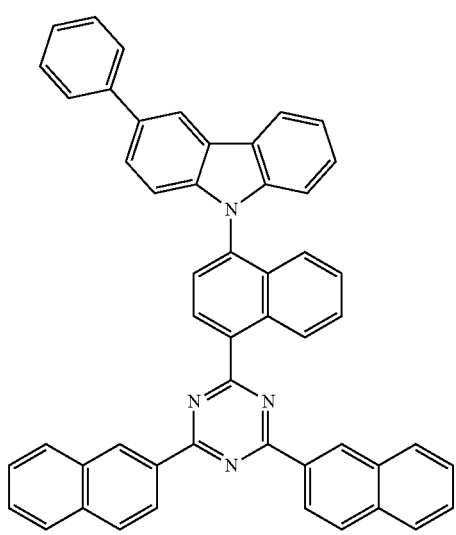
-continued
H2-39
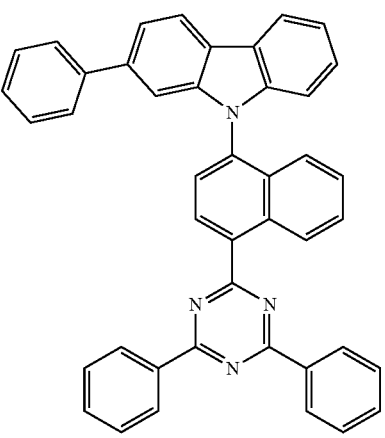
H2-40
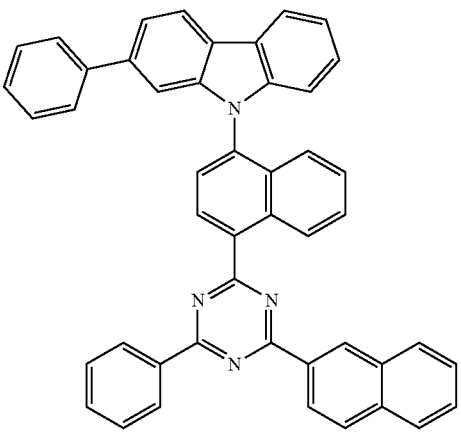
H2-41
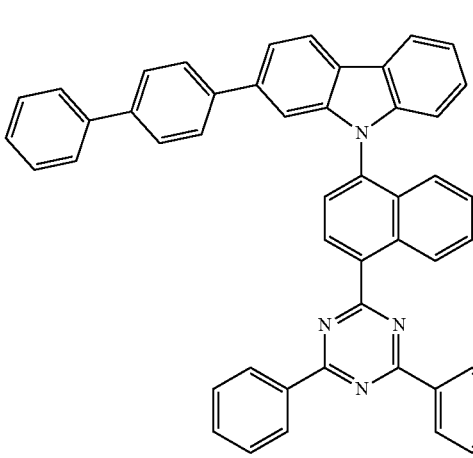

H2-42
H2-43
H2-44
H2-45
H2-46
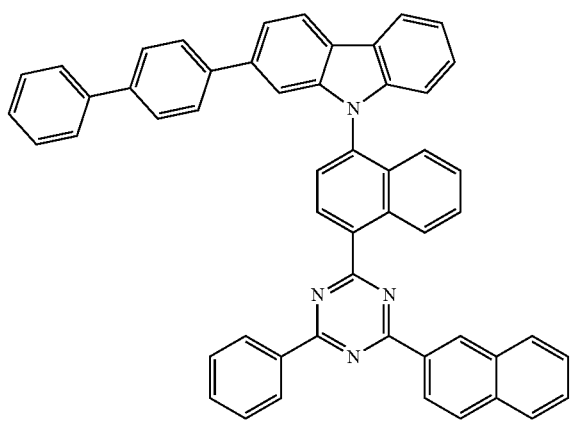
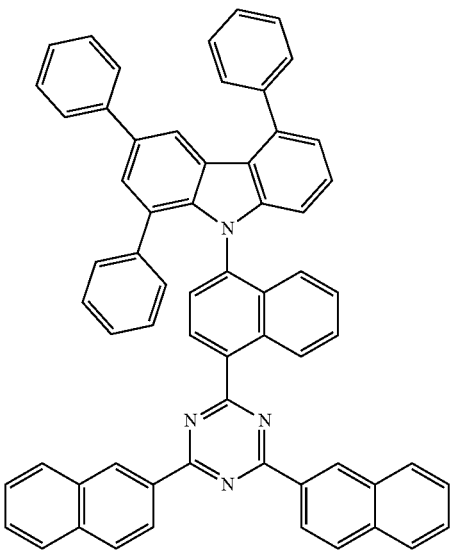
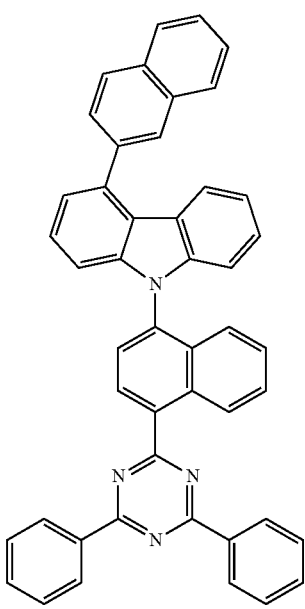

-continued
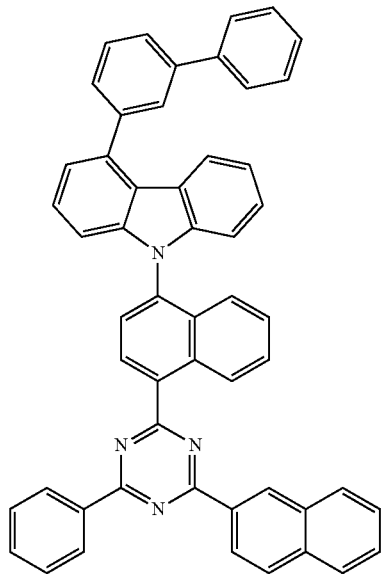
H2-47
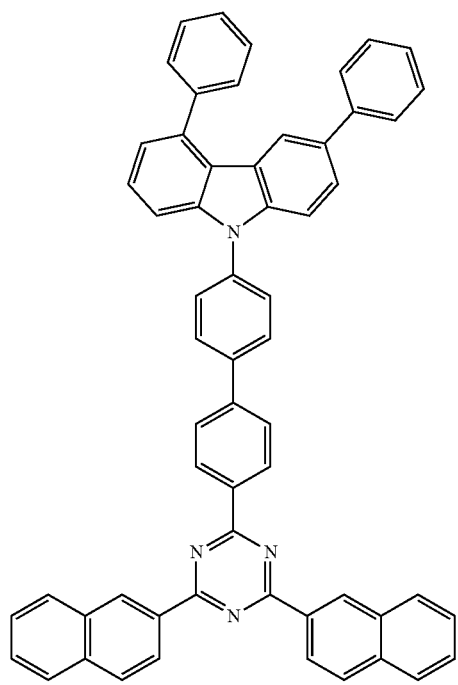
H2-49
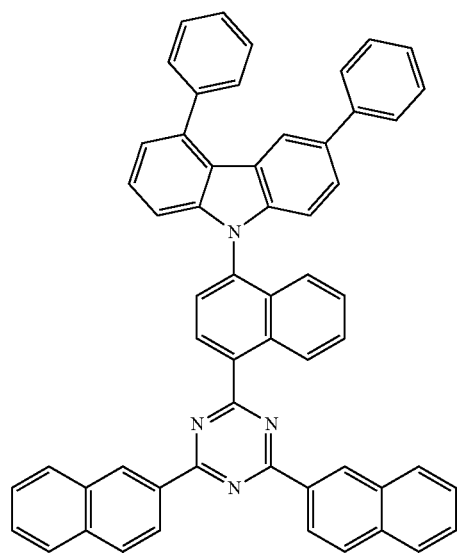
H2-48
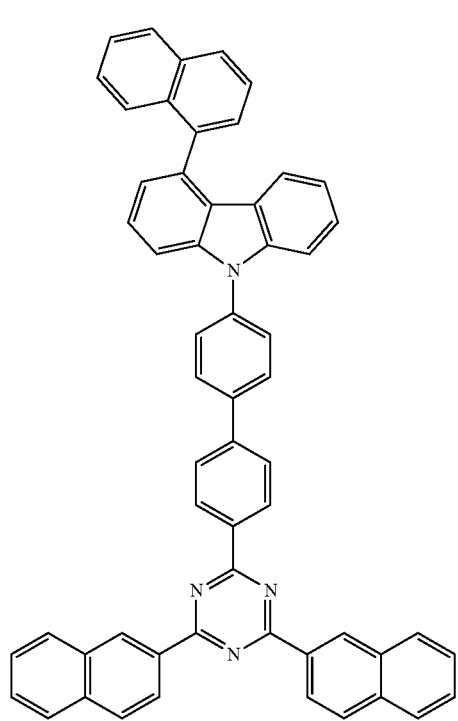
H2-50

H2-51

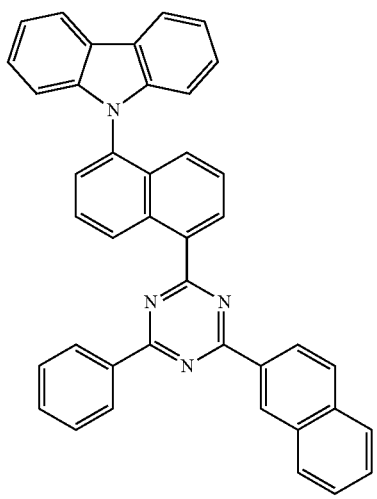

H2-52

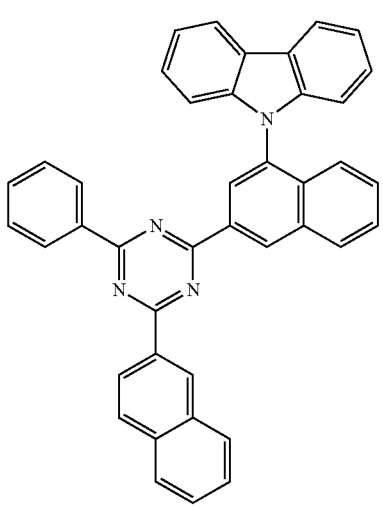

H2-53

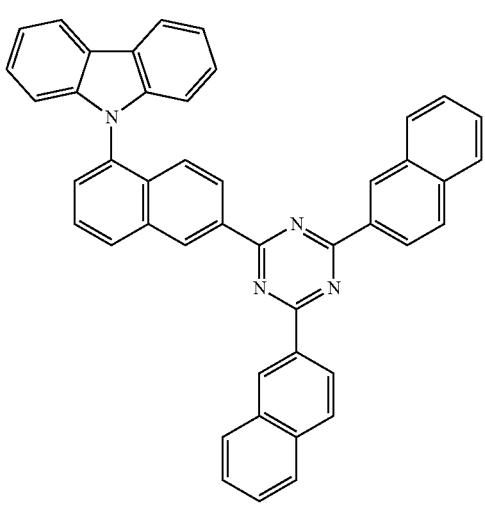

H2-54

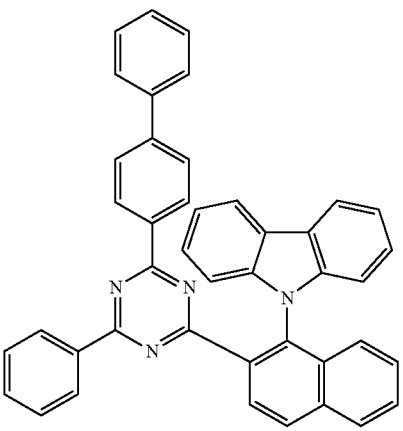

H2-55

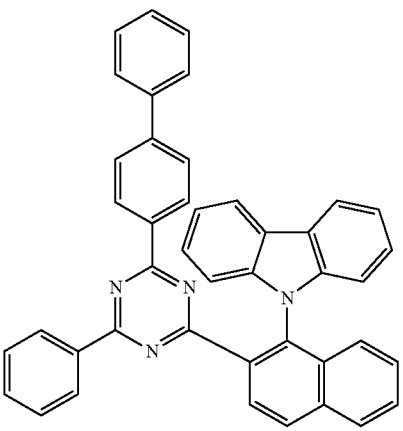

The combination of at least one of compounds H1-1 to H1-150 and at least one of compounds H2-1 to H2-55 may be used in an organic electroluminescent device.

According to one embodiment of the present disclosure, the present disclosure provides an organic electroluminescent compound represented by formula 3. The compound represented by formula 3 may be specifically exemplified by compounds H2-2 to H2-13, H2-15 to H2-22, H2-24 to H2-28, H2-32 to H2-35, H2-43, H2-46, H2-47, and H2-50 to H2-55, but is not limited thereto. In addition, the present disclosure may provide an organic electroluminescent device comprising the organic electroluminescent compound represented by formula 3.

The compound represented by formula 1 according to the present disclosure may be prepared as shown in the following reaction scheme 1 and by a synthetic method known to one skilled in the art. For example, the compound represented by formula 1 can be prepared by referring to Korean Patent Appl. Laid-Open Nos. 2015-0135109 (published on Dec. 2, 2015), 2016-0099471 (published on Aug. 22, 2016), 2015-0077513 (published on Jul. 8, 2015), and 2017-0129599 (published on Nov. 27, 2017), but is not limited thereto.

[Reaction Scheme 1]

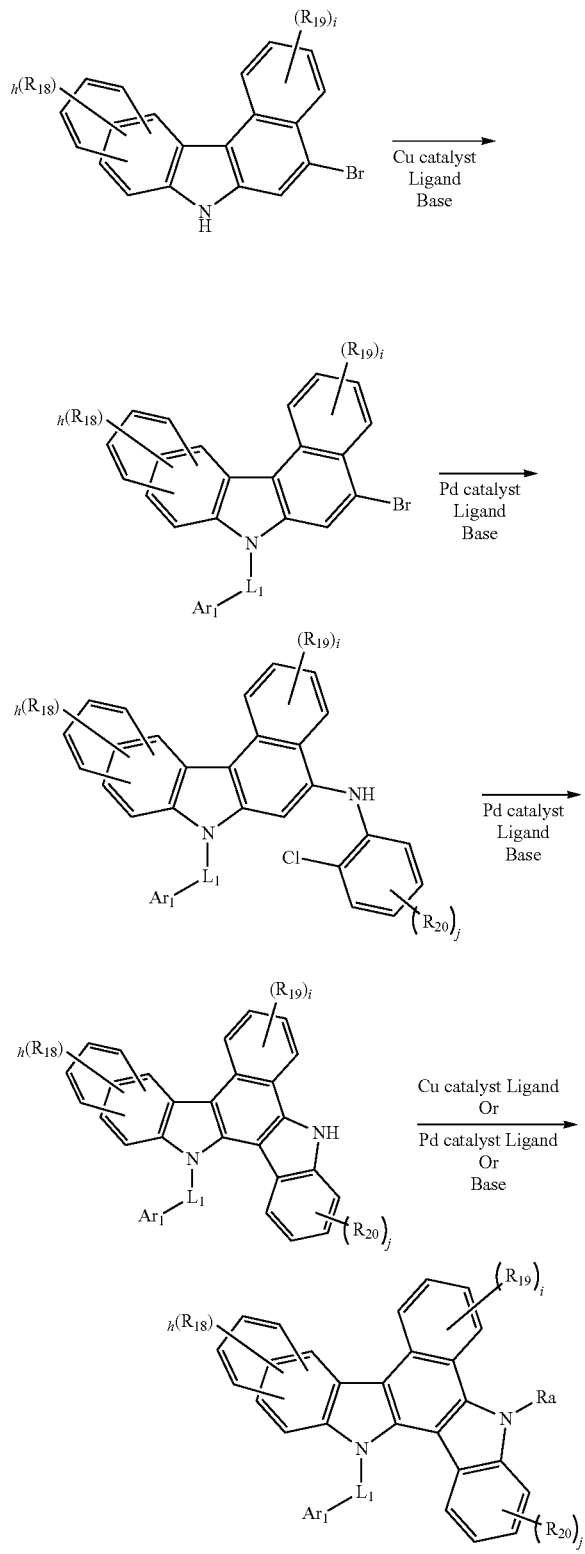

The compound represented by formula 2 or 3 according to the present disclosure may be prepared as shown in the following reaction scheme 2 and by a synthetic method known to one skilled in the art, but are not limited thereto.

[Reaction Scheme 2]

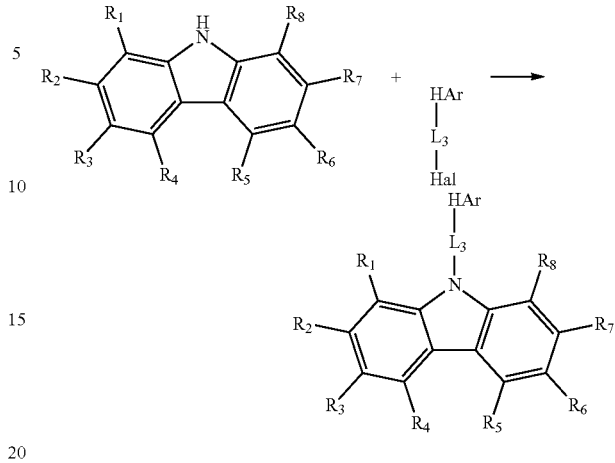

In reaction schemes 1 and 2, $Ar_1$, $L_1$, $Ra$, $R_{18}$ to $R_{20}$, h to j, $R_1$ to $R_8$, $L_3$, and HAr are as defined in formulas 1, 1-4, and 2, Hal represents I, Br, Cl, ONf (nonafluorobutanesulfonyl), or OTf (triflate).

Although illustrative synthesis examples of the compounds represented by formulas 1 to 3 are described above, one skilled in the art will be able to readily understand that all of them are based on a Buchwald-Hartwig cross-coupling reaction, an N-arylation reaction, H-mont-mediated etherification reaction, a Miyaura borylation reaction, a Suzuki cross-coupling reaction, an intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, a Phosphine-mediated reductive cyclization reaction, etc., and the reactions above proceed even when substituents which are defined in formulas 1 to 3 above, but are not specified in the specific synthesis examples, are bonded. For example, the compounds of formulas 1 to 3 containing deuterium may be prepared by treating the non-deuterated compounds with a deuterated solvent or D6-benzene in the presence of an H/D exchange catalyst such as a Lewis acid, e.g., aluminium trichloride or ethyl aluminium chloride, a trifluoromethanesulfonic acid, or a trifluoromethanesulfonic acid-D. In addition, the degree of deuteration can be controlled by adjusting the reaction conditions such as the reaction temperature and time, the equivalent of the acid, etc.

The organic electroluminescent device according to the present disclosure comprises an anode, a cathode, and at least one organic layer between the anode and the cathode. The organic layer may comprise a plurality of organic electroluminescent materials in which the compound represented by formula 1 is comprised as a first organic electroluminescent material, and the compound represented by formula 2 is comprised as a second organic electroluminescent material. According to one embodiment of the present disclosure, the organic electroluminescent device comprises an anode, a cathode, and at least one light-emitting layer between the anode and the cathode, and the light-emitting layer comprises a compound(s) represented by formula 1, and a compound(s) represented by formula 2.

The electrode may be a transflective electrode or a reflective electrode, and may be a top emission type, a bottom emission type, or a both-sides emission type, depending on the materials. The hole injection layer may be further doped with a p-dopant, and the electron injection layer may be further doped with an n-dopant.

The light-emitting layer comprises a host and a dopant. The host comprises a plurality of host materials. The compound represented by formula 1 may be comprised as a first host compound of the plurality of host materials, and the compound represented by formula 2 may be comprised as a second host compound of the plurality of host materials. The weight ratio of the first host compound to the second host compound is in the range of about 1:99 to about 99:1, preferably about 10:90 to about 90:10, more preferably about 30:70 to about 70:30, even more preferably about 40:60 to about 60:40, and still more preferably about 50:50. When two or more materials are included in one layer, they may be mixture-evaporated to form a layer, or may be separately co-evaporated at the same time to form a layer.

The light-emitting layer is a layer from which light is emitted, and can be a single layer or a multi-layer in which two or more layers are stacked. In the plurality of host materials according to the present disclosure, the first and second host materials may both be comprised in one layer, or may be respectively comprised in different light-emitting layers. According to one embodiment of the present disclosure, the doping concentration of the dopant compound with respect to the host compound in the light-emitting layer is less than about 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device may further comprise amine-based compounds in addition to the plurality of host materials of the present disclosure as at least one of a hole injection material, a hole transport material, a hole auxiliary material, a light-emitting material, a light-emitting auxiliary material, and an electron blocking material. Also, according to one embodiment of the present disclosure, the organic electroluminescent device of the present disclosure may further comprise azine-based compounds in addition to the plurality of host materials of the present disclosure as at least one of an electron transport material, an electron injection material, an electron buffer material, and a hole blocking material.

The dopant comprised in the organic electroluminescent device according to the present disclosure may be at least one phosphorescent or fluorescent dopant, preferably at least one phosphorescent dopant. The phosphorescent dopant materials applied to the organic electroluminescent device according to the present disclosure are not particularly limited, but may be selected from metallated complex compounds of iridium (Ir), osmium (Os), copper (Cu), and platinum (Pt), may be preferably selected from ortho-metallated complex compounds of iridium (Ir), osmium (Os), copper (Cu), and platinum (Pt), and may be more preferably an ortho-metallated iridium complex compound.

The dopant comprised in the organic electroluminescent device of the present disclosure may include the compound represented by the following formula 101, but is not limited thereto.

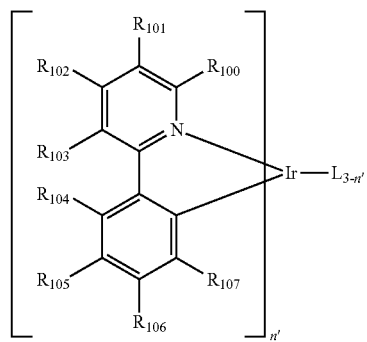

(101)

In formula 101, L is selected from the following structures 1 and 2:

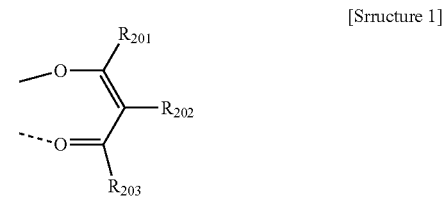

[Structure 1]

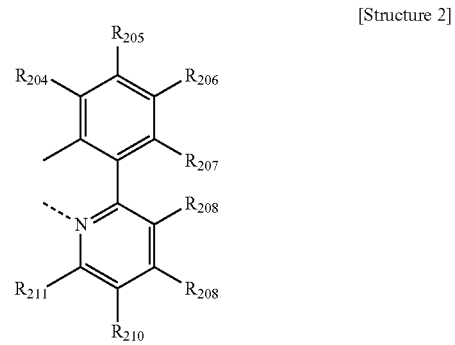

[Structure 2]

$R_{100}$ to $R_{103}$, each independently, represent hydrogen, deuterium, a halogen, a (C1-C30)alkyl unsubstituted or substituted with deuterium(s) and/or a halogen(s), a substituted or unsubstituted (C3-C30) cycloalkyl, a substituted or unsubstituted (C6-C30) aryl, a cyano, a substituted or unsubstituted (3- to 30-membered) heteroaryl, or a substituted or unsubstituted (C1-C30)alkoxy; or may be linked to an adjacent one(s) of $R_{100}$ to $R_{103}$ to form a ring(s), e.g., a substituted or unsubstituted, quinoline, benzofuropyridine, benzothienopyridine, indenopyridine, benzofuroquinoline, benzothienoquinoline, or indenoquinoline ring, together with pyridine;

$R_{104}$ to $R_{107}$, each independently, represent hydrogen, deuterium, a halogen, a (C1-C30)alkyl unsubstituted or substituted with deuterium(s) and/or a halogen(s), a substituted or unsubstituted (C3-C30) cycloalkyl, a substituted or unsubstituted (C6-C30) aryl, a substituted or unsubstituted (3- to 30-membered) heteroaryl, a cyano, or a substituted or unsubstituted (C1-C30)alkoxy; or may be linked to an adjacent one(s) of $R_{104}$ to $R_{107}$ to form a ring, e.g., a substituted or unsubstituted, naphthalene, fluorene, dibenzothiophene, dibenzofuran, indenopyridine, benzofuropyridine or benzothienopyridine ring, together with benzene;

$R_{201}$ to $R_{211}$, each independently, represent hydrogen, deuterium, a halogen, a (C1-C30)alkyl unsubstituted or substituted with deuterium(s) and/or a halogen(s), a substituted or unsubstituted (C3-C30) cycloalkyl, or a substituted or unsubstituted (C6-C30) aryl; or may be linked to an adjacent one(s) of $R_{201}$ to $R_{211}$ to form a ring; and
n' represents an integer of 1 to 3.
The specific examples of the dopant compound are as follows, but are not limited thereto.
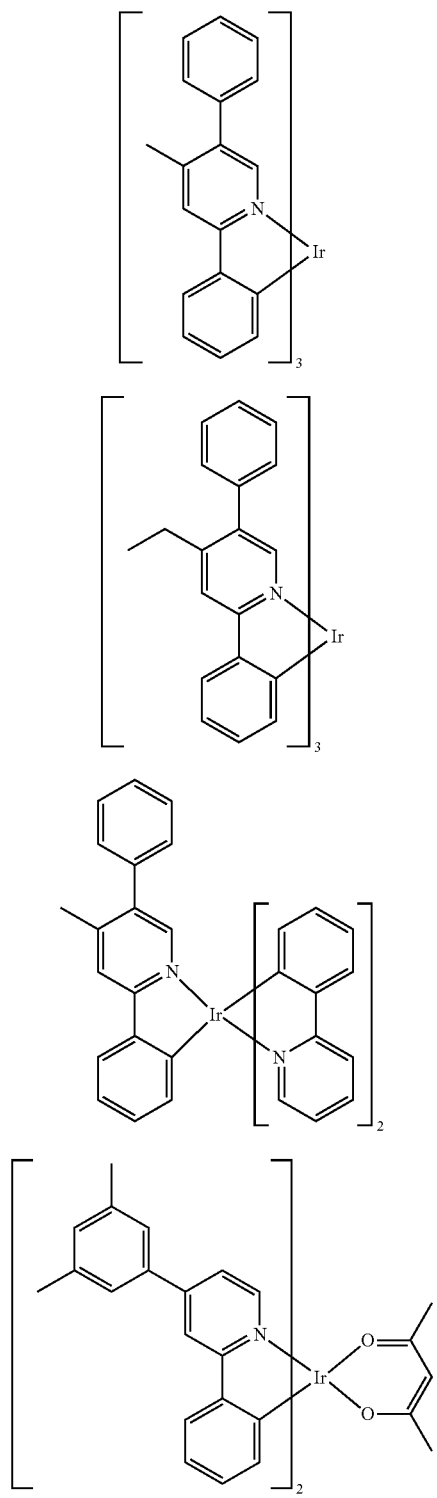
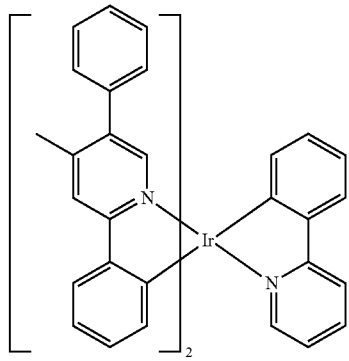
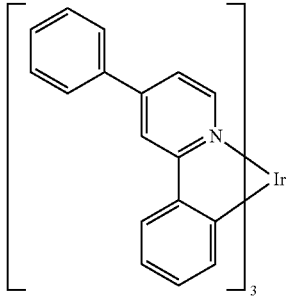
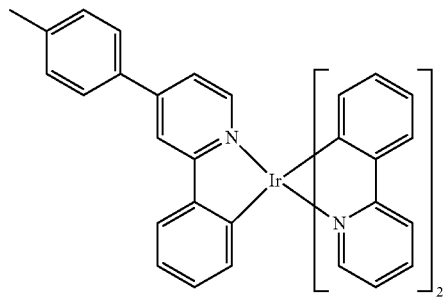
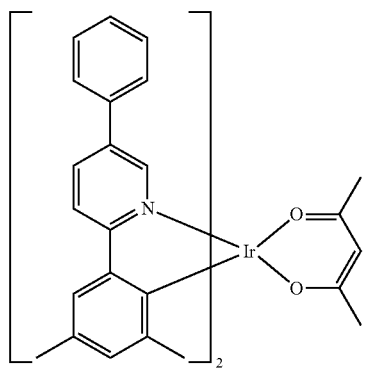

D-9
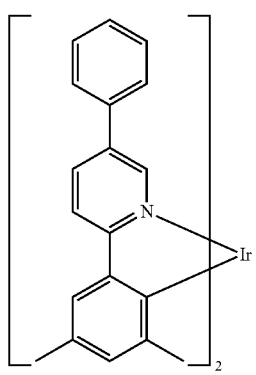
D-10
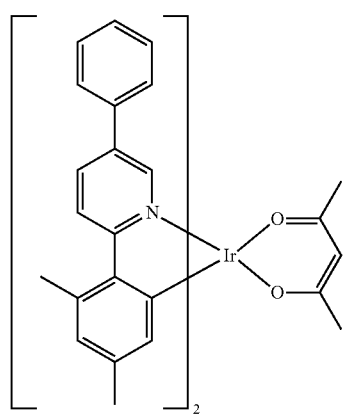
D-11
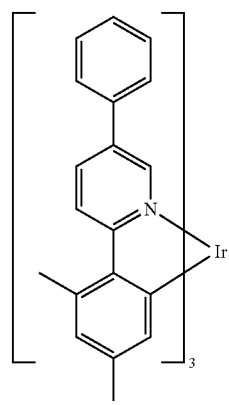
D1-12
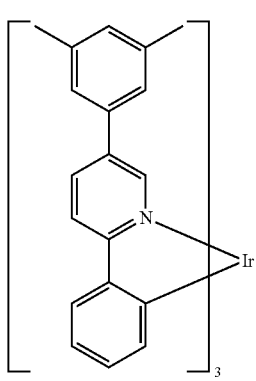
D-13
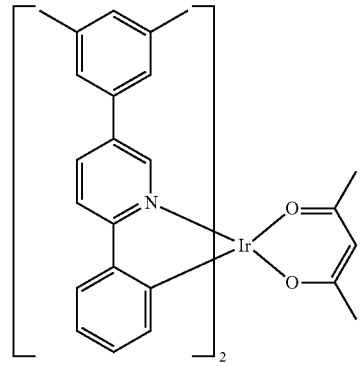
D-14
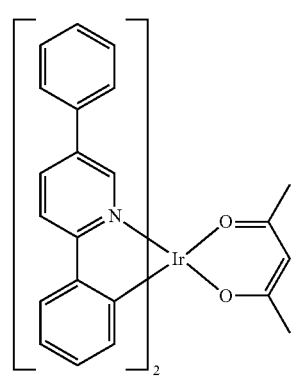
D-15
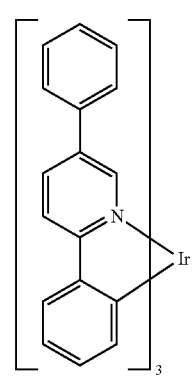
D-16
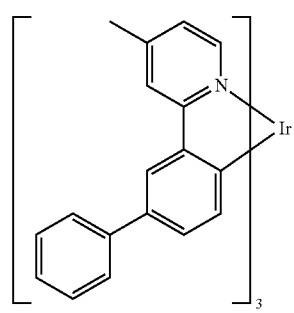

D-17 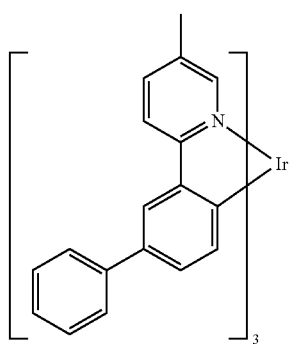
D-21 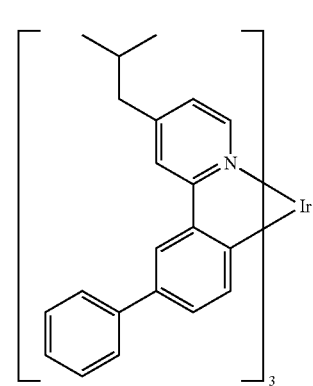
D-18 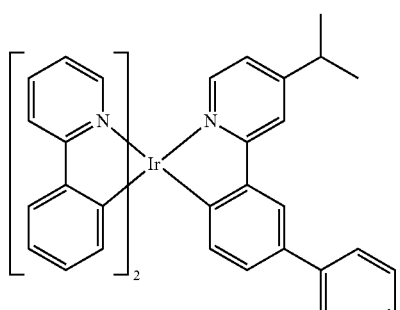
D-22 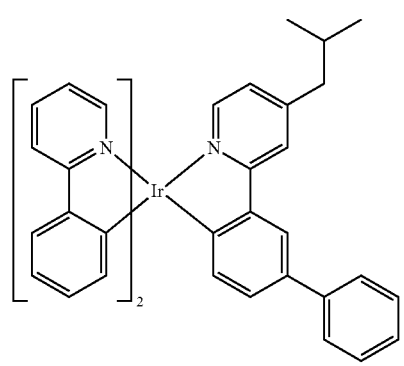
D-19 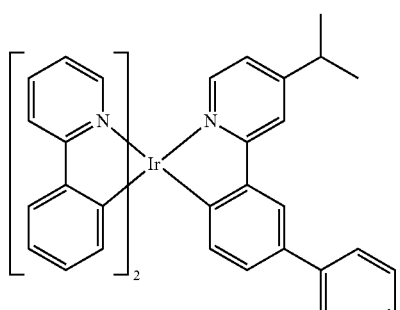
D-23 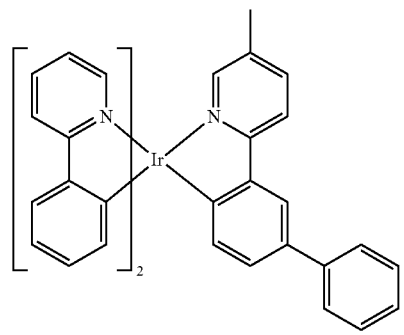
D-20 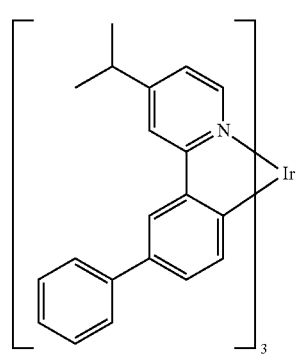
D-24 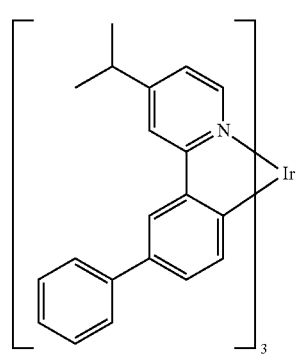

D-25
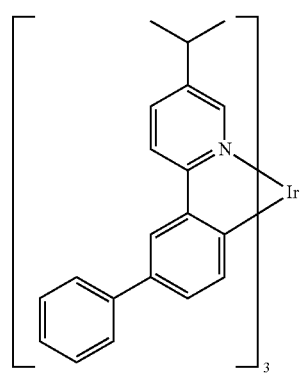
D-26
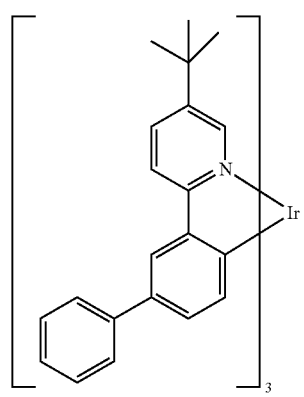
D-27
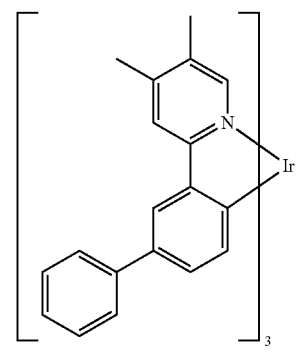
D-28
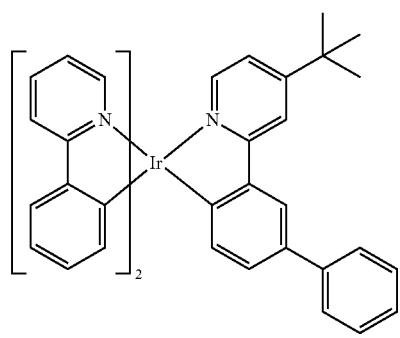
D-29
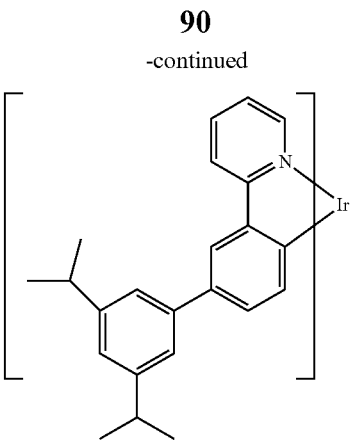
D-30
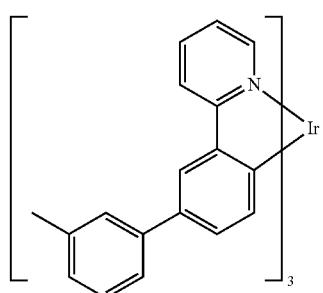
D-31
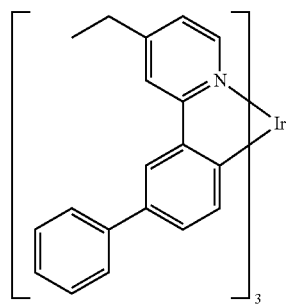
D-32
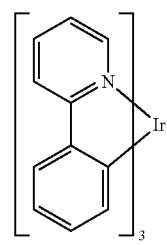
D-33
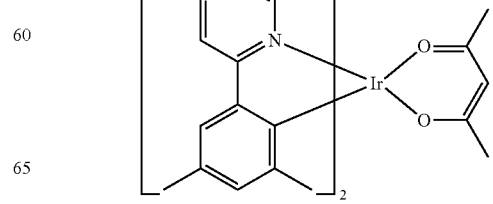

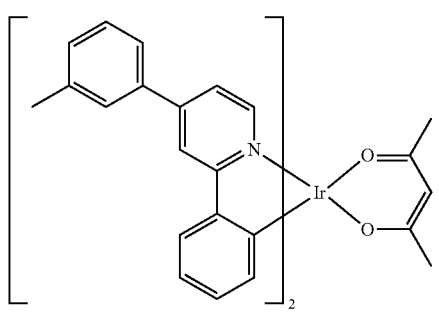
D-34
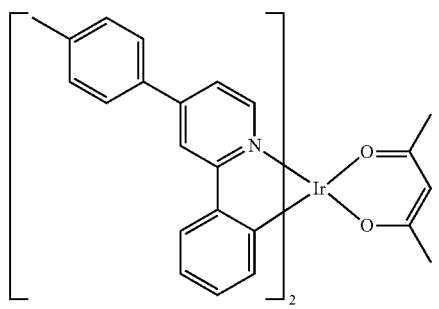
D-35
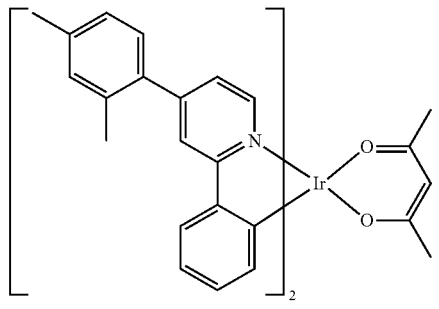
D-36
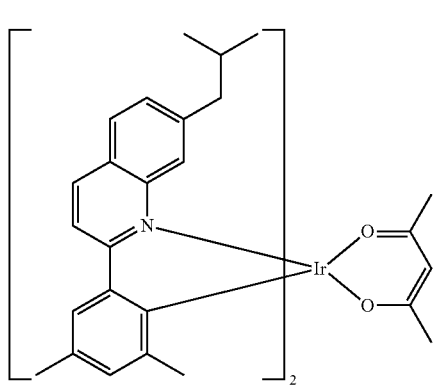
D-37
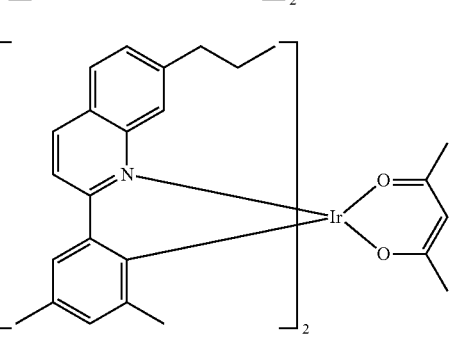
D-38
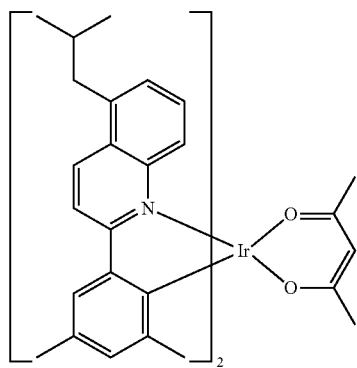
D-39
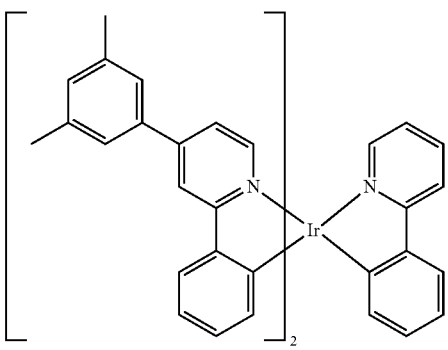
D-40
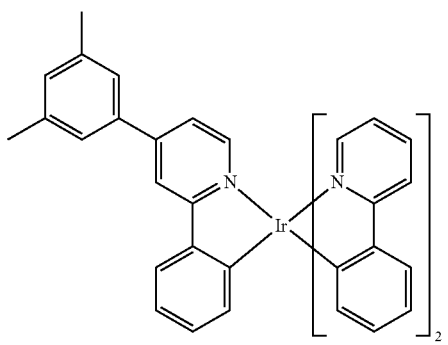
D-41
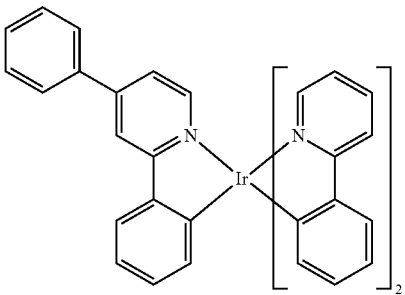
D-42

D-43
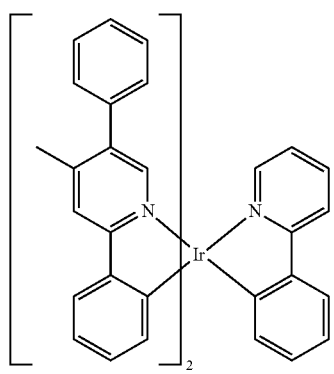
D-44
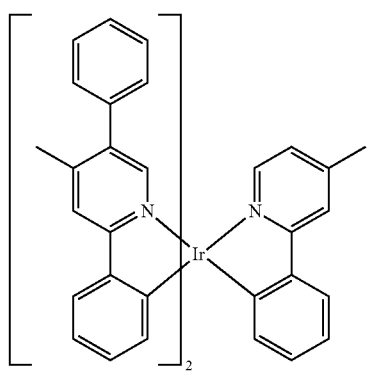
D-45
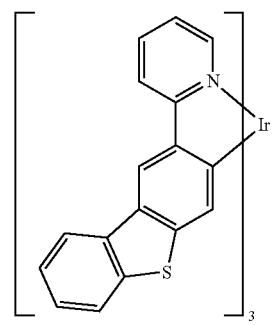
D-46
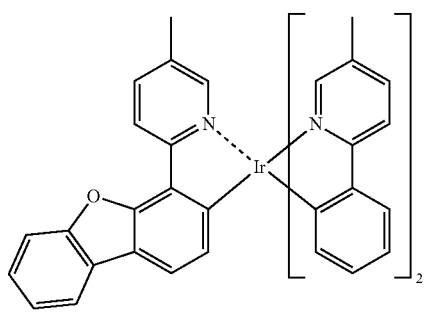
D-47
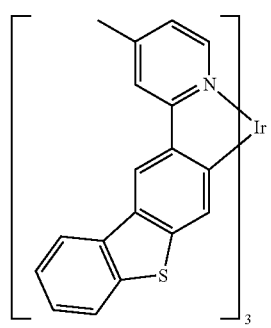
D-48
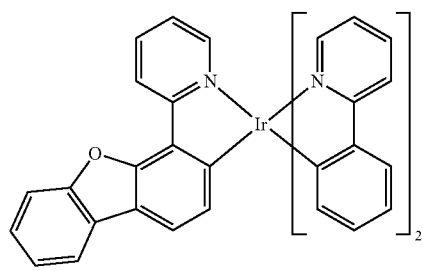
D-49
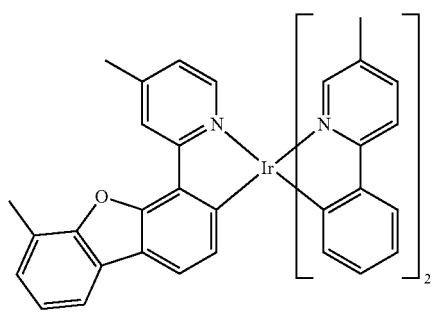
D-50
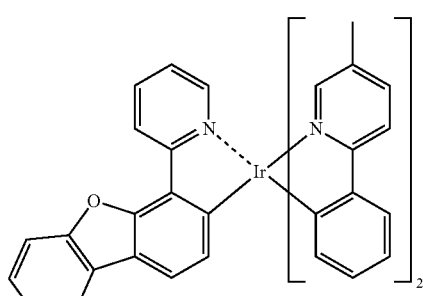
D-51
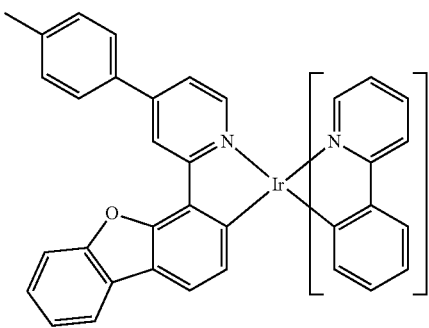

-continued
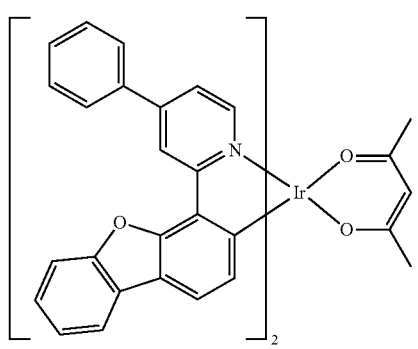
D-52
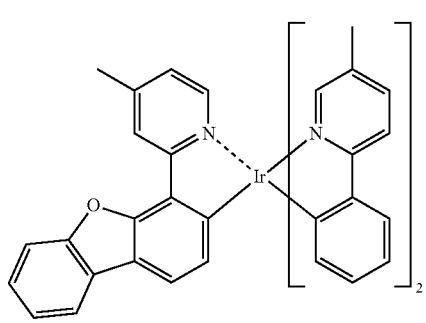
D-53
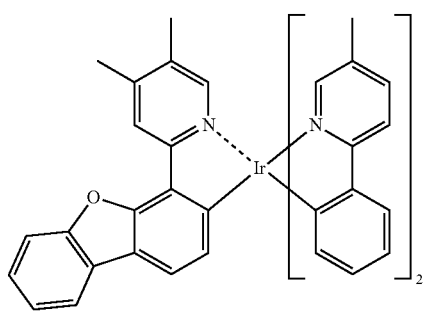
D-54
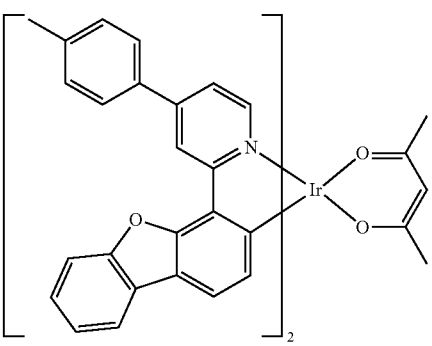
D-55
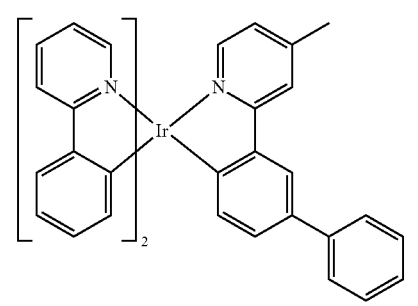
D-56
-continued
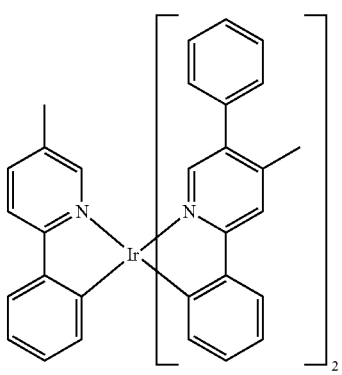
D-57
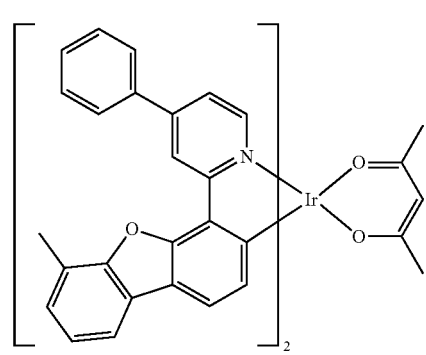
D-58
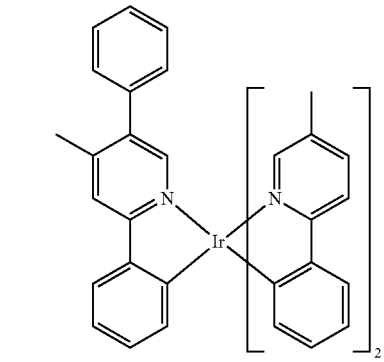
D-59
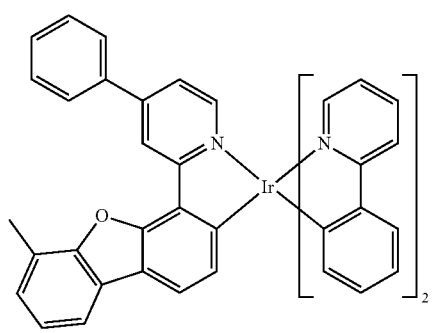
D-60

D-61
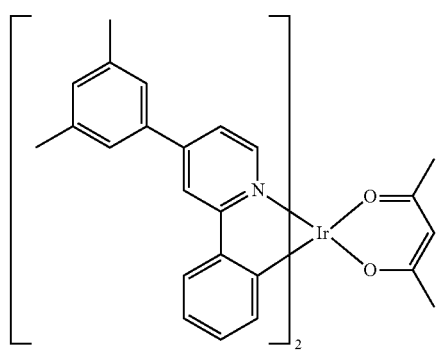
D-65
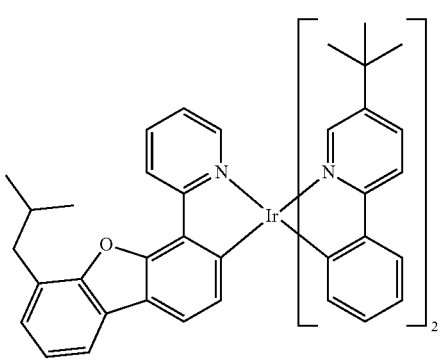
D-62
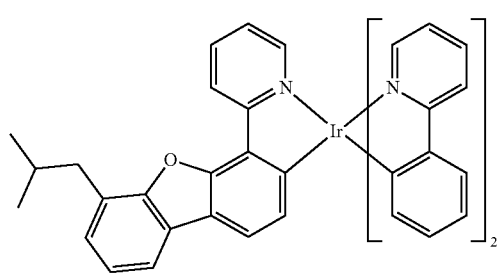
D-66
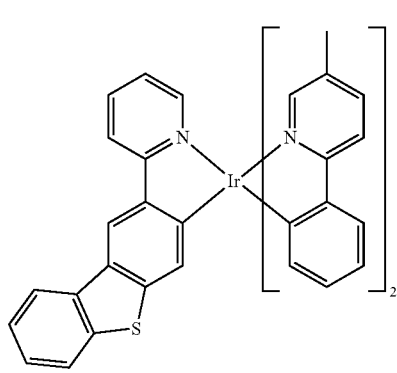
D-63
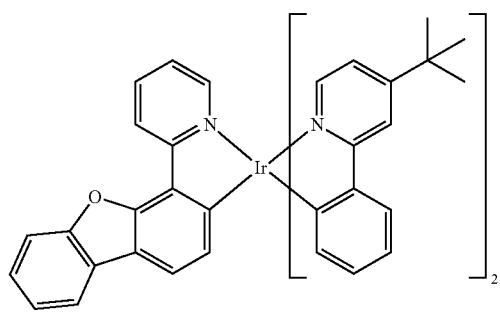
D-67
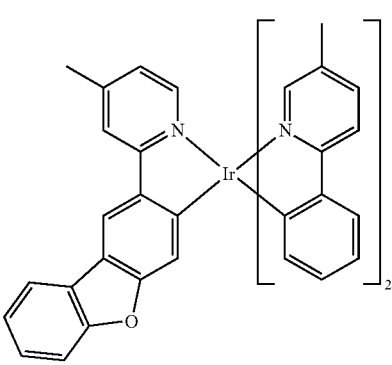
D-64
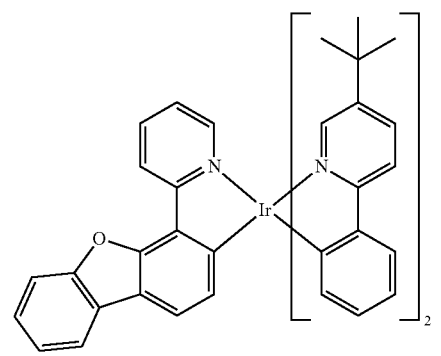
D-68
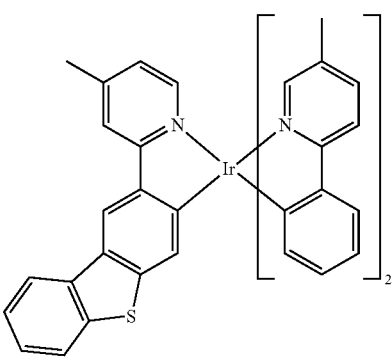

-continued
D-69
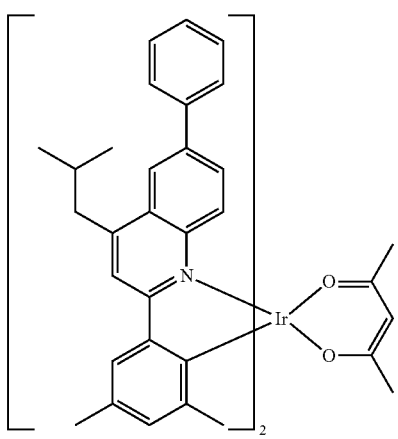
D-70
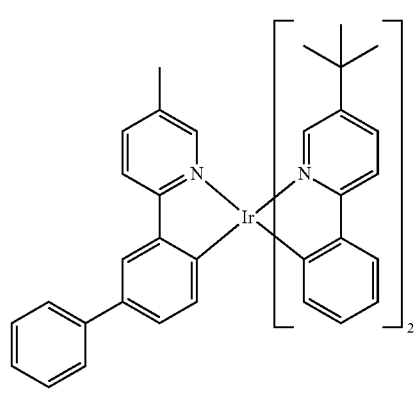
D-71
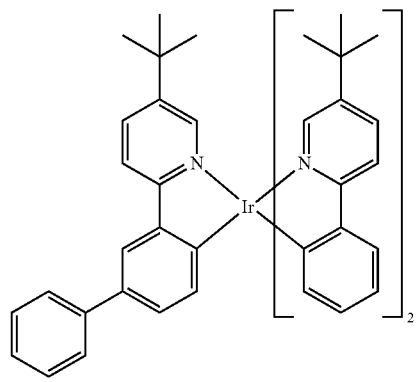
D-72
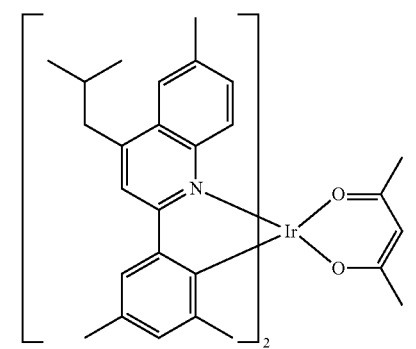
-continued
D-73
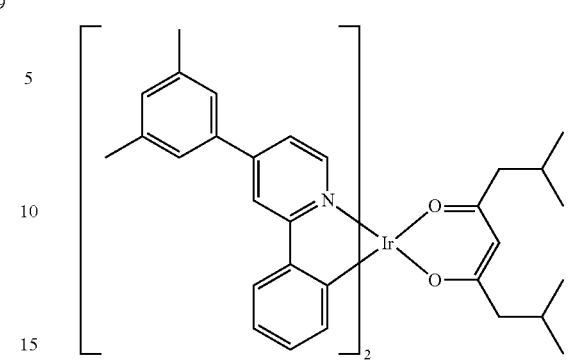
D-74
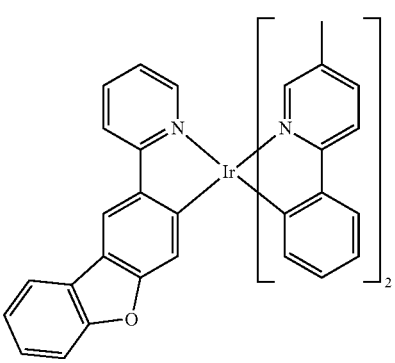
D-75
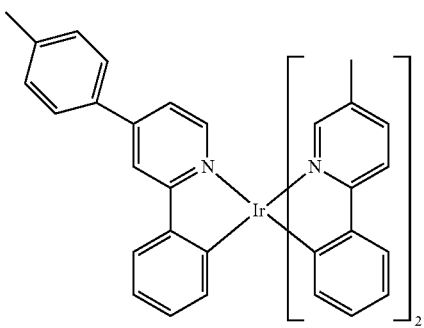
D-76
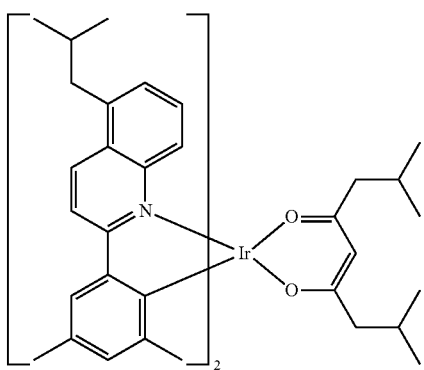

D-77
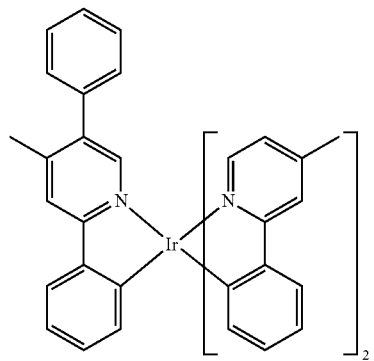
D-81
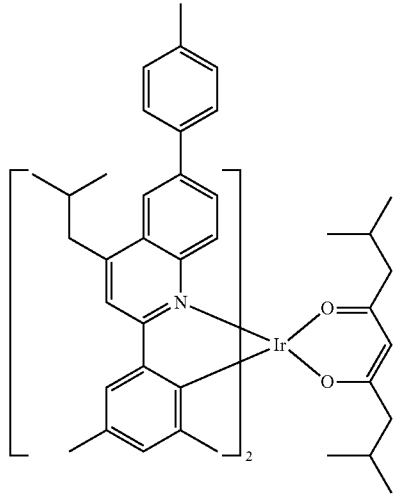
D-78
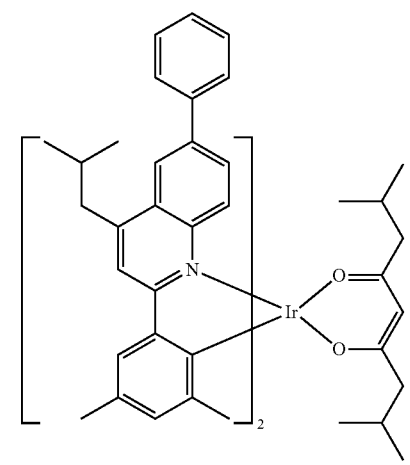
D-82
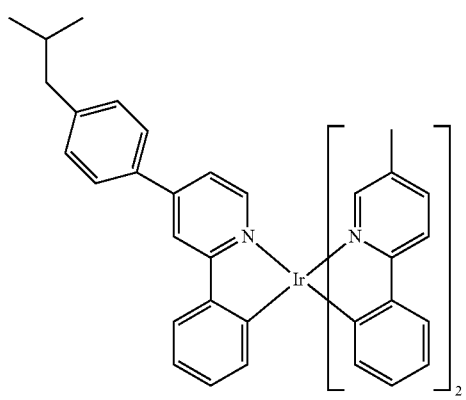
D-79
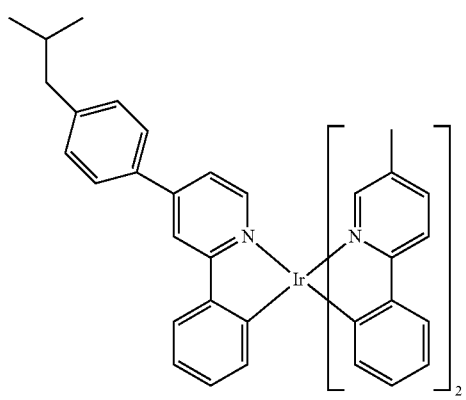
D-80
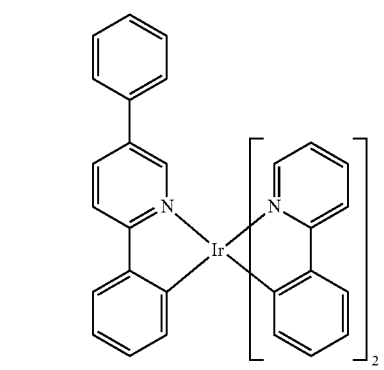
D-83
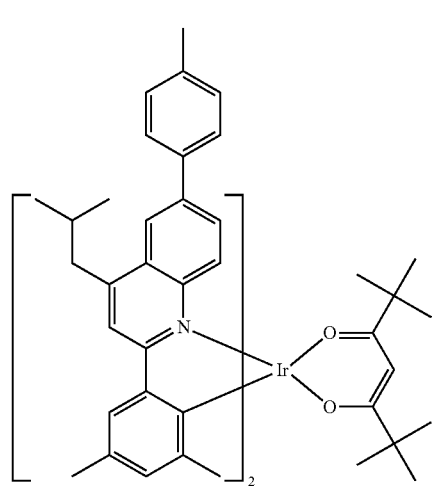

-continued
D-84
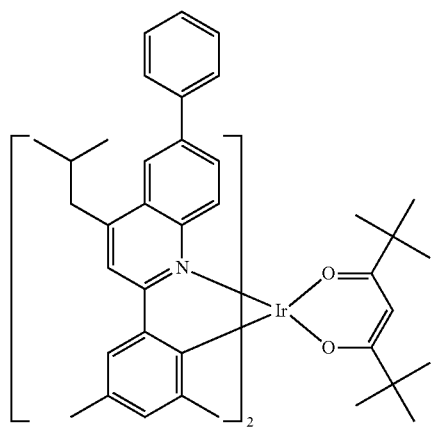
D-85
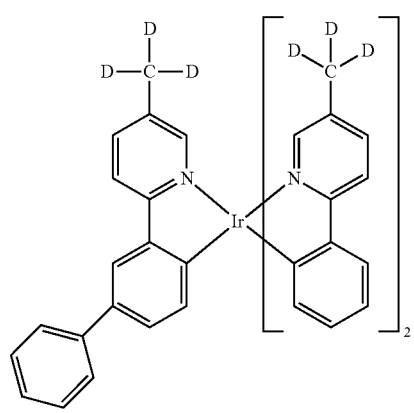
D-86
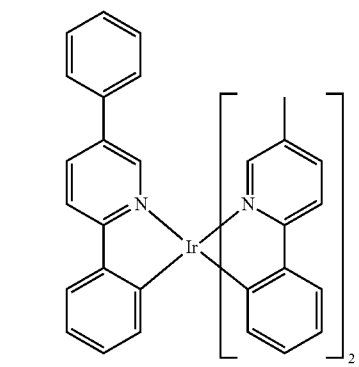
D-87
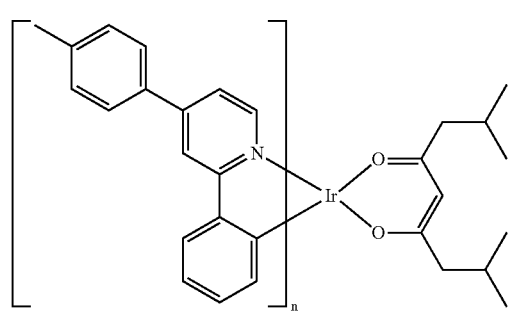
-continued
D-88
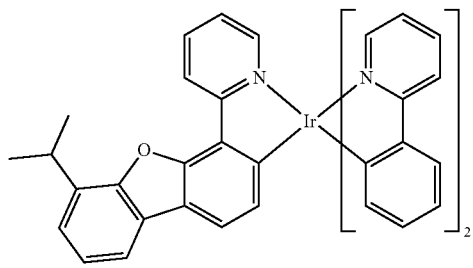
D-89
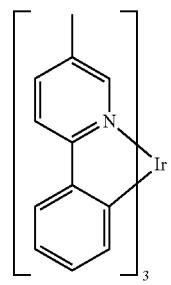
D-90
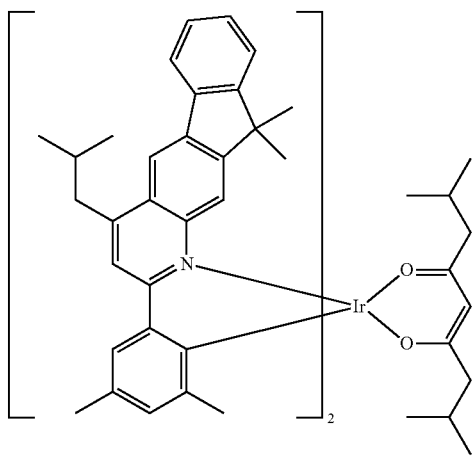
D-91
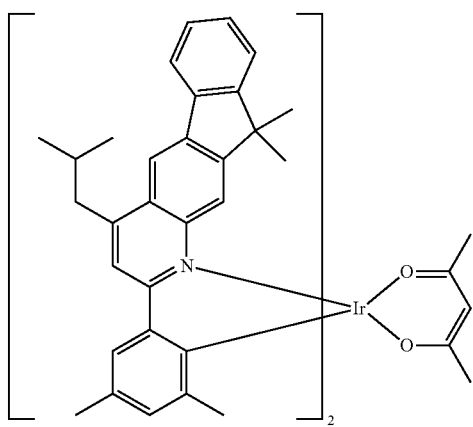

D-92
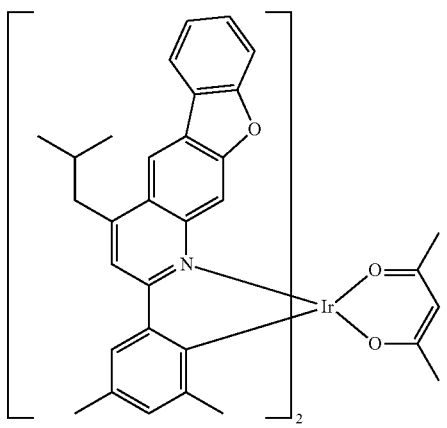
D-95
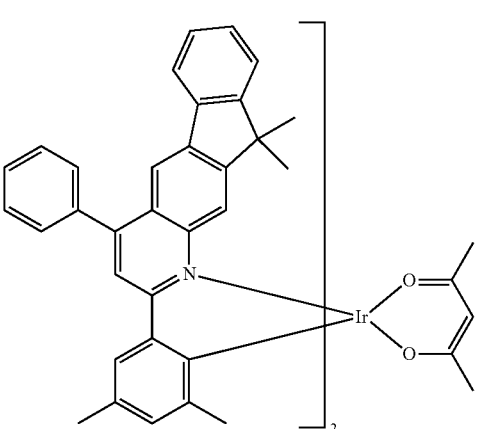
D-93
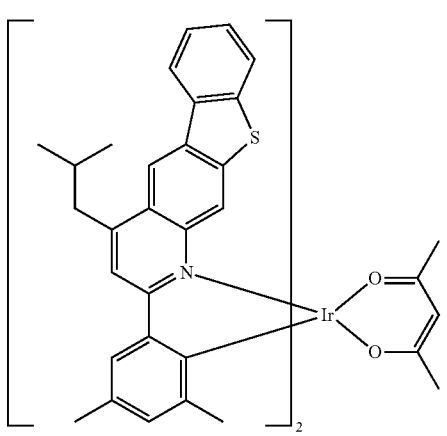
D-96
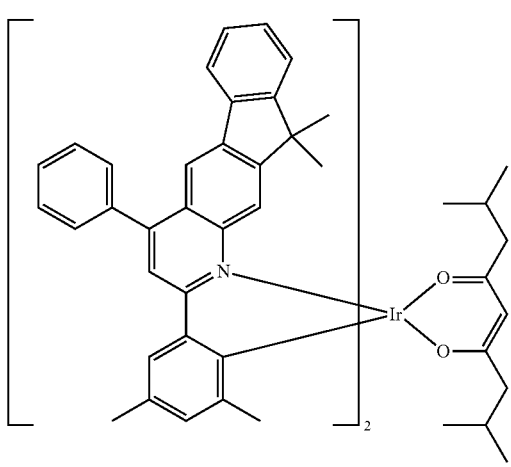
D-97
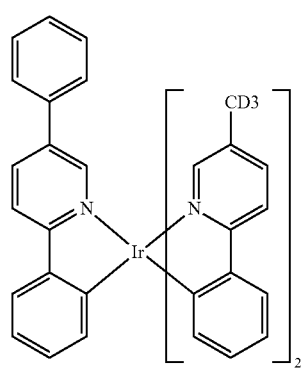
D-94
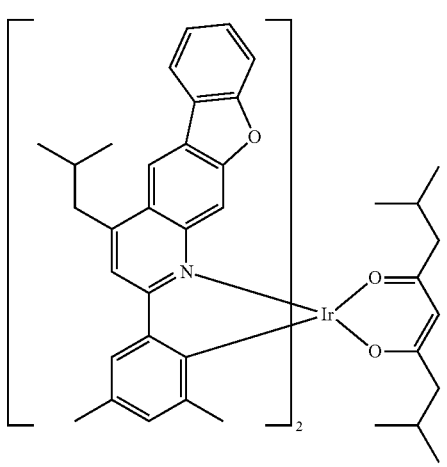
D-98
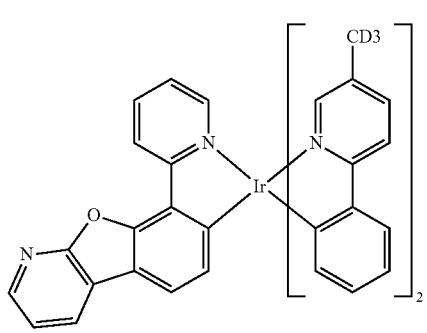

D-99
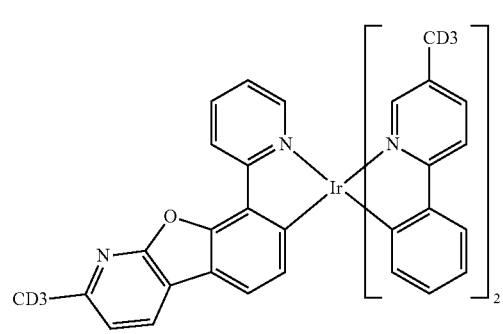
D-100
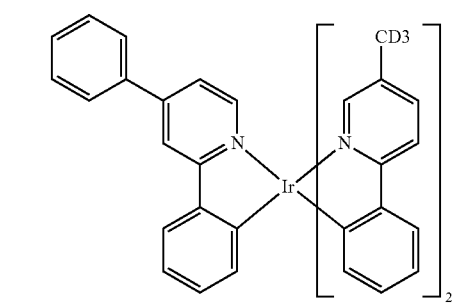
D-101
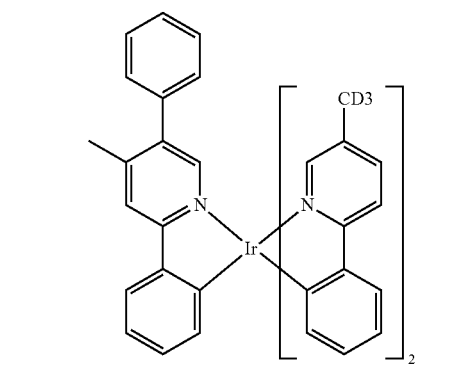
D-102
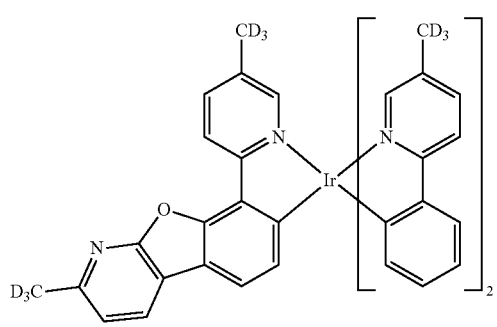
D-103
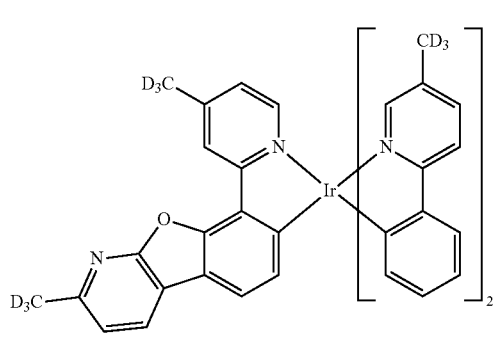
D-104
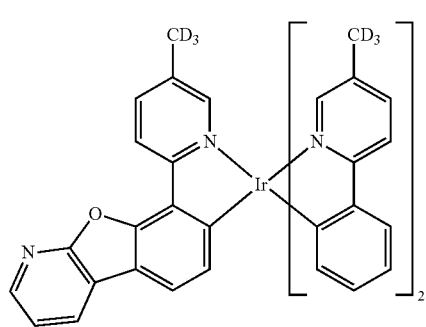
D-105
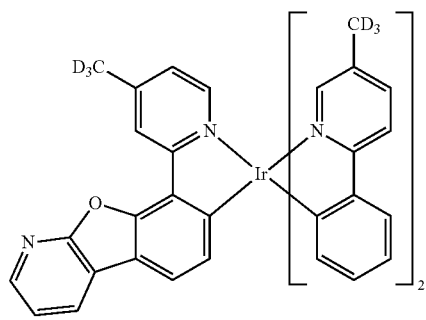
D-106
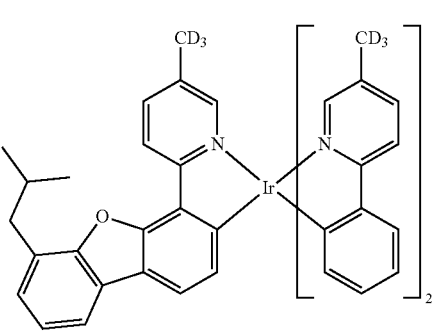
D-107
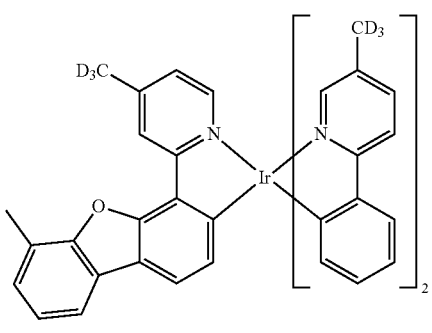
D-108
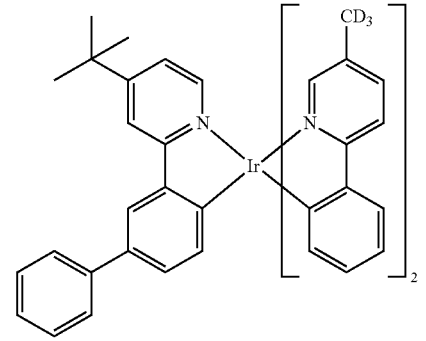

D-109
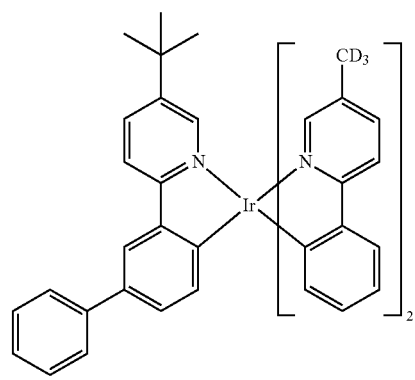
D-113
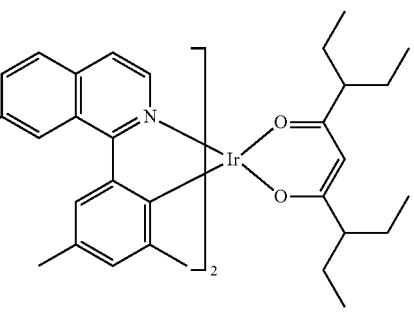
D-110
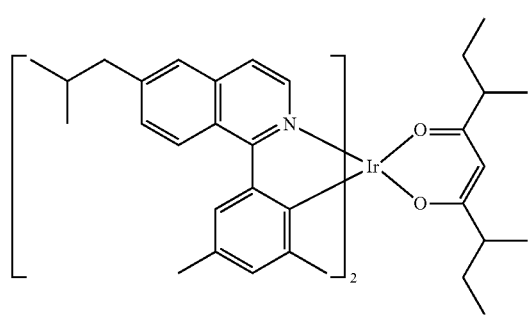
D-114
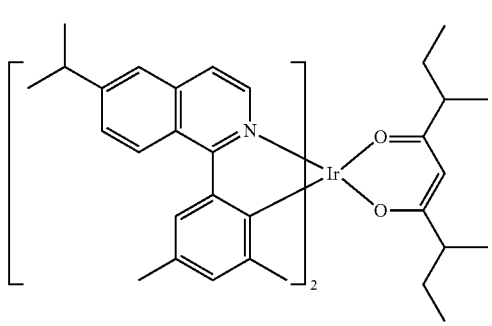
D-115
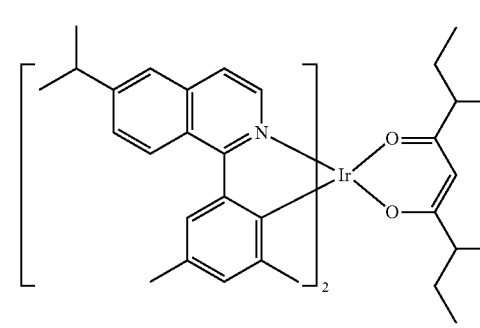
D-111
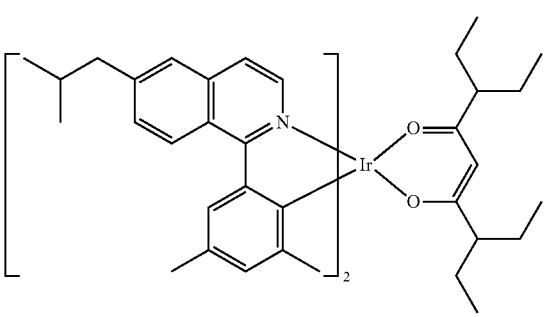
D-116
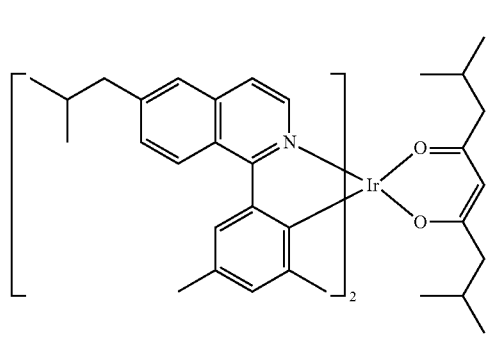
D-112
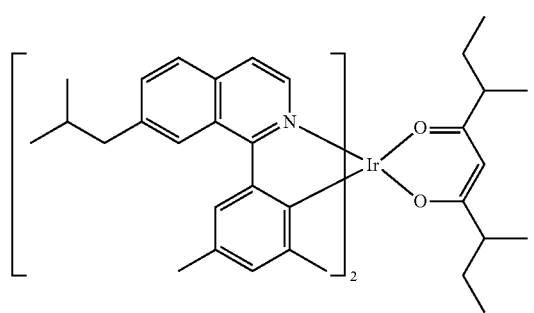
D-117

D-118
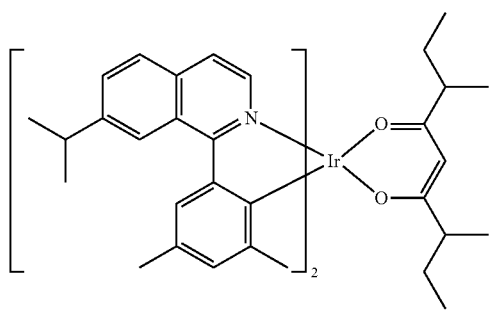
D-119
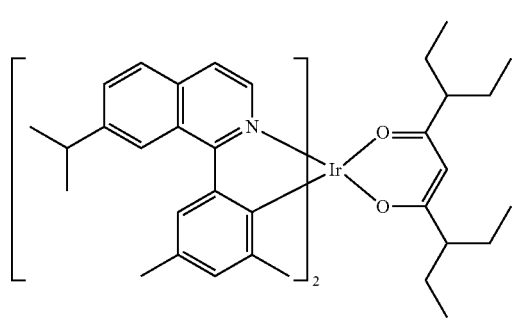
D-120
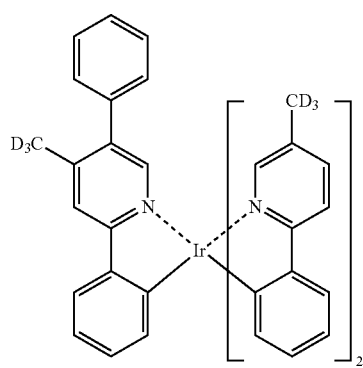
D-121
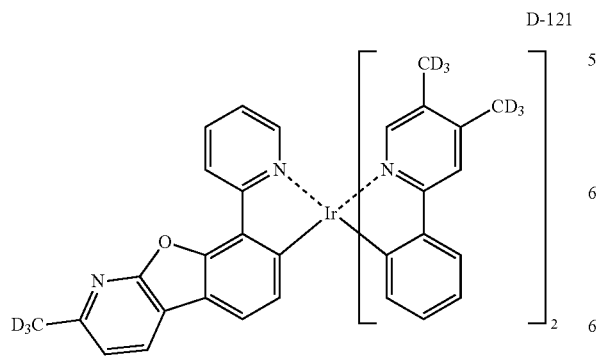
D-122
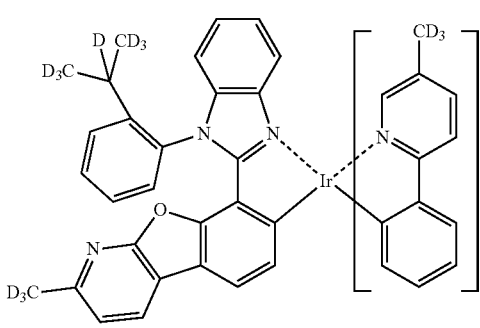
D-123
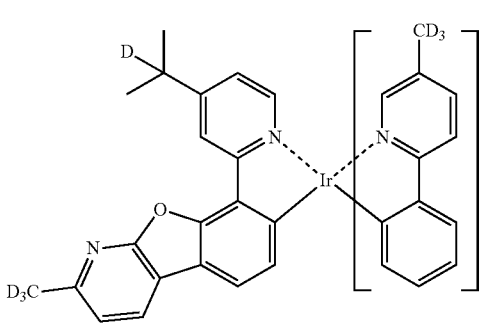
D-124
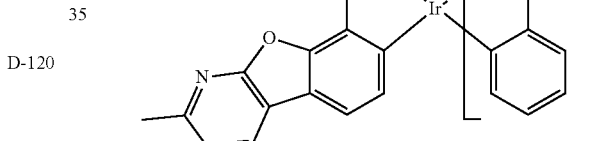
D-125
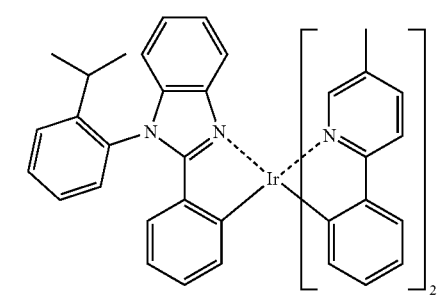
D-126
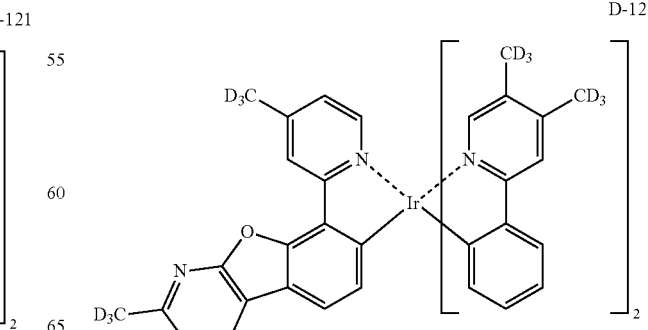

-continued

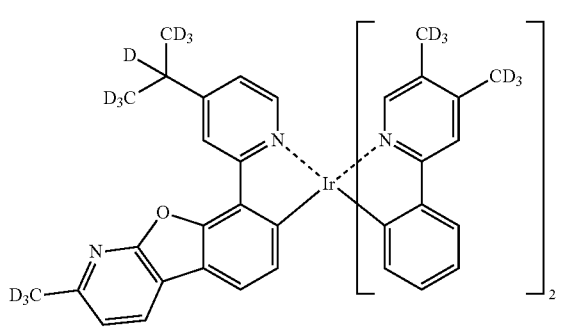

D-127

In order to form each layer of the organic electroluminescent device of the present disclosure, dry film-forming methods such as vacuum evaporation, sputtering, plasma, and ion plating methods, or wet film-forming methods such as ink jet printing, nozzle printing, slot coating, spin coating, dip coating, and flow coating methods can be used.

In a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

In addition, the compound represented by formula 1 and the compound represented by formula 2 or 3 may be film-formed in the above-listed methods, commonly by a co-evaporation process or a mixture-evaporation process. The co-evaporation is a mixed deposition method in which two or more materials are placed in a respective individual crucible source and an electric current is applied to both cells at the same time to evaporate the materials. The mixture-evaporation is a mixed deposition method in which two or more materials are mixed in one crucible source before evaporating them, and an electric current is applied to the cell to evaporate the materials.

The organic electroluminescent materials according to the present disclosure may be used as light-emitting materials for a white organic light-emitting device. The white organic light-emitting device has been suggested to have various structures such as a side-by-side structure or a stacking structure depending on the arrangement of R (red), G (green) or YG (yellow green), and B (blue) light-emitting parts, or a color conversion material (CCM) method, etc., and the present disclosure may also be applied to such white organic light-emitting device.

In addition, the organic electroluminescent materials according to the present disclosure may also be used in an organic electroluminescent device comprising a quantum dot (QD).

The present disclosure may provide a display system comprising the plurality of host materials of the present disclosure. In addition, it is possible to produce a display system or a lighting system by using the organic electroluminescent device of the present disclosure. Specifically, it is possible to produce a display system, e.g., a display system for smartphones, tablets, notebooks, PCs, TVs, or cars, or a lighting system, e.g., an outdoor or indoor lighting system, by using the organic electroluminescent device of the present disclosure.

Hereinafter, the preparation method of the compound of the present disclosure and the properties thereof will be explained in detail with reference to the representative compounds of the present disclosure. However, the present disclosure is not limited by the following examples.

Example 1: Preparation of Compound H1-131

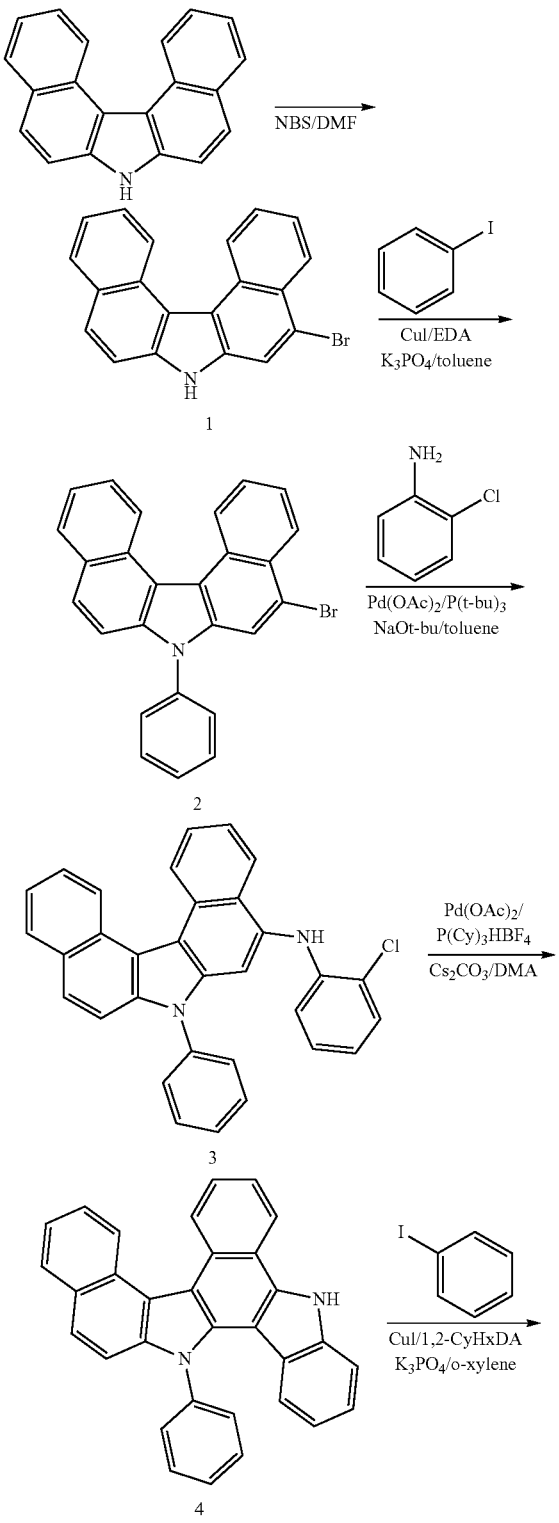

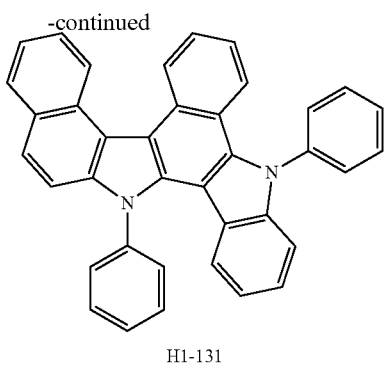

H1-131

Synthesis of compound 1 7H-dibenzo[c,g]carbazole (60 g, 224 mmol) was dissolved in 900 mL of N,N-dimethylformamide (DMF) in a flask, and the mixture was cooled to 0° C. and stirred. N-bromosuccinimide (NBS) (36 g, 202 mmol) was dissolved in 220 mL of DMF, and was then added dropwise to the mixture for 2.5 hours. The resulting mixture was stirred at room temperature for 2 hours. After completion of the reaction, the reaction product was washed with an aqueous $Na_2S_2O_3$ solution and water, an organic layer was extracted with ethyl acetate, and the residual moisture was removed with $MgSO_4$. The residue was dried and separated by a silica filter to obtain compound 1 (79 g, yield: 79%).

Synthesis of Compound 2

Compound 1 (76 g, 220 mmol), iodobenzene (90 g, 439 mmol), CuI (20.90 g, 110 mmol), ethylenediamine (EDA) (13 g, 110 mmol), and $K_3PO_4$ (139 g, 659 mmol) were added to 1.1 L of toluene, and the mixture was stirred under reflux for 2.5 hours. MeOH was added to the mixture, and the resulting solid was filtered under reduced pressure. The residue was separated by column chromatography to obtain compound 2 (55.1 g, yield: 60%).

Synthesis of Compound 3

Compound 2 (54.6 g, 129 mmol), 2-chloroaniline (20 g, 155 mmol), Pd(OAc)2 (2.9 g, 13 mmol), P(t-Bu)3 (5.2 g, 26 mmol), sodium tert-butoxide (NaOt-Bu) (31 g, 323 mmol), and 650 mL of toluene were stirred under reflux for 4 hours. The mixture was cooled to room temperature and $NH_4Cl$ (aq) was added thereto. The reaction product was extracted with ethyl acetate (EA) and dried with magnesium sulfate. The residue was distilled under reduced pressure, and separated by column chromatography to obtain compound 3 (47.9 g, yield: 79%).

Synthesis of Compound 4

Compound 3 (48 g, 103 mmol), Pd(OAc)2 (2.3 g, 10 mmol), ligand (tricyclohexylphosphonium tetrafluoroborate) (7.6 g, 21 mmol), $Cs_2CO_3$ (100 g, 308 mmol), and 400 mL of N, N-dimethylacetamide (DMA) were stirred under reflux for 1 hour. The reaction product was cooled to room temperature and $NH_4Cl$ (aq) was added thereto. An organic layer was extracted with methylene chloride (MC) and dried with magnesium sulfate. The residue was distilled under reduced pressure, and separated by column chromatography to obtain compound 4 (44 g, yield: 79%).

Synthesis of Compound H1-131

Compound 4 (5 g, 12 mmol), iodobenzene (3.5 g, 17 mmol), CuI (1.1 g, 6 mmol), 1,2-diaminocyclohexane (2.6 g, 23 mmol), and $K_3PO_4$ (4.9 g, 23 mmol) were added to 60 mL of o-xylene, and the mixture was stirred under reflux for one day. The reaction product was cooled to room temperature and was subjected to celite filter using MC. The filtrate was distilled under reduced pressure, and separated by column chromatography using MC/Hex to obtain compound H1-131 (1.3 g, yield: 22%).

$^1$H NMR (600 MHZ,DMSO,δ) 9.16-9.15 (d, 1H), 8.99-8.98 (d, 1H), 8.14-8.13 (d, 1H), 7.94-7.93 (d, 1H), 7.94-7.68 (m, 9H), 7.65-7.61 (m, 3H), 7.60-7.54 (m, 3H), 7.25-7.21 (m, 2H), 7.08-7.07 (d, 1H), 6.78-6.76 (m, 1H) 5.95-5.94 (d, 1H)

|  | MW | UV | PL | M.P. |
|---|---|---|---|---|
| H1-131 | 508.62 | 342 nm | 427 nm | 184° C. |

Example 2: Preparation of Compound H1-132

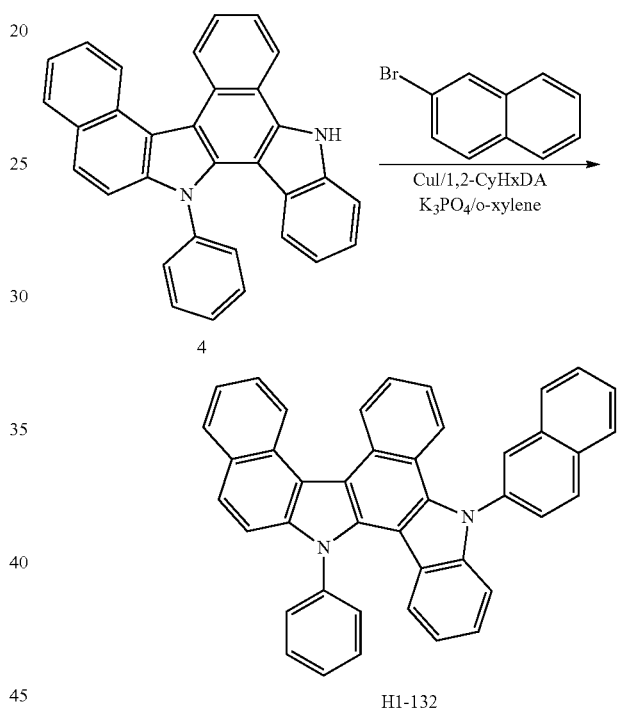

H1-132

Compound 4 (7 g, 16 mmol), 2-bromonaphthalene (6.7 g, 32 mmol), CuI (1.5 g, 8 mmol), 1,2-diaminocyclohexane (3.7 g, 32 mmol), and $K_3PO_4$ (10.3 g, 49 mmol) were added to 80 mL of o-xylene, and the mixture was stirred under reflux for one day. The reaction product was cooled to room temperature and was subjected to celite filter using MC. The filtrate was distilled under reduced pressure, and separated by column chromatography using MC/Hex to obtain compound H1-132 (1.3 g, yield: 22%).

$^1$H NMR (600 MHz, DMSO,δ) 9.17-9.15 (d, 1H), 9.00-8.99 (d, 1H), 8.31-8.30 (m, 2H), 8.20-8.18 (d, 1H), 8.15-8.14 (d, 1H), 8.11-8.10 (d, 1H), 7.95-7.94 (d, 1H), 7.83-7.79 (m, 5H), 7.73-7.69 (m, 4H), 7.60-7.57 (m, 4H), 7.21-7.18 (m, 2H), 7.14-7.13 (d, 1H), 6.78-6.77 (t, 1H) 5.98-5.96 (d, 1H)

|  | MW | UV | PL | M.P. |
|---|---|---|---|---|
| H1-132 | 558.68 | 340 nm | 431 nm | 263° C. |

Example 3: Preparation of Compound H1-134

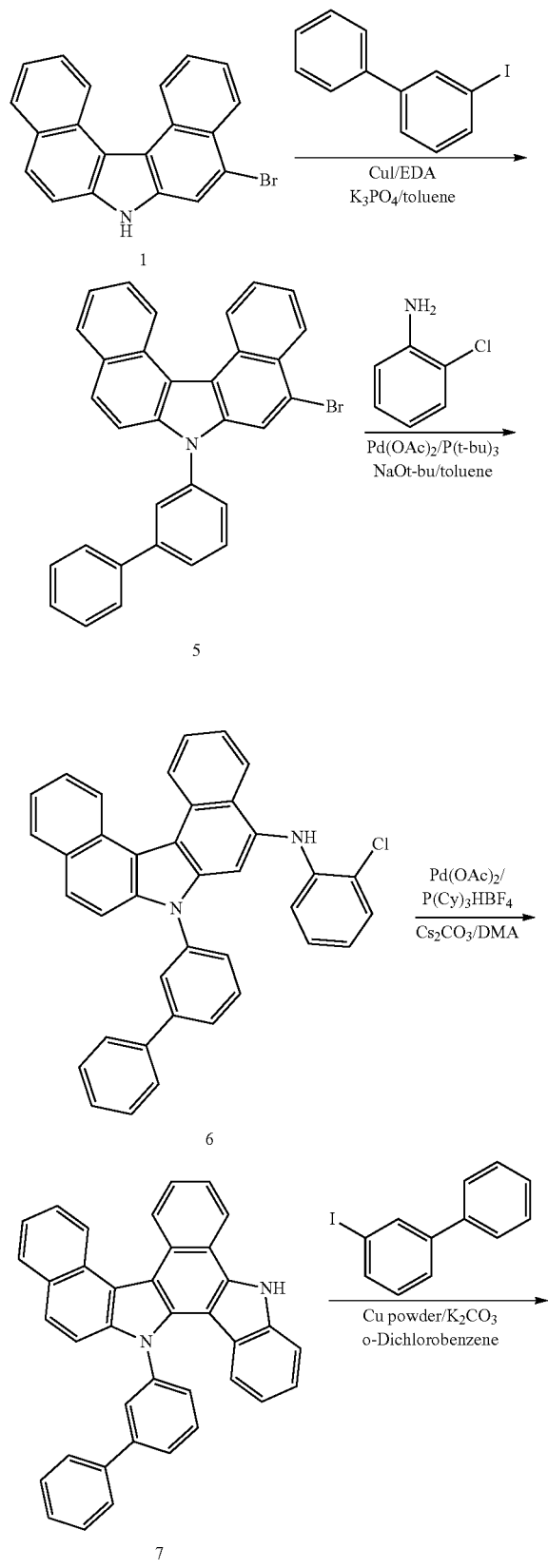

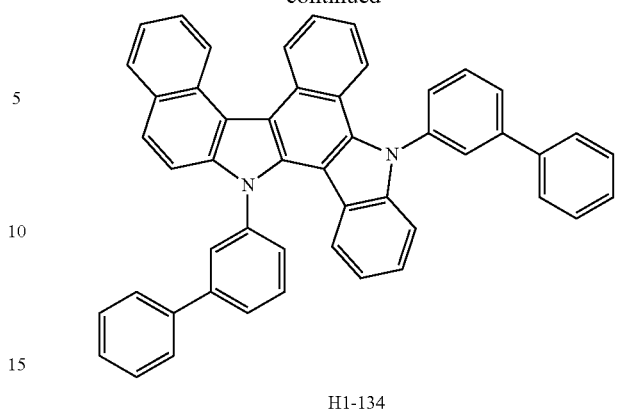

H1-134

Synthesis of Compound 5

Compound 1 (15 g, 220 mmol), 3-iodo-1,1'-biphenyl (18 g, 65 mmol), CuI (4.1 g, 22 mmol), ethylenediamine (2.6 g, 43 mmol), and $K_3PO_4$ (23 g, 108 mmol) were added to 216 mL of toluene, and the mixture was stirred under reflux for 4 hours. MeOH was added to the mixture, and the resulting solid was filtered under reduced pressure. The filtrate was separated by column chromatography to obtain compound 5 (16 g, yield: 74%).

Synthesis of Compound 6

Compound 5 (15 g, 30 mmol), 2-chloroaniline (7.7 g, 60 mmol), Pd(OAc) 2 (0.67 g, 3 mmol), P (t-Bu) 3 (1.2 g, 6 mmol), NaOt-Bu (7.2 g, 75 mmol), and 150 mL of toluene were stirred under reflux for 2 hours. The reaction product was cooled to room temperature and $NH_4Cl$ (aq) was added thereto. An organic layer was extracted with EA and dried with magnesium sulfate. The residue was distilled under reduced pressure, and separated by column chromatography to obtain compound 6 (10.1 g, yield: 62%).

Synthesis of Compound 7

Compound 6 (10 g, 18 mmol), Pd(OAc) 2 (0.41 g, 1.8 mmol), ligand (tricyclohexylphosphonium tetrafluoroborate) (1.35 g, 3.7 mmol), $Cs_2CO_3$ (18 g, 55 mmol), and 92 mL of DMA were stirred under reflux for 1 hour. The reaction product was cooled to room temperature and $NH_4Cl$ (aq) was added thereto. An organic layer was extracted with MC and dried with magnesium sulfate. The residue was distilled under reduced pressure, and separated by column chromatography to obtain compound 7 (7.1 g, yield: 76%).

Synthesis of Compound H1-134

Compound 7 (6.7 g, 13 mmol), 3-iodo-1,1'-biphenyl (7.4 g, 26 mmol), Cu powder (0.42 g, 7 mmol), and $K_2CO_3$ (3.6 g, 26 mmol) were added to 70 mL of o-dichlorobenzene, and the mixture was stirred under reflux for one day. The reaction product was cooled to room temperature and was subjected to celite filter using MC. The filtrate was distilled under reduced pressure, and separated by column chromatography using MC/Hex to obtain compound H1-134 (3.1 g, yield: 36%).

$^1$H NMR (600 MHZ,DMSO,δ) 9.18-9.17 (d, 1H), 9.01-9.00 (d, 1H), 8.16-8.15 (d, 1H), 8.11-8.09 (d, 1H), 8.06-8.05 (m, 2H), 8.00-7.79 (m, 7H), 7.73-7.57 (m, 8H), 7.48-7.38 (m, 6H), 7.30-7.28 (t, 1H), 7.22-7.18 (m, 2H), 6.80-6.78 (t, 1H), 6.07-6.06 (d, 1H)

| | MW | M.P. |
|---|---|---|
| H1-134 | 660.82 | 259° C. |

Example 4: Preparation of Compound H1-133

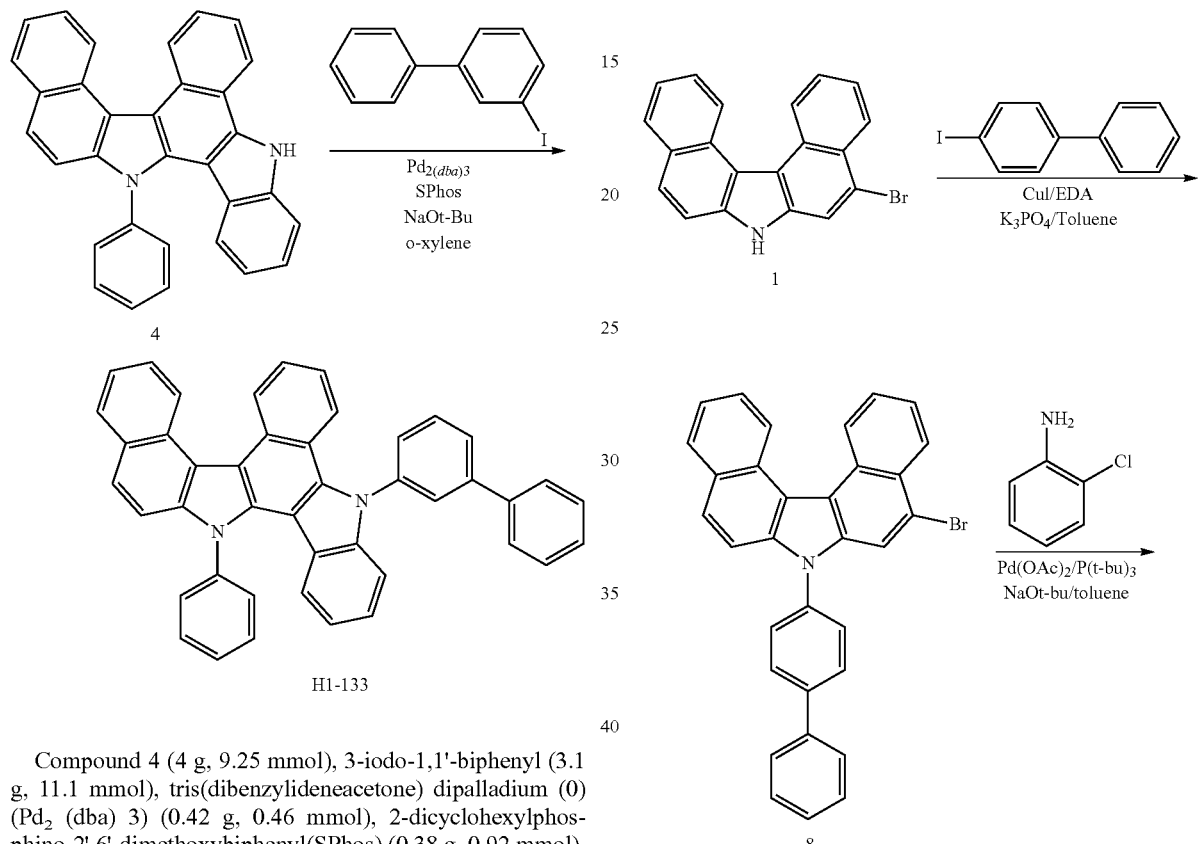

H1-133

Compound 4 (4 g, 9.25 mmol), 3-iodo-1,1'-biphenyl (3.1 g, 11.1 mmol), tris(dibenzylideneacetone) dipalladium (0) (Pd$_2$ (dba) 3) (0.42 g, 0.46 mmol), 2-dicyclohexylphosphino-2',6'-dimethoxybiphenyl(SPhos) (0.38 g, 0.92 mmol), and NaOt-Bu (2.2 g, 23.13 mmol) were added to 46 mL of o-xylene, and the mixture was stirred under reflux for one day. The reaction product was extracted with MC, distilled under reduced pressure, and separated by column chromatography using MC/Hex to obtain compound H1-133 (1.2 g, yield: 23%).

$^1$H NMR (600 MHz, DMSO,δ) 9.17-9.15 (d, 1H), 9.00-8.98 (d, 1H), 8.15-8.13 (d, 1H), 8.07-8.06 (d, 1H), 7.98 (m, 1H), 7.95-7.94 (d, 1H), 7.88-7.86 (t, 1H), 7.82-7.80 (m, 7H), 7.71-7.67 (m, 2H), 7.65-7.61 (m, 2H), 7.60-7.55 (m, 2H), 7.49-7.47 (t, 2H), 7.42-7.39 (t, 1H), 7.30-7.27 (t, 1H), 7.26-7.23 (t, 1H), 7.20-7.19 (d, 1H), 6.80-6.77 (t, 1H), 5.97-5.95 (d, 1H)

| | MW | M.P. |
|---|---|---|
| H1-133 | 584.7 | 249.6° C. |

Example 5: Preparation of Compound H1-135

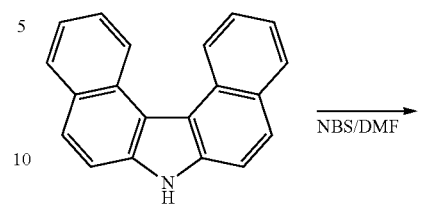

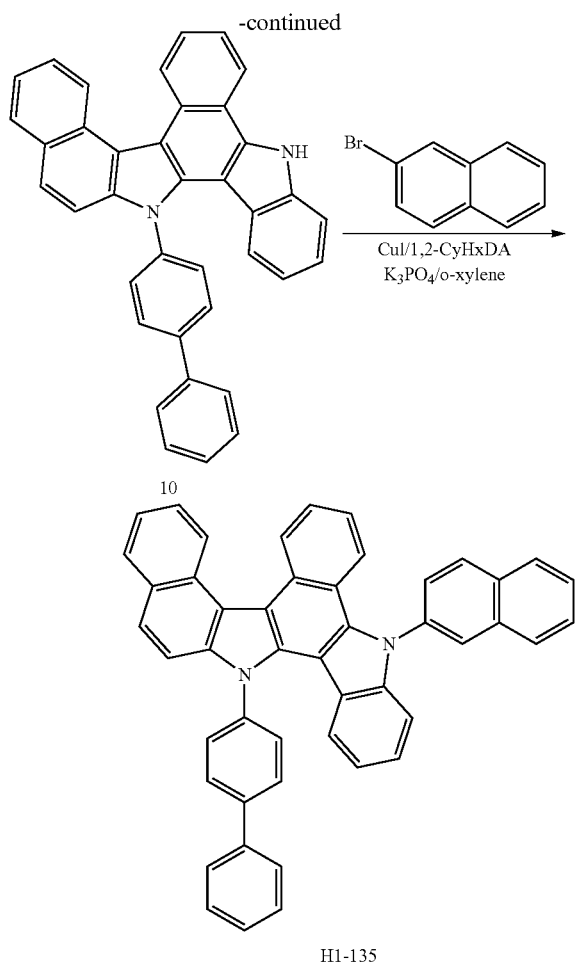

Synthesis of Compound 1

7H-dibenzo[c,g]carbazole (50 g, 187 mmol) was dissolved in 750 mL of DMF in a flask, and the mixture was cooled to 0° C. and stirred. NBS (30 g, 168 mmol) was dissolved in 250 mL of DMF, and was then added dropwise to the mixture for 1 hour. The resulting mixture was stirred at room temperature for 2 hours. After completion of the reaction, the reaction product was washed with an aqueous $Na_2S_2O_3$ solution and water, an organic layer was extracted with ethyl acetate, and the residual moisture was removed with $MgSO_4$. The residue was dried and separated by a silica filter to obtain compound 1 (40 g, yield: 62%).

Synthesis of Compound 8

Compound 1 (11 g, 32 mmol), 4-iodo-1,1′-biphenyl (17.8 g, 64 mmol), CuI (3.0 g, 15.9 mmol), ethylenediamine (1.91 g, 31.8 mmol), and $K_3PO_4$ (20.3 g, 95 mmol) were added to 160 mL of toluene, and the mixture was stirred under reflux for 4 hours. MeOH was added to the mixture, and the resulting solid was filtered under reduced pressure. The filtrate was separated by column chromatography to obtain compound 8 (13.0 g, yield: 82%).

Synthesis of Compound 9

Compound 8 (13.0 g, 26 mmol), 2-chloroaniline (6.7 g, 52 mmol), Pd(OAc)2 (0.59 g, 2.6 mmol), P(t-Bu)3 (1.1 g, 5.2 mmol), NaOt-Bu (6.3 g, 65 mmol), and 130 mL of toluene were stirred under reflux for 4 hours. The reaction product was cooled to room temperature and $NH_4Cl$ (aq) was added thereto. An organic layer was extracted with EA and dried with magnesium sulfate. The residue was distilled under reduced pressure, and separated by column chromatography to obtain compound 9 (9.2 g, yield: 65%).

Synthesis of Compound 10

Compound 9 (9.2 g, 17 mmol), Pd(OAc)2 (0.38 g, 2 mmol), ligand (tricyclohexylphosphonium tetrafluoroborate) (1.2 g, 3 mmol), $Cs_2CO_3$ (138 g, 42 mmol), and 70 mL of DMA were stirred under reflux for 1 hour. The reaction product was cooled to room temperature and $NH_4Cl$ (aq) was added thereto. The resulting solid was distilled under reduced pressure, and separated by column chromatography to obtain compound 10 (6.0 g, yield: 70%).

Synthesis of Compound H1-135

Compound 10 (6 g, 12 mmol), 2-bromonaphthalene (4.9 g, 24 mmol), CuI (1.1 g, 6 mmol), 1,2-diaminocyclohexane (2.7 g, 24 mmol), and $K_3PO_4$ (7.5 g, 35 mmol) were added to 60 mL of o-xylene, and the mixture was stirred under reflux for one day. The reaction product was cooled to room temperature. Then, an organic layer was separated by adding ethyl acetate and water, and dried with magnesium sulfate. The residue was subjected to celite filter using MC. The filtrate was distilled under reduced pressure, and separated by column chromatography using MC/Hex to obtain compound H1-135 (2.1 g, yield: 28%).

$^1$H NMR (600 MHz, DMSO,δ) 9.18-9.17 (d, 1H), 9.01-8.99 (d, 1H), 8.33-8.31 (m, 2H), 8.20-8.19 (d, 1H), 8.17-8.15 (d, 1H), 8.12-8.08 (m, 3H), 7.98-7.97 (d, 1H), 7.93-7.89 (m, 4H), 7.70-7.68 (m, 5H), 7.63-7.57 (m, 5H) 7.50-7.48 (t, 1H), 7.22-7.19 (t, 1H), 7.15-7.13 (d, 1H), 6.77-6.74 (td, 1H), 6.16-6.15 (d, 1H)

|        | MW     | M.P.    |
|--------|--------|---------|
| H1-135 | 508.62 | 294° C. |

Example 6: Preparation of Compound H1-11

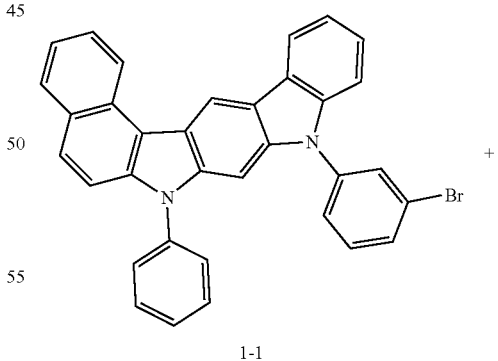

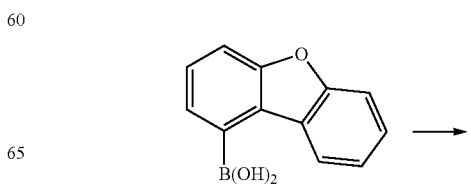

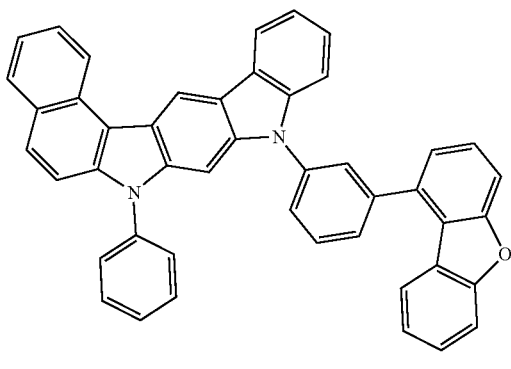

H1-11

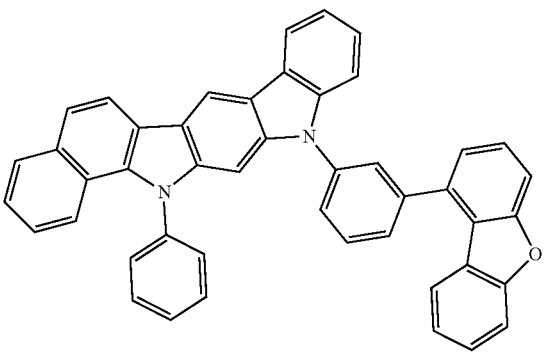

H1-54

Compound 1-1 (7 g, 13 mmol), dibenzo[b,d]furan-1-ylboronic acid (3 g, 14.3 mmol), K₂CO₃ (5.4 g, 39 mmol), and Pd(PPh₃)₄ (0.75 g, 0.65 mmol) were dissolved in 30 ml of H₂O, 60 mL of toluene, and 30 mL of EtOH in a flask, and the mixture was refluxed at 120° C. for 3 hours. After completion of the reaction, an organic layer was extracted with ethyl acetate, and the residual moisture was removed with magnesium sulfate. The residue was dried and separated by column chromatography to obtain compound H1-11 (5.7 g, yield: 70%).

¹H NMR (600 MHz, CDCl₃, δ) 9.305 (s, 1H), 9.049-9.035 (d, J=8.4 Hz, 1H), 8.379-8.367 (d, J=7.2 Hz, 1H), 8.022-8.008 (d, J=8.4 Hz, 1H) 7.816-7.705 (m, 6H), 7.699-7.392 (m, 16H) 7.195-7.127 (m, 2H)

Compound 1-2 (5.7 g, 10.6 mmol), dibenzo[b,d]furan-1-ylboronic acid (2.5 g, 11.7 mmol), K₂CO₃ (4.4 g, 31.8 mmol), and Pd(PPh₃)₄ (0.61 g, 0.653 mmol) were dissolved in 30 mL of H₂O, 60 mL of toluene, and 30 mL of EtOH in a flask, and the mixture was refluxed at 120° C. for 3 hours. After completion of the reaction, an organic layer was extracted with ethyl acetate, and the residual moisture was removed with magnesium sulfate. The residue was dried and separated by column chromatography to obtain compound H1-54 (1.2 g, yield: 18%).

¹H NMR (600 MHZ, CDCl₃, δ) 8.880 (s, 1H), 8.378-8.364 (d, J=8.4 Hz, 1H), 8.297-8.284 (d, J=7.8 Hz, 1H), 8.000-7.987 (d, J=7.8 Hz, 1H) 7.777-7.702 (m, 5H), 7.615-7.332 (m, 15H), 7.189-7.127 (m, 4H)

|       | MW     | M.P.    |
|-------|--------|---------|
| H1-11 | 642.73 | 154° C. |

|       | MW     | M.P.    |
|-------|--------|---------|
| H1-54 | 624.73 | 239° C. |

Example 7: Preparation of Compound H1-54

Example 8: Preparation of Compound H1-53

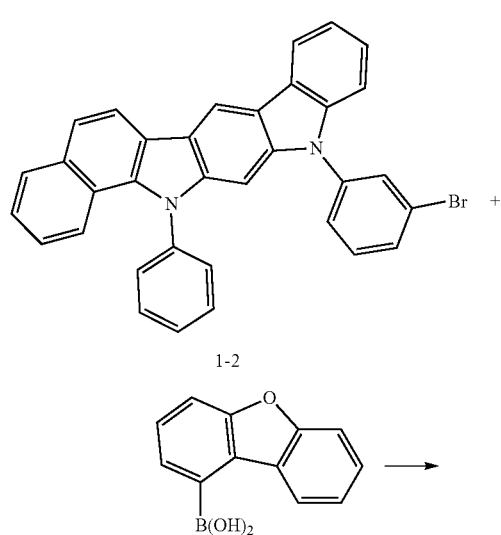

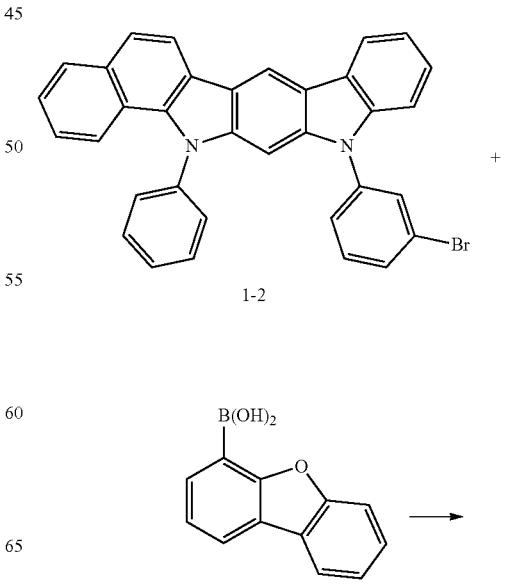

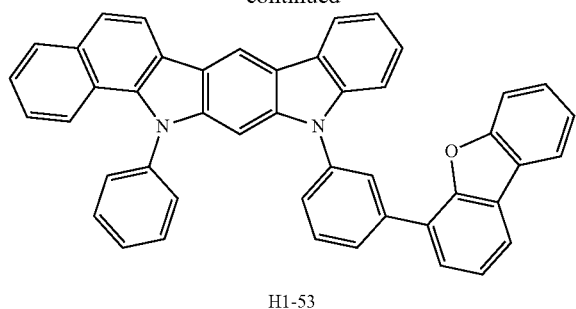

H1-53

Compound 1-2 (5.0 g, 9.3 mmol), dibenzo[b,d]furan-4-ylboronic acid (2.2 g, 10.2 mmol), Pd(PPh$_3$)$_4$ (0.54 g, 0.47 mmol), and K$_2$CO$_3$ (2.6 g, 18.6 mmol) were dissolved in 20 mL of toluene, 8 mL of EtOH, and 10 mL of H$_2$O in a flask, and the mixture was refluxed at 120° C. for 3 hours. After completion of the reaction, an organic layer was extracted with ethyl acetate, and the residual moisture was removed with magnesium sulfate. The residue was dried and separated by column chromatography to obtain compound H1-53 (3.5 g, yield: 60%).

$^1$H NMR (600 MHz, DMSO$_3$, δ) 9.210 (s, 1H), 8.516-8.502 (d, 1H), 8.408-8.395 (d, 1H), 8.219-8.198 (m, 2H), 8.115-8.109 (t, 1H), 8.087-8.073 (d, 1H), 8.040-8.028 (d, 1H), 7.856-7.842 (d, 1H), 7.833-7.807 (t, 1H), 7.733-7.611 (m, 9H), 7.562-7.531 (m, 2H), 7.515-7.490 (t, 1H), 7.451-7.426 (t, 1H), 7.293-7.279 (d, 1H), 7.258-7.232 (t, 1H), 7.119 (s, 1H)

|  | MW | M.P. |
|---|---|---|
| H1-53 | 624.7 | 161° C. |

Example 9: Preparation of Compound H1-13

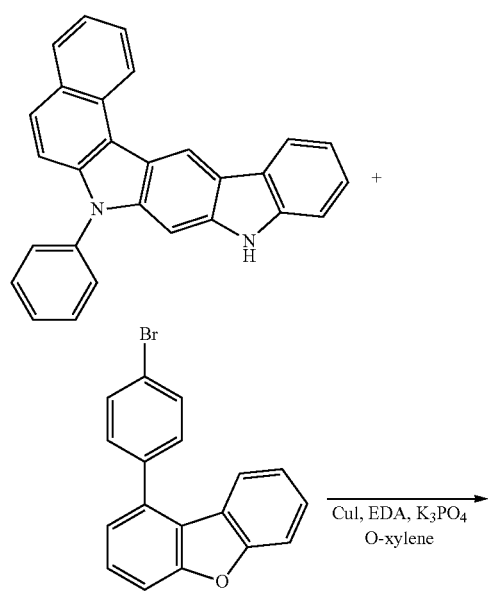

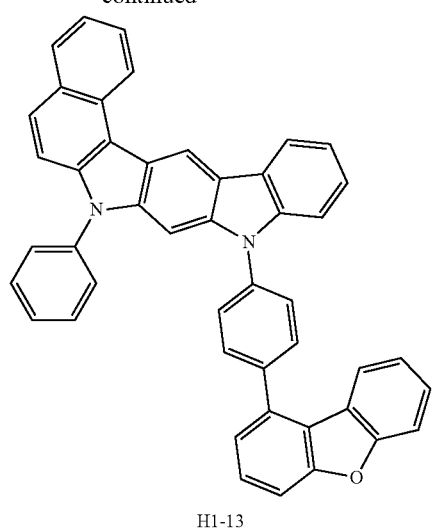

H1-13

7-phenyl-7,9-dihydrobenzo[g]indolo[2,3-b]carbazole (3.6 g, 9.285 mmol), 1-(4-bromophenyl)dibenzo[b,d]furan (3 g, 9.285 mmol), CuI (0.08 g, 0.464 mmol), EDA (0.5 g, 9.285 mmol), and K$_3$PO$_4$ (4.9 g, 23.21 mmol) were added to 50 mL of xylene, and the mixture was stirred for one day. After completion of the reaction, the reaction product was cooled to room temperature, and extracted with distilled water and MeOH. The extracted product was separated by column chromatography using MC/Hex to obtain compound H1-13 (2.7 g, yield: 47%).

$^1$H NMR (DMSO-d$_6$) δ: 9.69 (s, 1H), 9.26 (d, J=8.3 Hz, 1H), 8.69 (dd, J=7.7, 1.2 Hz, 1H), 8.14 (dd, J=8.0, 1.1 Hz, 1H), 7.97 (d, J=8.8 Hz, 1H), 7.92 (s, 4H), 7.88 (ddd, J=8.2, 6.9, 1.3 Hz, 1H), 7.82-7.76 (m, 4H), 7.73 (t, J=7.8 Hz, 2H), 7.70-7.48 (m, 8H), 7.48-7.44 (m, 2H), 7.42 (td, J=7.3, 1.0 Hz, 1H), 7.26-7.20 (m, 1H)

|  | MW | M.P. |
|---|---|---|
| H1-13 | 624.7 | 309.7° C. |

Example 10: Preparation of Compound H1-5

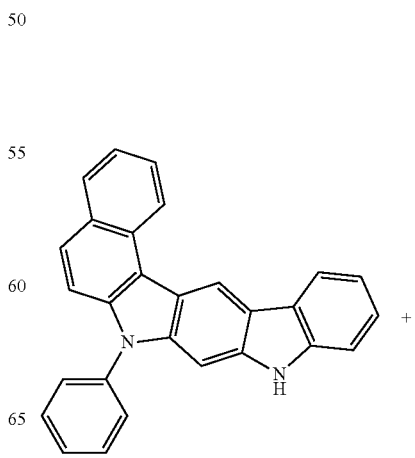

-continued

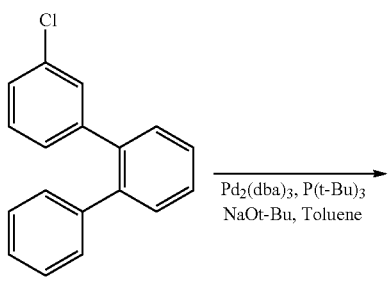

Example 11: Preparation of Compound H1-19

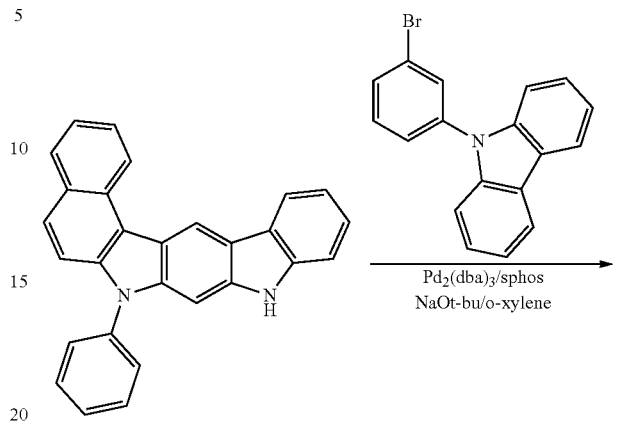

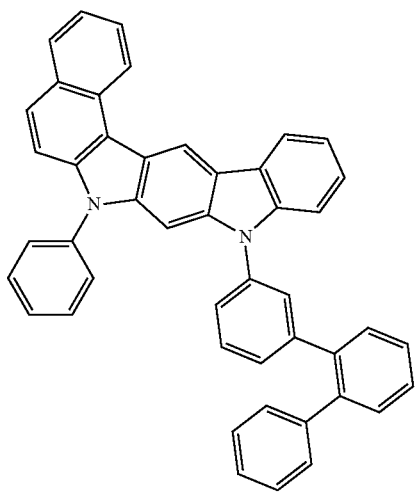

H1-5

7-phenyl-7,9-dihydrobenzo[g]indolo[2,3-b]carbazole (7.6 g, 18.88 mmol), 3-chloro-1,1': 2', 1"-terphenyl (5 g, 18.88 mmol), Pd₂ (dba)₃ (0.86 g, 0.940 mmol), NaOt-Bu (4.5 g, 47.22 mmol), and P (t-Bu) 3 (0.38 g, 1.888 mmol) were added to 100 mL of toluene, and the mixture was stirred for one day. After completion of the reaction, the reaction product was cooled to room temperature, and extracted with distilled water and MeOH. The extracted product was separated by column chromatography using MC/Hex to obtain compound H1-5 (0.7 g, yield: 6.2%).

¹H NMR (DMSO-d₆) δ: 9.58 (s, 1H), 9.20 (d, J=8.4 Hz, 1H), 8.57 (d, J=7.8 Hz, 1H), 8.11 (d, J=8.3 Hz, 1H), 7.94 (d, J=8.9 Hz, 1H), 7.84 (ddd, J=8.3, 6.8, 1.3 Hz, 1H), 7.72 (d, J=6.2 Hz, 4H), 7.64-7.47 (m, 8H), 7.44 (dt, J=6.0, 1.9 Hz, 1H), 7.40-7.17 (m, 10H), 6.50 (d, J=7.9 Hz, 1H)

H1-19

7-phenyl-7,9-dihydrobenzo[g]indolo[2,3-b]carbazole (5.1 g, 13 mmol), 9-(3-bromophenyl)-9H-carbazole (4.7 g, 14.6 mmol), Pd₂ (dba)₃ (0.604 g, 0.66 mmol), SPhos (0.546 g, 1.33 mmol), and NaOt-Bu (3.20 g, 33.3 mmol) were added to 50 mL of xylene in a flask, and the mixture was stirred under reflux at 190° C. for 2 hours. After completion of the reaction, an organic layer was extracted with EA, dried with MgSO₄, and separated by column chromatography. Then, MeOH was added to the separated product, and the resulting solid was filtered under reduced pressure to obtain compound H1-19 (4.4 g, yield: 53.0%).

¹H NMR (600 MHZ, DMSO-d₆, δ) 9.66 (s, 1H), 9.24 (d, J=8.4 Hz, 1H), 8.66 (d, J=7.7 Hz, 1H), 8.26 (d, J=7.8 Hz, 2H), 8.13 (d, J=8.1 Hz, 1H), 8.01-7.94 (m, 2H), 7.91-7.84 (m, 3H), 7.79 (dd, J=8.2, 1.8 Hz, 1H), 7.77-7.74 (m, 2H), 7.69 (t, J=7.6 Hz, 2H), 7.62-7.55 (m, 3H), 7.53 (d, J=8.1 Hz, 1H), 7.49-7.45 (m, 2H), 7.39 (dd, J=14.4, 6.9 Hz, 5H) 7.31 (t, J=7.5 Hz, 2H)

| | MW | M.P. |
|---|---|---|
| H1-5 | 610.7 | 194.6° C. |

| | MW | M.P. |
|---|---|---|
| H1-19 | 623.76 | 240° C. |

Example 12: Preparation of Compound H1-6

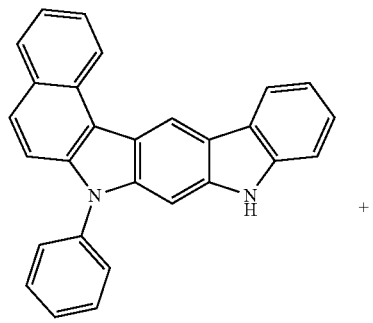

+

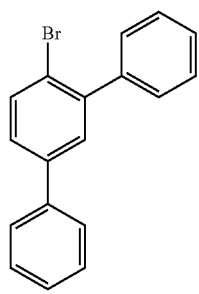

Cu powder/K₂CO₃
o-DCB

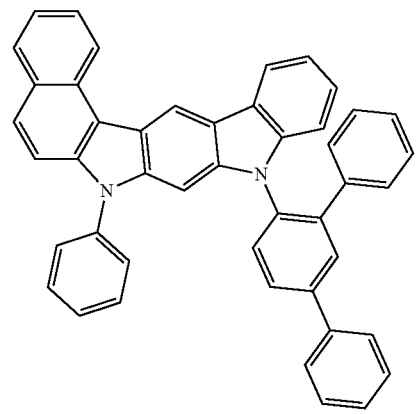

H1-6

7-phenyl-7,9-dihydrobenzo[g]indolo[2,3-b]carbazole (5.0 g, 13 mmol), 4'-bromo-1,1': 3', 1"-terphenyl (6.06 g, 20 mmol), Cu powder (1.307 g, 0.65 mmol), and K₂CO₃ (3.4 g, 26 mmol) were added to 60 mL of o-dichlorobenzene (o-DCB) in a flask, and the mixture was stirred under reflux at 230° C. for 12 hours. After completion of the reaction, an organic layer was extracted with EA, dried with MgSO₄, and separated by column chromatography. Then, MeOH was added to the separated product, and the resulting solid was filtered under reduced pressure to obtain compound H1-6 (1.3 g, yield: 16.3%).

¹H NMR (600 MHZ, DMSO-d₆, δ) 9.51 (s, 1H), 9.16 (d, J=8.3 Hz, 1H), 8.57 (d, J=7.8 Hz, 1H), 8.10 (d, J=8.0 Hz, 1H), 7.98-7.85 (m, 6H), 7.83 (t, J=7.6 Hz, 1H), 7.76 (s, 1H), 7.70 (d, J=8.1 Hz, 1H), 7.61-7.51 (m, 5H), 7.51-7.42 (m, 3H), 7.38 (t, J=7.8 Hz, 1H), 7.31 (t, J=7.3 Hz, 1H), 7.25 (d, J=8.0 Hz, 1H), 7.13-7.06 (m, 4H), 7.03 (d, J=6.8 Hz, 1H), 6.79 (s, 1H)

|  | MW | M.P. |
|---|---|---|
| H1-6 | 610.74 | 296° C. |

Example 13: Preparation of Compound H1-22

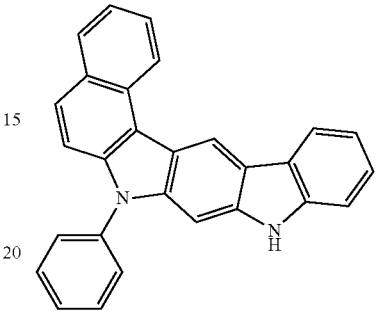 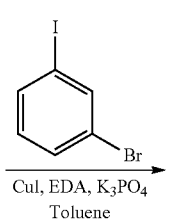

CuI, EDA, K₃PO₄
Toluene

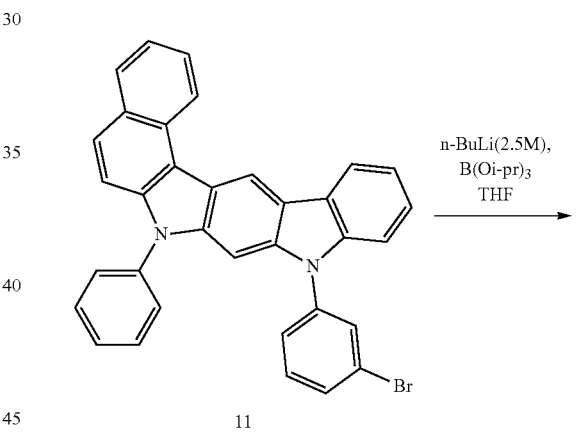

11 n-BuLi(2.5M),
B(Oi-pr)₃
THF

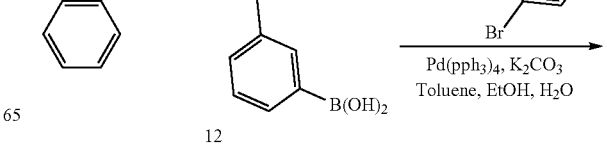

12

Pd(pph₃)₄, K₂CO₃
Toluene, EtOH, H₂O

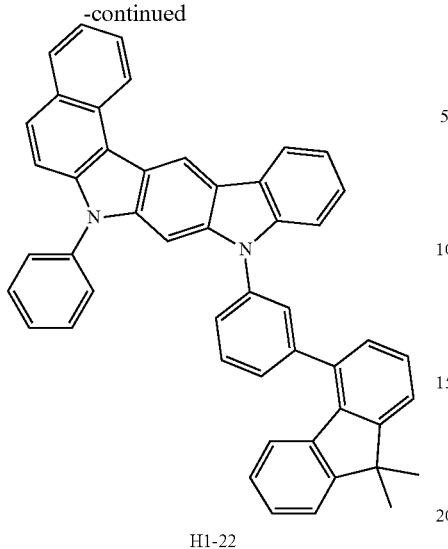

H1-22

Synthesis of Compound 11

7-phenyl-7,9-dihydrobenzo[g]indolo[2,3-b]carbazole (10 g, 26.14 mmol), 1-bromo-3-iodobenzene (14.8 g, 52.29 mmol), CuI (2.5 g, 13.07 mmol), EDA (1.57 g, 26.14 mmol), and $K_3PO_4$ (13.8 g, 65.36 mmol) were added to 130 ml of toluene, and the mixture was stirred for one day. After completion of the reaction, the reaction product was cooled to room temperature, and extracted with distilled water and MeOH. The extracted product was separated by column chromatography using MC/Hex to obtain compound 11 (9 g, yield: 64%).

Synthesis of Compound 12

Compound 11 (9 g, 16.74 mmol) was added to 85 mL of THF, and n-BuLi (2.5 M) (8.7 mL, 21.77 mmol) was then slowly added thereto while stirring at −78° C. for 1 hour. B(Oi-pr) 3 (5.7 mL, 25.12 mmol) was added to the mixture, and then stirred for one day. After completion of the reaction, $NH_4Cl$ and distilled water were added to the reaction product, and the mixture was stirred for 30 minutes. Next, the resulting product was extracted with distilled water and EA, and an organic layer was concentrated to obtain compound 12 (6.8 g, yield: 80%).

Synthesis of Compound H1-22

Compound 12 (6.8 g, 13.53 mmol), 4-bromo-9,9-dimethyl-9H-fluorene (3.7 g, 13.53 mmol), $Pd(PPh_3)_4$ (0.8 g, 0.676 mmol), and $K_2CO_3$ (3.7 g, 27.07 mmol) were added to 60 mL of toluene, 15 mL of EtOH, and 15 mL of distilled water, and the mixture was stirred under reflux for 3 hours. After completion of the reaction, the reaction product was cooled to room temperature, and extracted with distilled water and EA. An organic layer was distilled under reduced pressure, and separated by column chromatography using MC/Hex to obtain compound H1-22 (1.5 g, yield: 17%).

$^1$H NMR (DMSO-$d_6$) δ: 9.64 (s, 1H), 9.22 (d, J=8.4 Hz, 1H), 8.64 (dt, J=7.6, 0.9 Hz, 1H), 8.14-8.10 (m, 1H), 7.94 (d, J=8.9 Hz, 1H), 7.90-7.77 (m, 3H), 7.68 (s, 3H), 7.65-7.53 (m, 7H), 7.53-7.33 (m, 6H), 7.27 (td, J=7.4, 1.1 Hz, 1H), 7.17 (d, J=7.6 Hz, 1H), 6.92 (d, J=47.9 Hz, 2H), 1.49 (d, J=17.3 Hz, 6H)

|  | MW | M.P. |
|---|---|---|
| H1-22 | 650.8 | 166.3° C. |

Example 14: Preparation of Compound H1-4

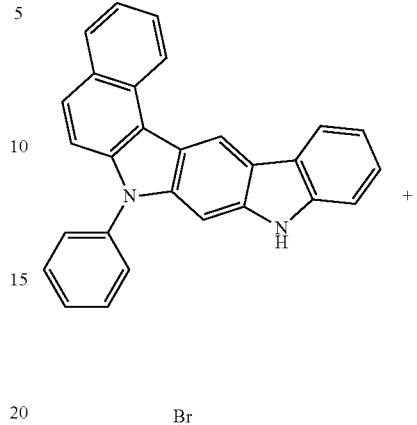

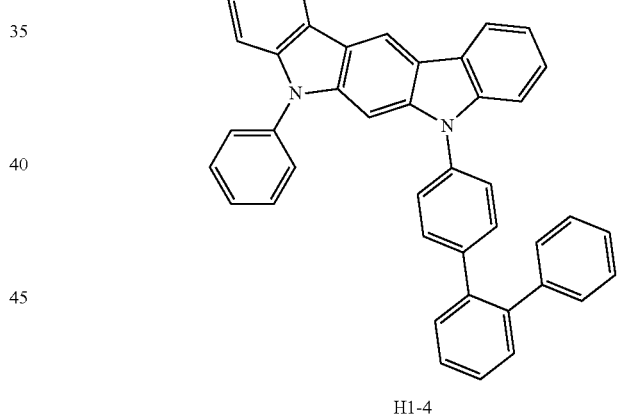

H1-4

7-phenyl-7,9-dihydrobenzo[g]indolo[2,3-b]carbazole (5 g, 13.07 mmol), 4-bromo-1,1': 2', 1"-terphenyl (4 g, 13.07 mmol), $Pd_2$ (dba)$_3$ (0.6 g, 0.653 mmol), NaOt-Bu (3.8 g, 39.21 mmol), and SPhos (0.5 g, 1.307 mmol) were added to 70 mL of o-xylene, and the mixture was stirred for one day. After completion of the reaction, the reaction product was cooled to room temperature, and extracted with distilled water and MeOH. The extracted product was separated by column chromatography using MC/Hex to obtain compound H1-4 (6.3 g, yield: 78%).

NMR (DMSO-$d_6$) δ: 9.63 (s, 1H), 9.23 (d, J=8.3 Hz, 1H), 8.63 (dd, J=7.7, 1.1 Hz, 1H), 8.12 (d, J=8.2 Hz, 1H), 7.95 (d, J=8.9 Hz, 1H), 7.85 (ddd, J=8.2, 6.8, 1.4 Hz, 1H), 7.79-7.73 (m, 2H), 7.72-7.66 (m, 3H), 7.60-7.47 (m, 8H), 7.44 (ddd, J=8.2, 7.1, 1.3 Hz, 1H), 7.38-7.33 (m, 3H), 7.32-7.24 (m, 2H), 7.22-7.14 (m, 5H)

| | MW | M.P. |
|---|---|---|
| H1-4 | 610.7 | 288° C. |

Example 15: Preparation of Compound H1-12

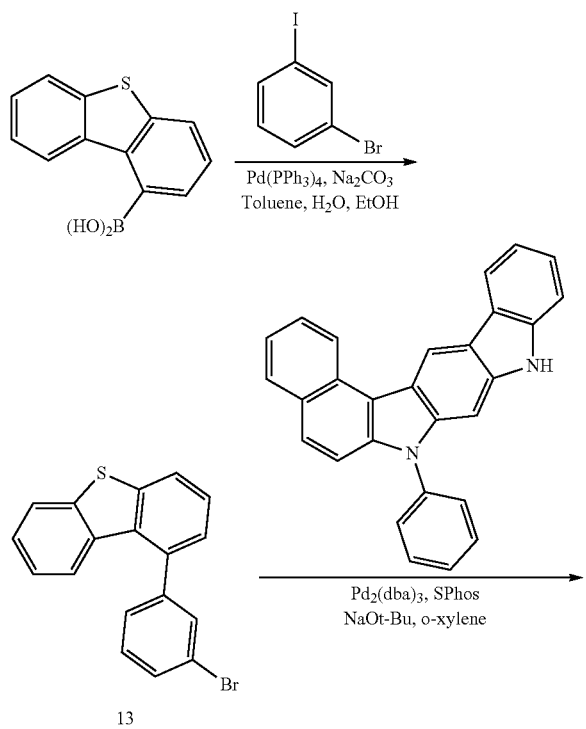

13

Synthesis of Compound 13

Dibenzo[b,d]thiophene-1-ylboronic acid (20 g, 87.71 mmol), 1-bromo-3-iodobenzene (50 g, 175.4 mmol), Pd(PPh$_3$)$_4$ (5 g, 4.385 mmol), and Na$_2$CO$_3$ (18 g, 175.4 mmol) were added to 360 mL of toluene, 90 mL of distilled water, and 90 mL of EtOH, and the mixture was stirred under reflux for 3 hours. After completion of the reaction, the reaction product was cooled to room temperature, and extracted with distilled water and EA. An organic layer was distilled under reduced pressure, and separated by column chromatography using Hex to obtain compound 13 (20 g, yield: 67%).

Synthesis of Compound H1-12

Compound 13 (4.4 g, 13.07 mmol), 7-phenyl-7,9-dihydrobenzo[g]indolo[2,3-b]carbazole (5 g, 13.07 mmol), Pd$_2$(dba)$_3$ (0.6 g, 0.653 mmol), SPhos (0.5 g, 1.307 mmol), and NaOt-Bu (3.7 g, 39.21 mmol) were added to 70 mL of o-xylene, and the mixture was stirred under reflux for 2 hours. After completion of the reaction, the reaction product was cooled to room temperature, and extracted with MeOH. The extracted product was separated by column chromatography using MC/Hex to obtain compound H1-12 (5.1 g, yield: 60%).

$^1$H NMR (DMSO-d$_6$) δ: 9.63 (s, 1H), 9.22 (d, J=8.4 Hz, 1H), 8.64 (dd, J=7.5, 1.2 Hz, 1H), 8.14-8.09 (m, 2H), 8.07 (dt, J=8.1, 0.9 Hz, 1H), 7.94 (d, J=8.9 Hz, 1H), 7.91-7.82 (m, 3H), 7.72 (d, J=2.0 Hz, 1H), 7.67 (d, J=7.6 Hz, 2H), 7.63-7.48 (m, 8H), 7.48-7.41 (m, 2H), 7.40 (d, J=6.1 Hz, 1H), 7.36 (td, J=7.4, 1.0 Hz, 1H), 7.33 (d, J=7.3 Hz, 1H), 7.09 (d, J=49.0 Hz, 2H)

| | MW | M.P. |
|---|---|---|
| H1-12 | 640.7 | 226.7° C. |

Example 16: Preparation of Compound H2-3

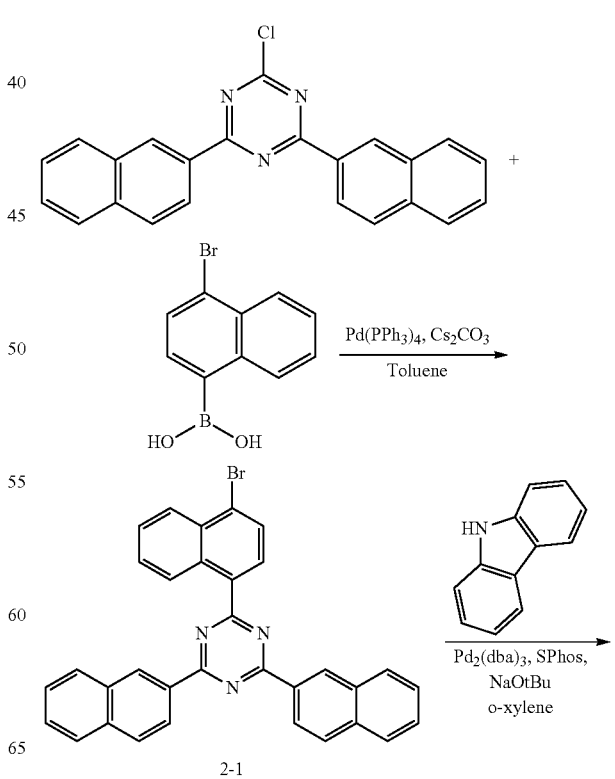

2-1

-continued

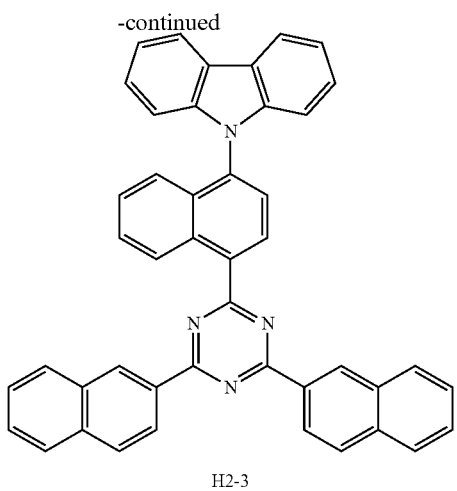

H2-3

Synthesis of Compound 2-1

2-chloro-4,6-di(naphthalene-2-yl)-1,3,5-triazine (20 g, 79.7 mmol), (4-bromonaphthalene-1-yl) boronic acid (32.2 g, 87.7 mmol), Pd(PPh$_3$)$_4$ (4.6 g, 3.985 mmol), and Cs$_2$CO$_3$ (65 g, 199.25 mmol) were added to 400 mL of toluene in a flask, and the mixture was stirred under reflux for 4 hours. After completion of the reaction, the reaction product was cooled to room temperature, an organic layer was extracted with ethyl acetate, and the residual moisture was removed with magnesium sulfate. The residue was dried, and separated by column chromatography to obtain compound 2-1 (30 g, yield: 74%).

Synthesis of Compound H2-3

Compound 2-1 (10 g, 19.7 mmol), 9H-carbazole (3.0 g, 17.9 mmol), Pd$_2$ (dba)$_3$ (0.8 g, 0.9 mmol), SPhos (0.73 g, 1.79 mmol), and NaOt-Bu (4.3 g, 44.75 mmol) were dissolved in 90 mL of o-xylene in a flask, and the mixture was stirred under reflux for 4 hours. After completion of the reaction, the reaction product was extracted with ethyl acetate, and separated by column chromatography to obtain compound H2-3 (1.5 g, yield: 13%).

|      | MW     | M.P.    |
|------|--------|---------|
| H2-3 | 624.75 | 265° C. |

Example 17: Preparation of Compound H2-10

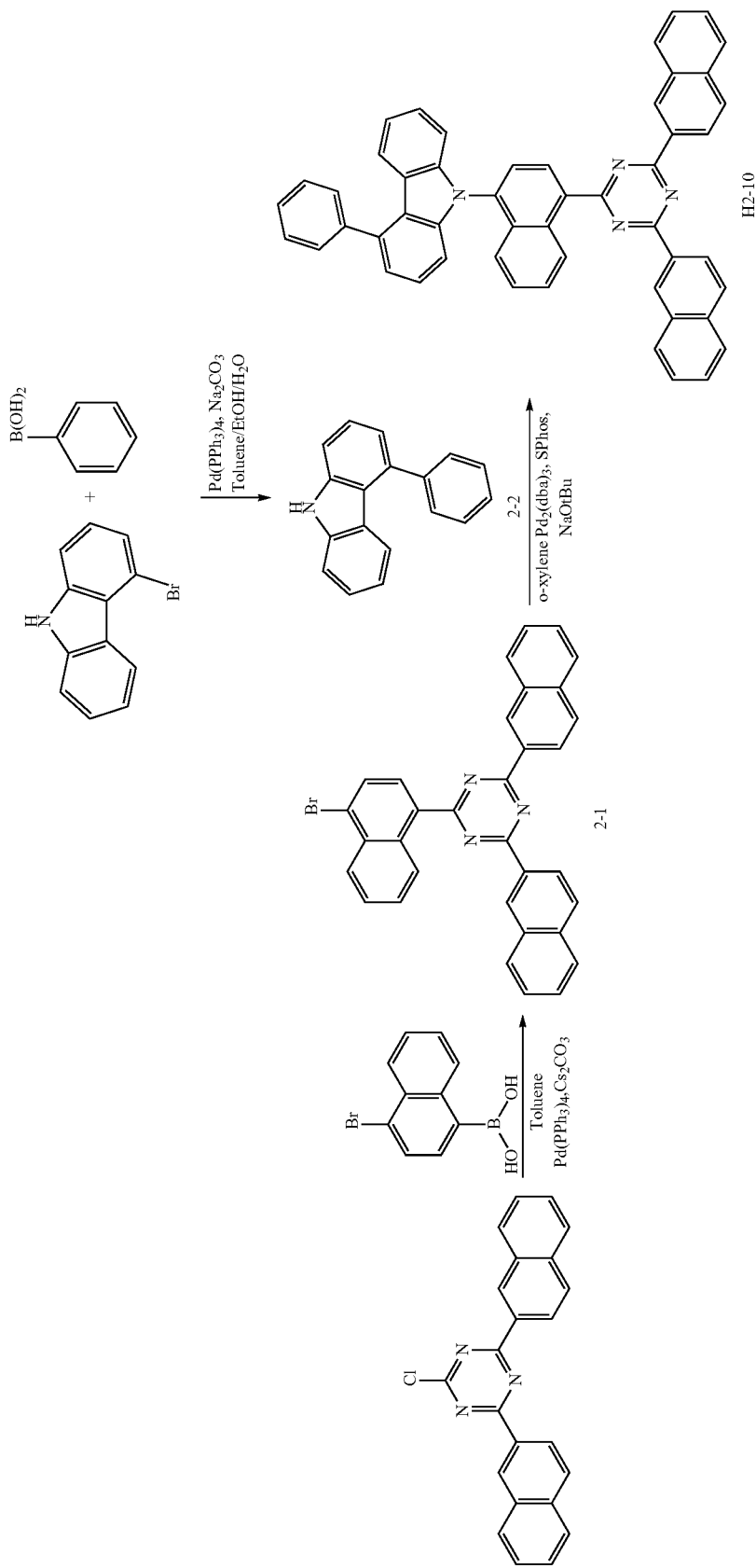

Synthesis of Compound 2-2

4-bromo-9H-carbazole (10 g, 40.6 mmol), phenylboronic acid (6.2 g, 48.7 mmol), Pd(PPh$_3$)$_4$ (2.3 g, 2.03 mmol), and Na$_2$CO$_3$ (13 g, 121.8 mmol) were added to 200 mL of toluene, 100 mL of ethanol, and 100 ml of water in a flask, and the mixture was stirred under reflux for 3 hours. After completion of the reaction, the reaction product was cooled to room temperature, an organic layer was extracted with ethyl acetate, and the residual moisture was removed with magnesium sulfate. The residue was dried, and separated by column chromatography to obtain compound 2-2 (9 g, yield: 91%).

Synthesis of Compound H2-10

Compound 2-1 (8.5 g, 13.5 mmol), compound 2-2 (3.0 g, 12.3 mmol), Pd$_2$(dba)$_3$ (0.56 g, 0.615 mmol), SPhos (0.51 g, 1.23 mmol), and NaOt-Bu (2.9 g, 30.75 mmol) were dissolved in 60 mL of o-xylene in a flask, and the mixture was stirred under reflux for 4 hours. After completion of the reaction, the reaction product was extracted with ethyl acetate, and separated by column chromatography to obtain compound H2-10 (2.8 g, yield: 32.5%).

|  | MW | M.P. |
| --- | --- | --- |
| H2-10 | 700.85 | 260.3° C. |

Example 18: Preparation of Compound H2-8

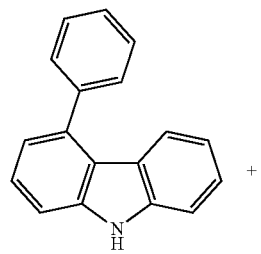

+

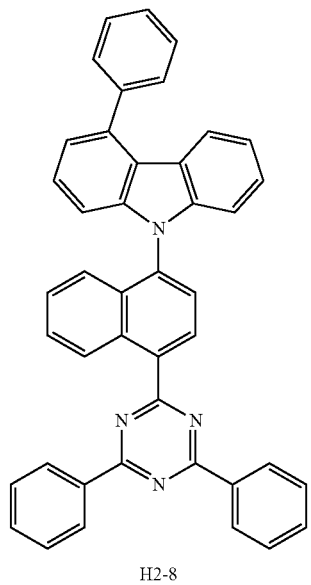

H2-8

4-phenyl-9H-carbazole (3.0 g, 12.3 mmol), 2-(4-bromonaphthalene-1-yl)-4,6-diphenyl-1,3,5-triazine (5.4 g, 12.3 mmol), Pd$_2$(dba)$_3$ (0.56 g, 0.62 mmol), SPhos (0.51 g, 1.23 mmol), and NaOt-Bu (2.4 g, 24.7 mmol) were added to 62 mL of o-xylene in a flask, and the mixture was stirred under reflux for 6 hours. After completion of the reaction, the reaction product was cooled to room temperature, and then MeOH was added thereto while stirring at room temperature. The resulting solid was filtered under reduced pressure, and the filtrate was separated by column chromatography to obtain compound H2-8 (3.3 g, yield: 45%).

|  | MW | M.P. |
| --- | --- | --- |
| H2-8 | 600.71 | 254° C. |

Example 19: Preparation of Compound H2-2

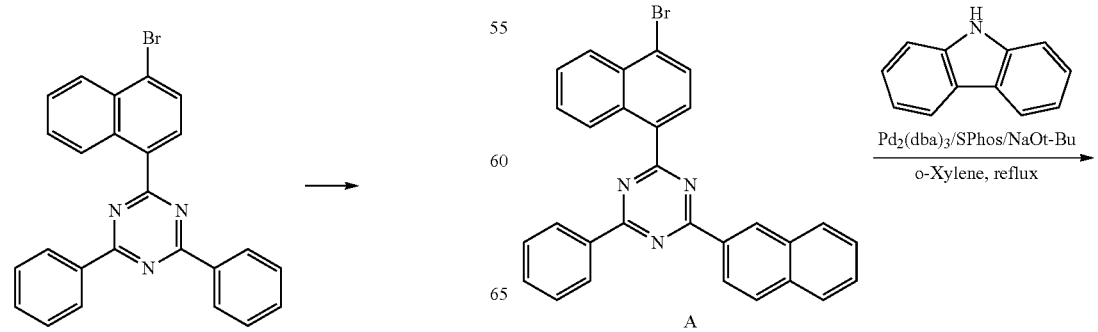

A

-continued

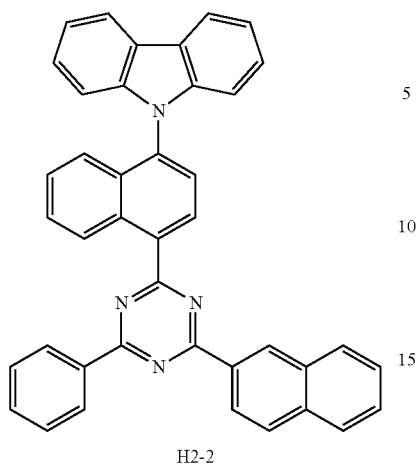

H2-2

Compound A (8.0 g, 16.4 mmol), 9H-carbazole (3.0 g, 18.0 mmol), Pd$_2$(dba)$_3$ (0.9 g, 0.8 mmol), SPhos (0.7 g, 1.64 mmol), and NaOt-Bu (2.4 g, 24.6 mmol) were added to 82 mL of o-xylene in a flask, and the mixture was stirred under reflux for 4 hours. After completion of the reaction, the reaction product was extracted with ethyl acetate, and separated by column chromatography to obtain compound H2-2 (6.0 g, yield: 69%).

|      | MW     | M.P.    |
|------|--------|---------|
| H2-2 | 524.63 | 245° C. |

Example 20: Preparation of Compound H2-11

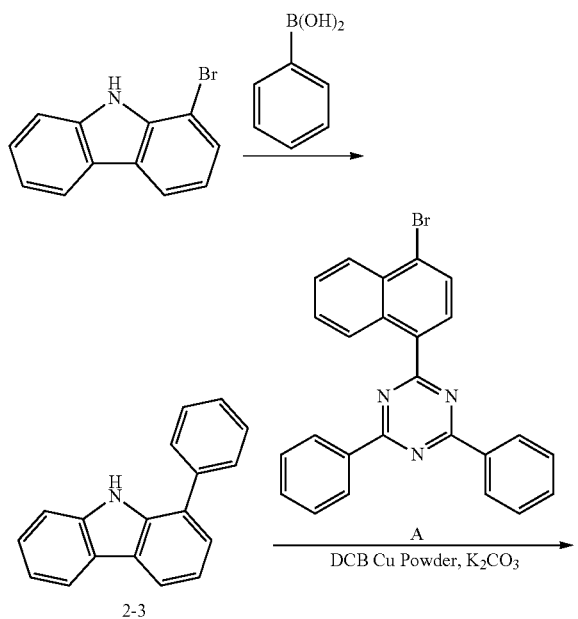

-continued

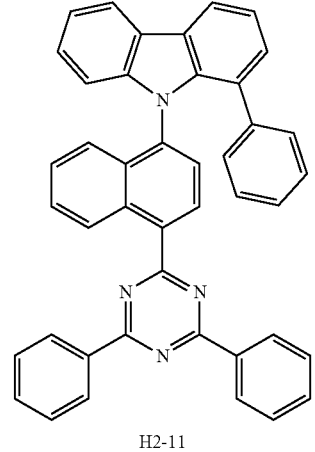

H2-11

Synthesis of Compound 2-3

1-bromo-9H-carbazole (10 g, 40.6 mmol), phenylboronic acid (6.2 g, 48.7 mmol), Pd(PPh$_3$)$_4$ (2.3 g, 2.03 mmol), and Na$_2$CO$_3$ (13 g, 121.8 mmol) were added to 200 ml of toluene, 100 mL of ethanol, and 100 ml of water in a flask, and the mixture was stirred under reflux for 3 hours. After completion of the reaction, the reaction product was cooled to room temperature, an organic layer was extracted with ethyl acetate, and the residual moisture was removed with magnesium sulfate. The residue was dried, and separated by column chromatography to obtain compound 2-3 (9 g, yield: 96%).

Synthesis of Compound H2-11

Compound 2-3 (3.0 g, 12.3 mmol), compound A (8 g, 18.5 mmol), Cu powder (0.39 g, 6.15 mmol), and K$_2$CO$_3$ (3.4 g, 24.6 mmol) were added to 60 mL of dichlorobenzene (DCB) in a flask, and the mixture was stirred under reflux for 24 hours. After completion of the reaction, the reaction product was cooled to room temperature, and MeOH was added thereto while stirring at room temperature. The resulting solid was filtered under reduced pressure, and the filtrate was separated by column chromatography to obtain compound H2-11 (1.1 g, yield: 14.8%).

|       | MW     | M.P.      |
|-------|--------|-----------|
| H2-11 | 600.23 | 226.9° C. |

Hereinafter, the luminous efficiency and lifetime properties of an OLED according to the present disclosure will be explained in detail. However, the following examples merely illustrate the properties of an OLED according to the present disclosure in detail, but the present disclosure is not limited to the following examples.

Device Examples 1-1 to 1-3: Producing an OLED Co-Deposited with a First Host Compound and a Second Host Compound According to the Present Disclosure An OLED according to the present disclosure was produced as follows: A transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and then was stored in isopropanol. The ITO substrate was mounted on a substrate holder of a vacuum vapor deposition apparatus. Compound HI-1 shown in Table 3 below as a first hole injection compound was introduced into a cell of the vacuum vapor deposition apparatus, and compound HT-1 shown in Table 3 below as a first hole transport compound was introduced into another cell of the vacuum vapor deposition apparatus. The two materials were evaporated at different rates to be deposited in a doping amount of the first hole injection compound of 3 wt % based on the total amount of the first hole injection compound and the first hole transport compound to form a first hole injection layer having a thickness of 10 nm on the ITO substrate. Next, compound HT-1 was deposited as a first hole transport layer having a thickness of 80 nm on the first hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: The first host compound and the second host compound shown in Table 1 below were introduced into two cells of the vacuum vapor depositing apparatus, respectively, as hosts, and compound D-39 was introduced into another cell as a dopant. The two host materials were evaporated at a rate of 1:1, and at the same time the dopant material was evaporated at different rates to be deposited in a doping amount of 3 wt % based on the total amount of the hosts and dopant to form a light-emitting layer having a thickness of 40 nm on the second hole transport layer. Next, compound ET-1 and compound EI-1 as electron transport materials were deposited at a weight ratio of 50:50 on the light-emitting layer to form an electron transport layer having a thickness of 35 nm. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced. All the materials used for producing the OLED were purified by vacuum sublimation at 10-6 torr.

Comparative Examples 1-1 to 1-3: Producing an OLED Comprising a Comparative Compound as a Host An OLED was produced in the same manner as in Device Example 1-1, except that the second host compound shown in Table 1 below was solely used as a host of the light-emitting layer.

Comparative Example 1-4: Producing an OLED Comprising a Comparative Compound as a Host An OLED was produced in the same manner as in Device Example 1-1, except that the first host compound and the second host compound shown in Table 1 below were respectively used as hosts of the light-emitting layer.

The driving voltage, luminous efficiency, and light-emitting color at a luminance of 1,000 nit, and the time taken to reduce from the initial luminance of 100% to a luminance of 95% in a luminance of 5,500 nit (T95) of the OLEDs produced in Device Examples 1-1 to 1-3 and Comparative Examples 1-1 to 1-4, are shown in Table 1 below.

TABLE 1

| | First Host | Second Host | Driving Voltage [V] | Luminous Efficiency [cd/A] | Light-Emitting Color | Lifetime (T95) [hr] |
|---|---|---|---|---|---|---|
| Device Example 1-1 | H1-11 | H2-3 | 2.9 | 32.0 | Red | 640 |
| Device Example 1-2 | H1-11 | H2-10 | 3.1 | 32.5 | Red | 524 |
| Device Example 1-3 | H1-11 | H2-2 | 3.0 | 33.8 | Red | 394 |
| Comparative Example 1-1 | — | H2-3 | 3.5 | 24.7 | Red | 57.5 |
| Comparative Example 1-2 | — | H2-10 | 4.0 | 25.6 | Red | 45.9 |
| Comparative Example 1-3 | — | H2-2 | 3.3 | 28.4 | Red | 52.6 |
| Comparative Example 1-4 | H1-11 | A-1 | 3.0 | 32.3 | Red | 321 |

From Table 1 above, it can be confirmed that the organic electroluminescent devices comprising a specific combination of compounds of the present disclosure as host materials have significantly reduced driving voltage and remarkably improved luminous efficiency and lifetime properties as compared with conventional organic electroluminescent devices.

Device Examples 2-1 to 2-3: Producing an OLED According to the Present Disclosure An OLED was produced in the same manner as in Device Example 1-1, except that a light-emitting layer was formed as follows: The compound shown in Table 2 below as a host was introduced into a cell of the vacuum vapor deposition apparatus, and compound D-39 was introduced into another cell of the vacuum vapor deposition apparatus as a dopant. The two materials were evaporated at different rates to be deposited in a doping amount of the dopant of 3 wt % based on the total amount of the host and the dopant to form a light-emitting layer having a thickness of 40 nm on the second hole transport layer.

Comparative Example 2-1: Producing an OLED Comprising a Comparative Compound

An OLED was produced in the same manner as in Device Example 2-1, except that compound A-1 shown in Table 3 below was used as a host of the light-emitting layer.

The time taken to reduce from the initial luminance of 100% to a luminance of 95% in a luminance of 5,500 nit (T95) of the OLEDs produced in Device Examples 2-1 to 2-3 and Comparative Example 2-1, are shown in Table 2 below.

TABLE 2

| | Host | Lifetime (T95) [hr] |
|---|---|---|
| Device Example 2-1 | H2-3 | 57.5 |
| Device Example 2-2 | H2-10 | 45.9 |
| Device Example 2-3 | H2-2 | 52.6 |
| Comparative Example 2-1 | A-1 | 27.3 |

From Table 2 above, it can be confirmed that the organic electroluminescent devices comprising the compounds according to the present disclosure as host materials have longer lifetime properties as compared with conventional organic electroluminescent devices.

The compounds used in the Device Examples and the Comparative Examples are shown in Table 3 below.

TABLE 3

Hole Injection Layer/Hole Transport Layer

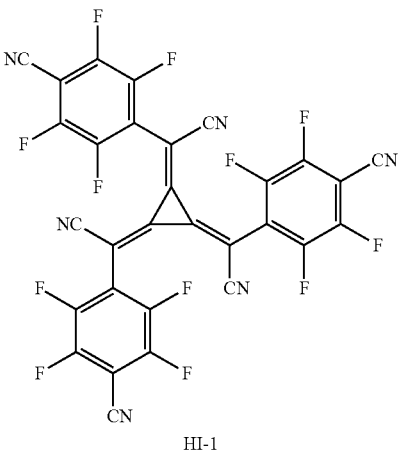 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F ; [I-]]

HI-1

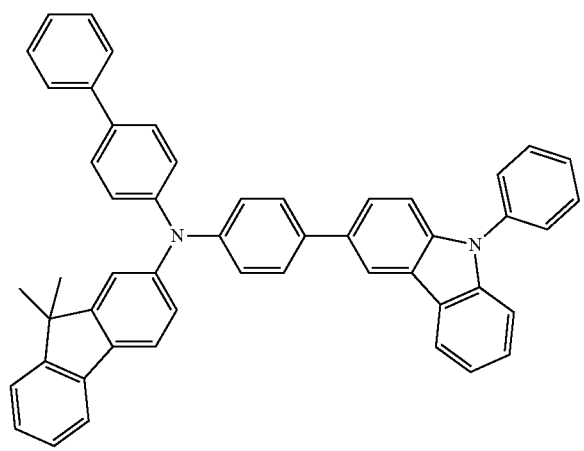

HT-1

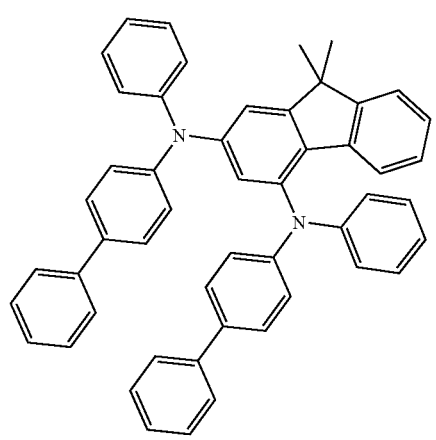

HT-2

TABLE 3-continued
Light-Emitting Layer
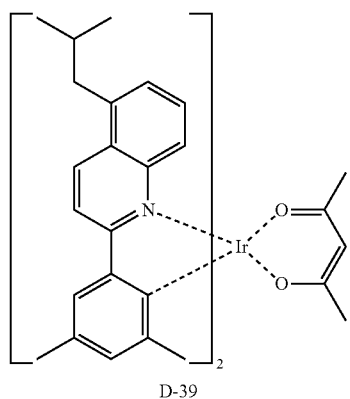
D-39
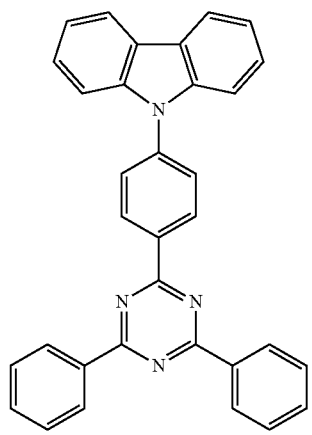
A-1
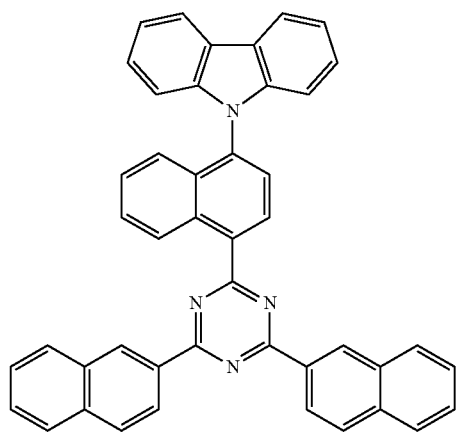
H2-3

TABLE 3-continued
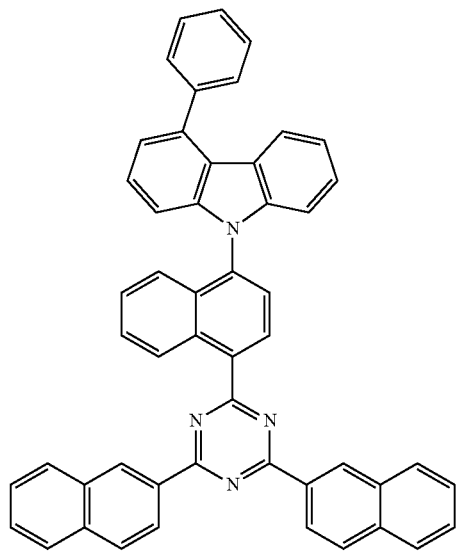
H2-10
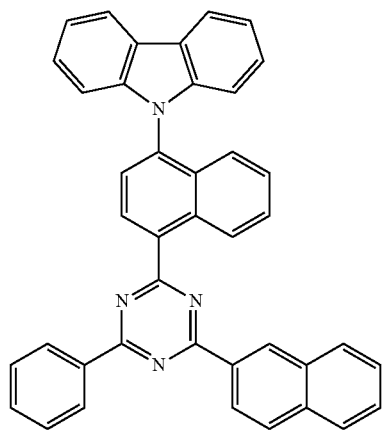
H2-2
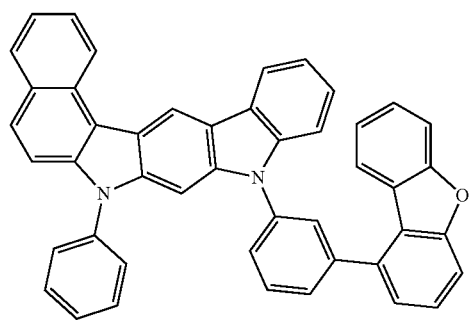
H1-11

TABLE 3-continued

Electron transport Layer/Electron Injection Layer

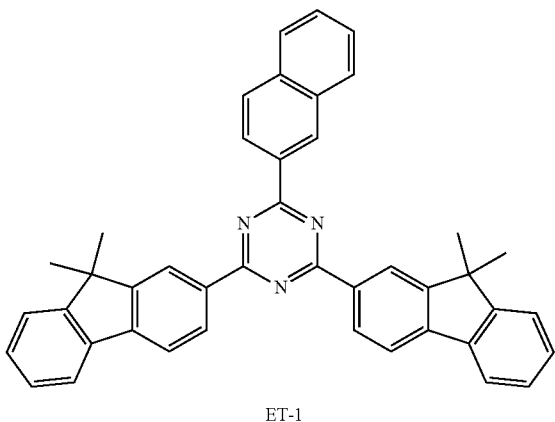 [SMILES: CC1(C)c2ccccc2-c2ccc(-c3nc(-c4ccc5c(c4)C(C)(C)c4ccccc4-5)nc(-c4ccc5ccccc5c4)n3)cc21]

ET-1

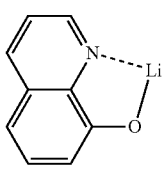

EI-1

The invention claimed is:

1. An organic electroluminescent compound represented by the following formula 3:

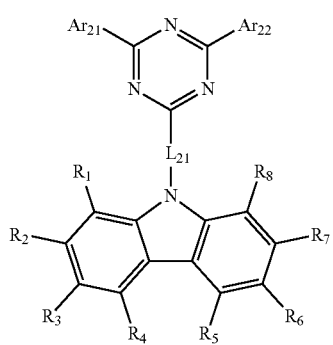

(3)

wherein,

Ar$_{21}$ and Ar$_{22}$, each independently, represent a phenyl unsubstituted or substituted with deuterium(s), a biphenyl unsubstituted or substituted with deuterium(s), a terphenyl unsubstituted or substituted with deuterium(s), or a naphthyl unsubstituted or substituted with deuterium(s);

L$_{21}$ represents a naphthylene unsubstituted or substituted with deuterium(s)

R$_1$, R$_4$, R$_5$, and R$_8$, each independently, represent hydrogen, deuterium, a phenyl unsubstituted or substituted with deuterium(s), a biphenyl unsubstituted or substituted with deuterium(s), a terphenyl unsubstituted or substituted with deuterium(s), or a naphthyl unsubstituted or substituted with deuterium(s); and R$_2$, R$_3$, R$_6$, and R$_7$, each independently, represent hydrogen or deuterium;

with the proviso that if both Ar$_{21}$ and Ar$_{22}$ represent phenyl, at least one of R$_1$, R$_4$, R$_5$, and R$_8$ is not hydrogen or deuterium.

2. The organic electroluminescent compound according to claim 1, wherein the compound represented by formula 3 is at least one selected from the following compounds:

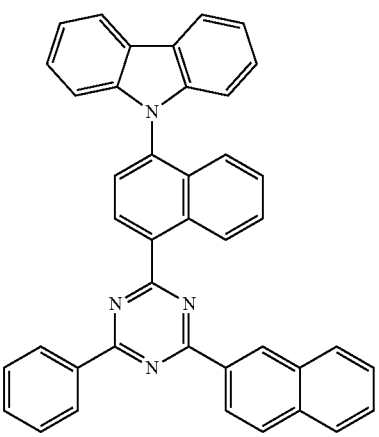

H2-2

H2-3
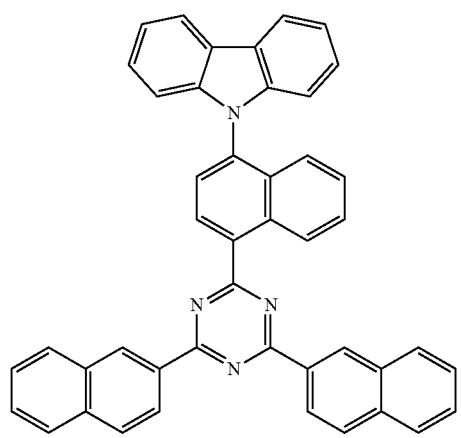
H2-4
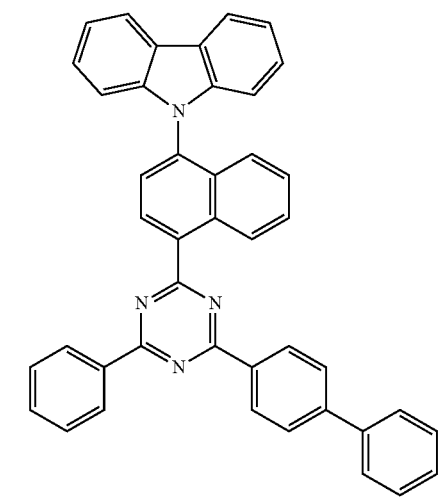
H2-5
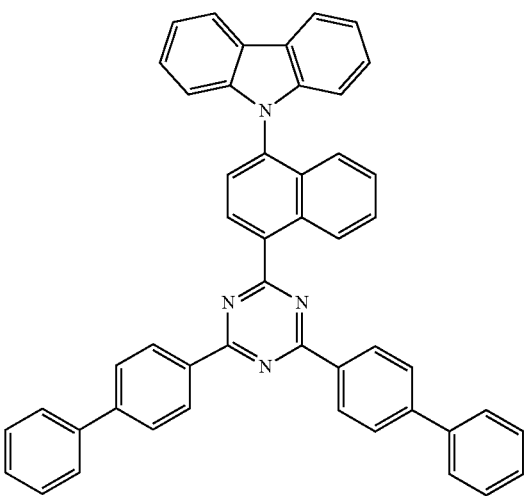
H2-6
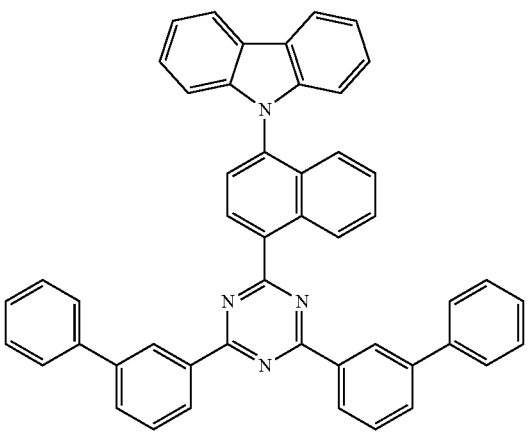
H2-7
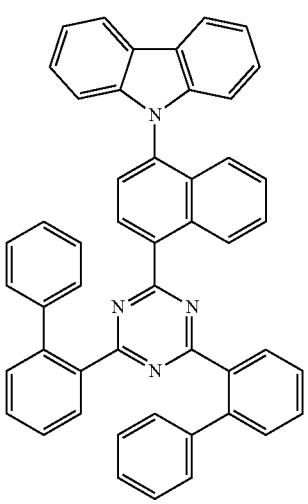
H2-8
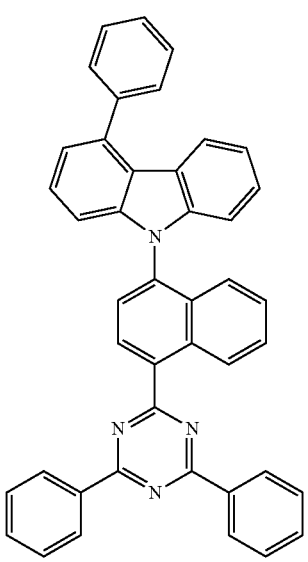

H2-9
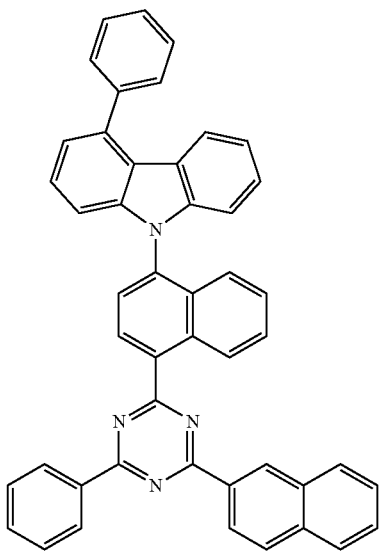
H2-10
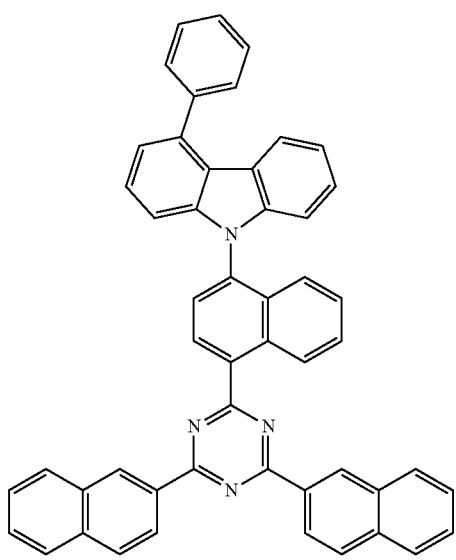
H2-11
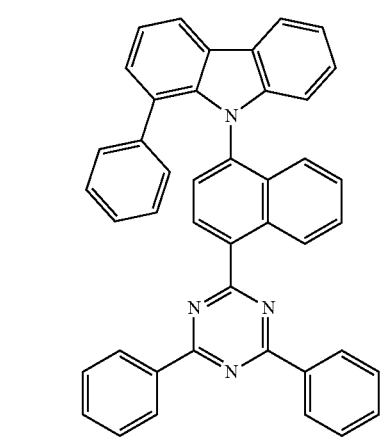
H2-12
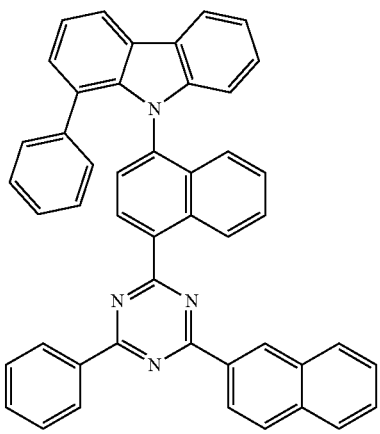
H2-13
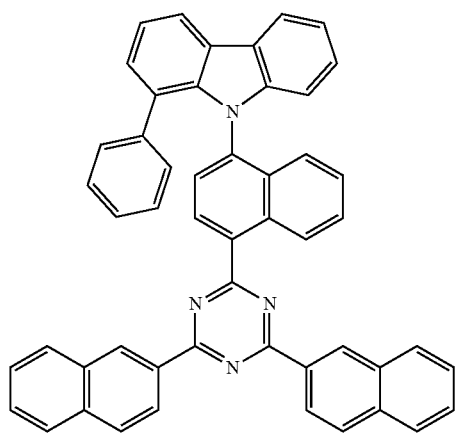
H2-26
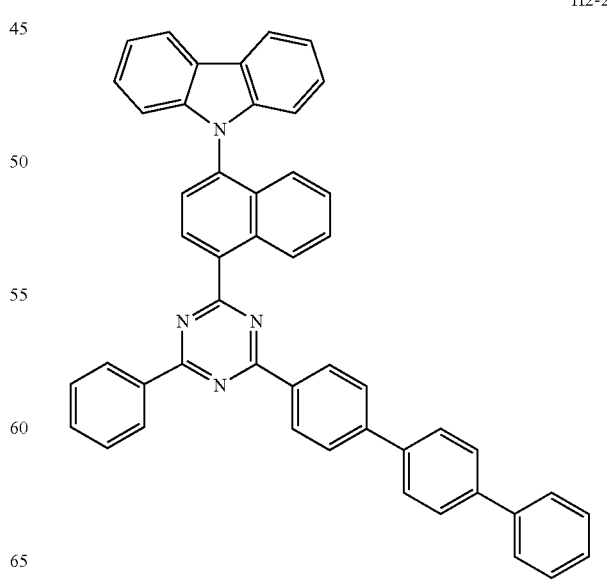

H2-27
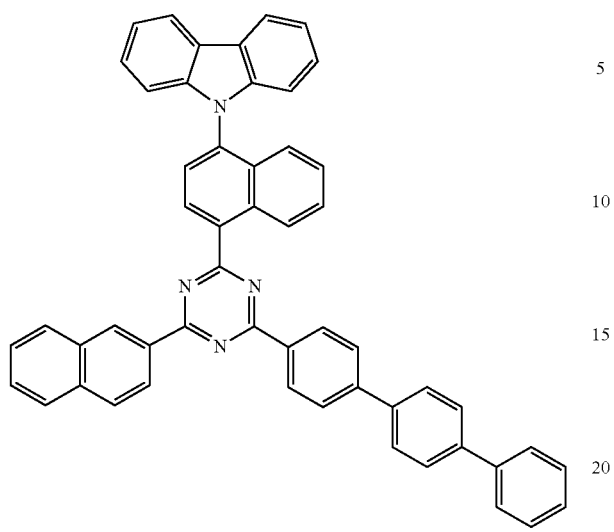
H2-32
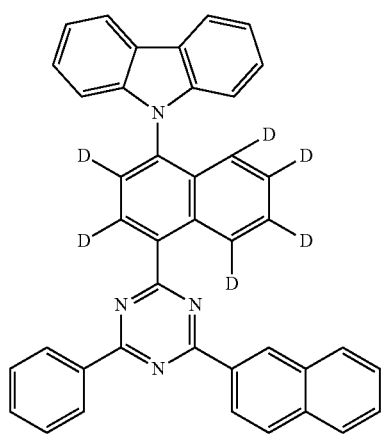
H2-33
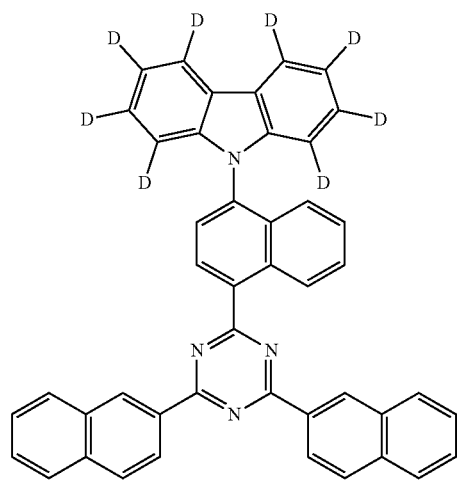
H2-34
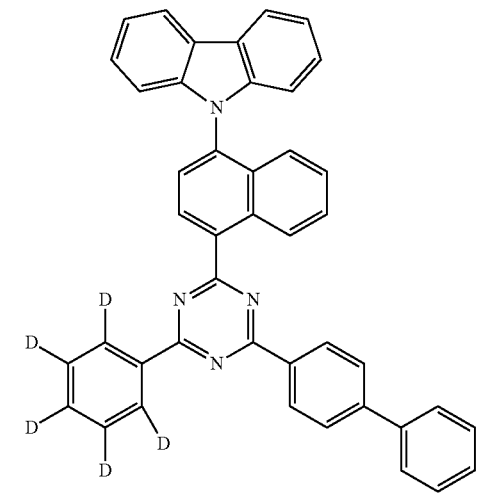
H2-35
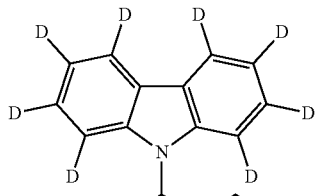
H2-43
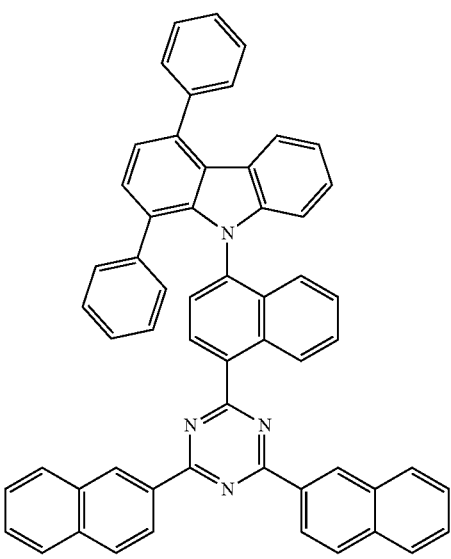

H2-46
H2-47
H2-51
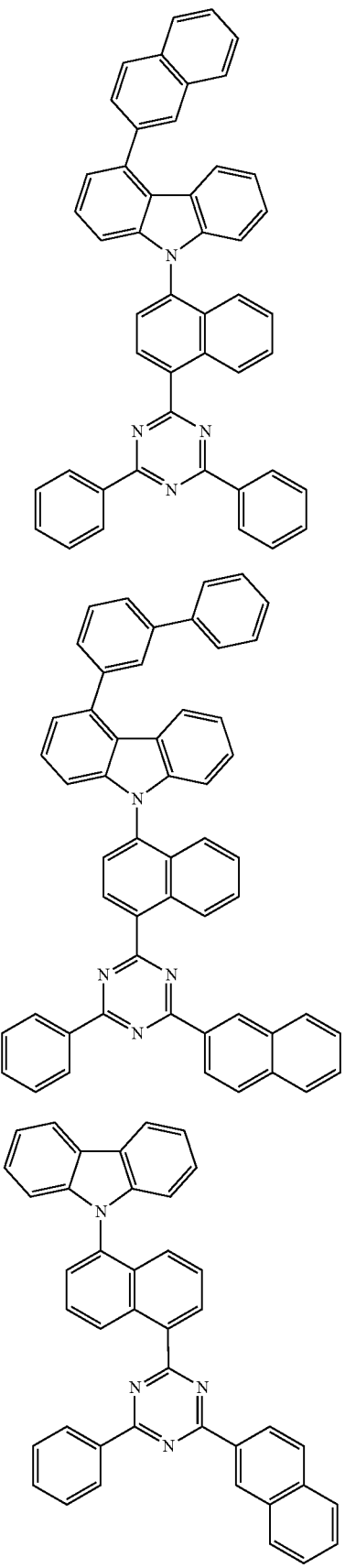
H2-52
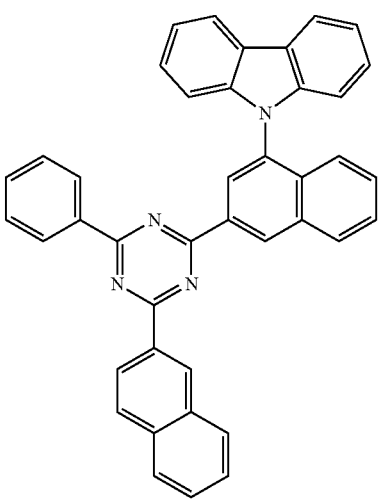
H2-53
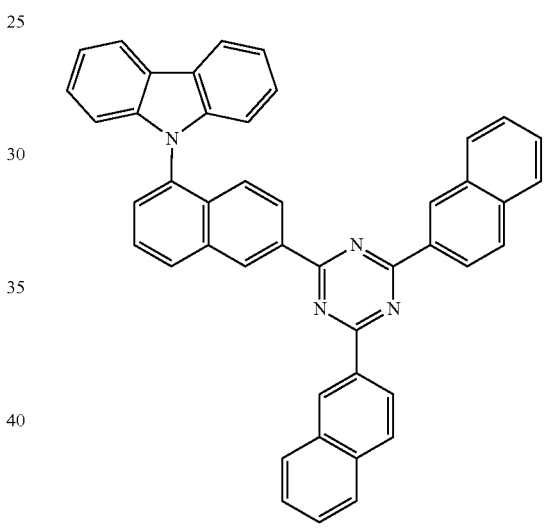
H2-54
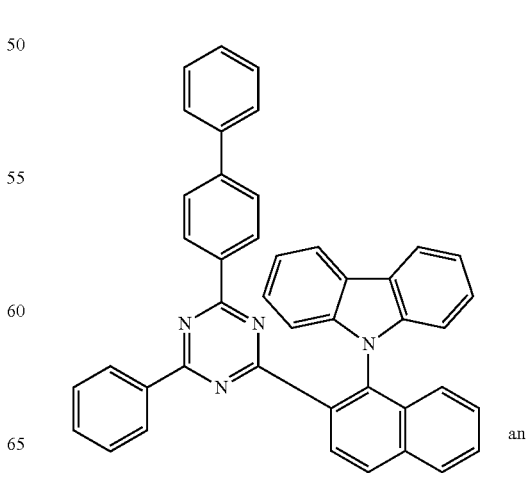
and H2-55
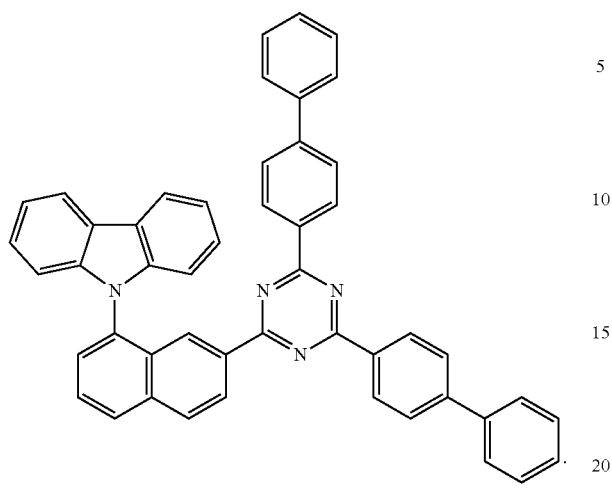
3. An organic electroluminescent device comprising the organic electroluminescent compound according to claim 1.
* * * * *